United States Patent
Foletto et al.

(10) Patent No.: US 9,719,806 B2
(45) Date of Patent: *Aug. 1, 2017

(54) MAGNETIC FIELD SENSOR FOR SENSING A MOVEMENT OF A FERROMAGNETIC TARGET OBJECT

(71) Applicant: Allegro MicroSystems, LLC, Worcester, MA (US)

(72) Inventors: Andrea Foletto, Annecy (FR); Jeffrey Eagen, Manchester, NH (US); Paul A. David, Bow, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 253 days.

This patent is subject to a terminal disclaimer.

(21) Appl. No.: 14/529,577

(22) Filed: Oct. 31, 2014

(65) Prior Publication Data

US 2016/0123774 A1   May 5, 2016

(51) Int. Cl.
*G01R 33/09* (2006.01)
*G01D 5/20* (2006.01)
*G01D 5/14* (2006.01)

(52) U.S. Cl.
CPC .......... *G01D 5/2046* (2013.01); *G01D 5/145* (2013.01); *G01R 33/09* (2013.01)

(58) Field of Classification Search
CPC ...... G01D 5/145; G01D 5/147; G01R 33/093; G01R 33/09; G01R 33/098; G01R 33/096; G01R 15/205; G01R 33/0011; B82Y 25/00

USPC ......... 324/207.21, 252, 207.25, 202, 207.13, 324/207.11

See application file for complete search history.

(56) References Cited

U.S. PATENT DOCUMENTS

| | | | |
|---|---|---|---|
| 3,195,043 A | 7/1965 | Burig et al. |
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,786 A | 4/1973 | Lucas et al. |

(Continued)

FOREIGN PATENT DOCUMENTS

| | | |
|---|---|---|
| CH | 683 469 A5 | 3/1994 |
| DE | 25 18 054 | 11/1976 |

(Continued)

OTHER PUBLICATIONS

PCT International Search Report and Written Opinion of the ISA dated Jan. 15, 2016; For PCT Pat. App. No. PCT/US2015/055236; 12 pages.

(Continued)

*Primary Examiner* — Alesa Allgood
(74) *Attorney, Agent, or Firm* — Daly, Crowley, Mofford & Durkee, LLP

(57) ABSTRACT

A magnetic field sensor operates as a motion detector for sensing a movement of a ferromagnetic target object having features. The magnetic field sensor has a plurality of magnetoresistance elements to generate, in a first channel, a feature signal indicative of a proximity of a feature of a ferromagnetic target object and, in a second channel, an edge signal indicative of a proximity of an edge of a feature of a ferromagnetic target object.

25 Claims, 26 Drawing Sheets

(56) References Cited

U.S. PATENT DOCUMENTS

| | | | |
|---|---|---|---|
| 4,048,670 A | 9/1977 | Eysermans | |
| 4,188,605 A | 2/1980 | Stout | |
| 4,204,317 A | 5/1980 | Winn | |
| 4,236,832 A | 12/1980 | Komatsu et al. | |
| 4,283,643 A | 8/1981 | Levin | |
| 4,315,523 A | 2/1982 | Mahawili et al. | |
| 4,438,347 A | 3/1984 | Gehring | |
| 4,490,674 A * | 12/1984 | Ito | G01D 5/247 |
| | | | 324/207.21 |
| 4,573,258 A | 3/1986 | Io et al. | |
| 4,614,111 A | 9/1986 | Wolff | |
| 4,649,796 A | 3/1987 | Schmidt | |
| 4,670,715 A | 6/1987 | Fuzzell | |
| 4,719,419 A | 1/1988 | Dawley | |
| 4,733,455 A | 3/1988 | Nakamura et al. | |
| 4,745,363 A | 5/1988 | Carr et al. | |
| 4,746,859 A | 5/1988 | Malik | |
| 4,752,733 A | 6/1988 | Petr et al. | |
| 4,758,943 A | 7/1988 | Aström et al. | |
| 4,760,285 A | 7/1988 | Nelson | |
| 4,764,767 A | 8/1988 | Ichikawa et al. | |
| 4,769,344 A | 9/1988 | Sakai et al. | |
| 4,772,929 A | 9/1988 | Manchester | |
| 4,789,826 A | 12/1988 | Willett | |
| 4,796,354 A | 1/1989 | Yokoyama et al. | |
| 4,823,075 A | 4/1989 | Alley | |
| 4,833,406 A | 5/1989 | Foster | |
| 4,893,027 A | 1/1990 | Kammerer et al. | |
| 4,908,685 A | 3/1990 | Shibasaki et al. | |
| 4,910,861 A | 3/1990 | Dohogne | |
| 4,935,698 A | 6/1990 | Kawaji et al. | |
| 4,954,777 A | 9/1990 | Klopfer et al. | |
| 4,970,411 A | 11/1990 | Halg et al. | |
| 4,983,916 A | 1/1991 | Iijima et al. | |
| 5,012,322 A | 4/1991 | Guillotte | |
| 5,021,493 A | 6/1991 | Sandstrom | |
| 5,028,868 A | 7/1991 | Murata et al. | |
| 5,038,130 A | 8/1991 | Eck et al. | |
| 5,045,920 A | 9/1991 | Vig et al. | |
| 5,078,944 A | 1/1992 | Yoshino | |
| 5,084,289 A | 1/1992 | Shin et al. | |
| 5,121,289 A | 6/1992 | Gagliardi | |
| 5,137,677 A | 8/1992 | Murata | |
| 5,139,973 A | 8/1992 | Nagy et al. | |
| 5,167,896 A | 12/1992 | Hirota et al. | |
| 5,168,244 A | 12/1992 | Muranaka | |
| 5,185,919 A | 2/1993 | Hickey | |
| 5,196,794 A | 3/1993 | Murata | |
| 5,200,698 A | 4/1993 | Thibaud | |
| 5,210,493 A | 5/1993 | Schroeder et al. | |
| 5,216,405 A | 6/1993 | Schroeder et al. | |
| 5,244,834 A | 9/1993 | Suzuki et al. | |
| 5,247,202 A | 9/1993 | Popovic et al. | |
| 5,247,278 A | 9/1993 | Pant et al. | |
| 5,250,925 A | 10/1993 | Shinkle | |
| 5,286,426 A | 2/1994 | Rano, Jr. et al. | |
| 5,289,344 A | 2/1994 | Gagnon et al. | |
| 5,304,926 A | 4/1994 | Wu | |
| 5,315,245 A | 5/1994 | Schroeder et al. | |
| 5,329,416 A | 7/1994 | Ushiyama et al. | |
| 5,331,478 A | 7/1994 | Aranovsky | |
| 5,332,956 A | 7/1994 | Oh | |
| 5,332,965 A | 7/1994 | Wolf et al. | |
| 5,341,097 A | 8/1994 | Wu | |
| 5,399,968 A | 3/1995 | Sheppard et al. | |
| 5,412,255 A | 5/1995 | Wallrafen | |
| 5,414,355 A | 5/1995 | Davidson et al. | |
| 5,424,558 A | 6/1995 | Borden et al. | |
| 5,434,105 A | 7/1995 | Liou | |
| 5,453,727 A | 9/1995 | Shibasaki et al. | |
| 5,469,058 A | 11/1995 | Dunnam | |
| 5,477,143 A | 12/1995 | Wu | |
| 5,479,695 A | 1/1996 | Grader et al. | |
| 5,486,759 A | 1/1996 | Seiler et al. | |
| 5,488,294 A | 1/1996 | Liddell et al. | |
| 5,491,633 A | 2/1996 | Henry et al. | |
| 5,497,081 A | 3/1996 | Wolf et al. | |
| 5,500,589 A | 3/1996 | Sumcad | |
| 5,500,994 A | 3/1996 | Itaya | |
| 5,508,611 A | 4/1996 | Schroeder et al. | |
| 5,521,501 A | 5/1996 | Dettmann et al. | |
| 5,545,983 A | 8/1996 | Okeya et al. | |
| 5,551,146 A | 9/1996 | Kawabata et al. | |
| 5,552,706 A | 9/1996 | Carr | |
| 5,581,170 A | 12/1996 | Mammano et al. | |
| 5,581,179 A | 12/1996 | Engel et al. | |
| 5,596,272 A | 1/1997 | Busch | |
| 5,621,319 A | 4/1997 | Bilotti et al. | |
| 5,627,315 A | 5/1997 | Figi et al. | |
| 5,631,557 A | 5/1997 | Davidson | |
| 5,640,090 A | 6/1997 | Furuya et al. | |
| 5,691,637 A | 11/1997 | Oswald et al. | |
| 5,696,790 A | 12/1997 | Graham et al. | |
| 5,712,562 A | 1/1998 | Berg | |
| 5,714,102 A | 2/1998 | Highum et al. | |
| 5,719,496 A | 2/1998 | Wolf | |
| 5,729,128 A | 3/1998 | Bunyer et al. | |
| 5,757,181 A | 5/1998 | Wolf et al. | |
| 5,781,005 A | 7/1998 | Vig et al. | |
| 5,789,658 A | 8/1998 | Henn et al. | |
| 5,789,915 A | 8/1998 | Ingraham | |
| 5,796,249 A | 8/1998 | Andräet et al. | |
| 5,818,222 A | 10/1998 | Ramsden | |
| 5,818,223 A | 10/1998 | Wolf | |
| 5,839,185 A | 11/1998 | Smith et al. | |
| 5,841,276 A | 11/1998 | Makino et al. | |
| 5,859,387 A | 1/1999 | Gagnon | |
| 5,883,567 A | 3/1999 | Mullins, Jr. | |
| 5,886,070 A | 3/1999 | Honkura et al. | |
| 5,912,556 A | 6/1999 | Frazee et al. | |
| 5,963,028 A | 10/1999 | Engel et al. | |
| 6,011,770 A | 1/2000 | Tan | |
| 6,016,055 A | 1/2000 | Jager et al. | |
| 6,043,646 A | 3/2000 | Jansseune | |
| 6,100,754 A | 8/2000 | Kim et al. | |
| 6,136,250 A | 10/2000 | Brown | |
| 6,169,396 B1 | 1/2001 | Yokotani et al. | |
| 6,175,233 B1 | 1/2001 | McCurley et al. | |
| 6,180,041 B1 | 1/2001 | Takizawa | |
| 6,181,036 B1 | 1/2001 | Kazama et al. | |
| 6,184,679 B1 | 2/2001 | Popovic et al. | |
| 6,194,893 B1 | 2/2001 | Yokotani et al. | |
| 6,198,373 B1 | 3/2001 | Ogawa et al. | |
| 6,242,604 B1 | 6/2001 | Hudlicky et al. | |
| 6,242,904 B1 | 6/2001 | Shirai et al. | |
| 6,242,905 B1 | 6/2001 | Draxelmayr | |
| 6,265,865 B1 | 7/2001 | Engel et al. | |
| 6,278,269 B1 | 8/2001 | Vig et al. | |
| 6,291,989 B1 | 9/2001 | Schroeder | |
| 6,297,627 B1 | 10/2001 | Towne et al. | |
| 6,297,628 B1 | 10/2001 | Bicking et al. | |
| 6,339,322 B1 | 1/2002 | Loreck et al. | |
| 6,351,506 B1 | 2/2002 | Lewicki | |
| 6,356,068 B1 | 3/2002 | Steiner et al. | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,452,381 B1 | 9/2002 | Nakatani et al. | |
| 6,462,536 B1 | 10/2002 | Mednikov et al. | |
| 6,492,804 B2 | 12/2002 | Tsuge et al. | |
| 6,501,270 B1 | 12/2002 | Opie | |
| 6,525,531 B2 | 2/2003 | Forrest et al. | |
| 6,542,847 B1 | 4/2003 | Lohberg et al. | |
| 6,545,332 B2 | 4/2003 | Huang | |
| 6,545,457 B2 | 4/2003 | Goto et al. | |
| 6,545,462 B2 | 4/2003 | Schott et al. | |
| 6,590,804 B1 | 7/2003 | Perner | |
| 6,640,451 B1 | 11/2003 | Vinarcik | |
| 6,653,968 B1 | 11/2003 | Schneider | |
| 6,674,679 B1 | 1/2004 | Perner et al. | |
| 6,687,644 B1 | 2/2004 | Zinke et al. | |
| 6,692,676 B1 | 2/2004 | Vig et al. | |
| 6,770,163 B1 | 8/2004 | Kuah et al. | |
| 6,781,233 B2 | 8/2004 | Zverev et al. | |

(56) References Cited

U.S. PATENT DOCUMENTS

| | | |
|---|---|---|
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,112,955 B2 | 9/2006 | Buchhold |
| 7,112,957 B2 | 9/2006 | Bicking |
| 7,126,327 B1 | 10/2006 | Busch |
| 7,184,876 B2 | 2/2007 | Teulings et al. |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,990,209 B2 | 8/2011 | Romero |
| 8,030,918 B2 | 10/2011 | Doogue et al. |
| 8,058,870 B2 | 11/2011 | Sterling |
| 8,063,634 B2 | 11/2011 | Sauber et al. |
| 8,080,993 B2 | 12/2011 | Theuss et al. |
| 8,089,276 B2 | 1/2012 | Kentsch |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,274,279 B2 | 9/2012 | Gies |
| 8,362,579 B2 | 1/2013 | Theuss et al. |
| 8,610,430 B2 | 12/2013 | Werth et al. |
| 8,773,124 B2 | 7/2014 | Ausserlechner |
| 9,116,018 B2 | 8/2015 | Frachon |
| 9,164,156 B2 | 10/2015 | Elian et al. |
| 9,201,123 B2 | 12/2015 | Elian et al. |
| 2001/0002791 A1 | 6/2001 | Tsuge et al. |
| 2001/0009367 A1 | 7/2001 | Seitzer et al. |
| 2002/0027488 A1 | 3/2002 | Hayat-Dawoodi et al. |
| 2002/0084923 A1 | 7/2002 | Li |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0107366 A1 | 6/2003 | Busch et al. |
| 2003/0173955 A1 | 9/2003 | Uenoyama |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0155644 A1 | 8/2004 | Stauth et al. |
| 2004/0174164 A1 | 9/2004 | Ao |
| 2004/0184196 A1 | 9/2004 | Jayasekara |
| 2004/0189285 A1* | 9/2004 | Uenoyama ............. G01D 5/147 324/207.12 |
| 2004/0196045 A1 | 10/2004 | Larsen |
| 2004/0252563 A1 | 12/2004 | Hokuto et al. |
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |
| 2006/0038559 A1 | 2/2006 | Lamb et al. |
| 2006/0068237 A1 | 3/2006 | Murphy |
| 2006/0125473 A1 | 6/2006 | Frachon et al. |
| 2006/0175674 A1 | 8/2006 | Taylor |
| 2006/0181263 A1 | 8/2006 | Doogue et al. |
| 2006/0202692 A1 | 9/2006 | Tatschl et al. |
| 2006/0238190 A1 | 10/2006 | Ishio |
| 2006/0261801 A1* | 11/2006 | Busch .................. G01D 5/145 324/207.21 |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2008/0013298 A1 | 1/2008 | Sharma et al. |
| 2008/0094055 A1 | 4/2008 | Monreal et al. |
| 2008/0137784 A1 | 6/2008 | Krone |
| 2008/0237818 A1 | 10/2008 | Engel et al. |
| 2008/0238410 A1 | 10/2008 | Charlier et al. |
| 2009/0001964 A1 | 1/2009 | Strzalkowski |
| 2009/0001965 A1 | 1/2009 | Ausserlechner et al. |
| 2009/0001972 A1 | 1/2009 | Fernandez et al. |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0206827 A1 | 8/2009 | Aimuta et al. |
| 2009/0206831 A1 | 8/2009 | Fermon et al. |
| 2009/0212765 A1 | 8/2009 | Doogue et al. |
| 2009/0315543 A1 | 12/2009 | Guo et al. |
| 2010/0026279 A1 | 2/2010 | Vig et al. |
| 2010/0045268 A1 | 2/2010 | Kilian |
| 2010/0072988 A1 | 3/2010 | Hammerschmidt et al. |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0018533 A1 | 1/2011 | Cesaretti et al. |
| 2011/0031960 A1 | 2/2011 | Hohe et al. |

(56) References Cited

U.S. PATENT DOCUMENTS

| | | |
|---|---|---|
| 2011/0048102 A1 | 3/2011 | Fernandez et al. |
| 2011/0074405 A1 | 3/2011 | Doogue et al. |
| 2011/0127998 A1 | 6/2011 | Elian et al. |
| 2011/0267040 A1 | 11/2011 | Frachon |
| 2011/0298448 A1 | 12/2011 | Foletto et al. |
| 2012/0007589 A1 | 1/2012 | Okada |
| 2012/0013333 A1 | 1/2012 | Ararao et al. |
| 2012/0019236 A1 | 1/2012 | Tiernan et al. |
| 2012/0086090 A1 | 4/2012 | Sharma et al. |
| 2012/0249133 A1 | 10/2012 | Friedrich |
| 2012/0274314 A1 | 11/2012 | Cesaretti et al. |
| 2013/0015845 A1 | 1/2013 | Fox |
| 2013/0113474 A1 | 5/2013 | Elian |
| 2013/0214774 A1 | 8/2013 | Cesaretti et al. |
| 2013/0278246 A1 | 10/2013 | Stegerer et al. |
| 2014/0175584 A1 | 6/2014 | Foletto et al. |
| 2014/0176126 A1 | 6/2014 | Friedrich et al. |
| 2014/0266176 A1 | 9/2014 | Fernandez et al. |

FOREIGN PATENT DOCUMENTS

| | | |
|---|---|---|
| DE | 40 31 560 | 4/1992 |
| DE | 195 39 458 A1 | 4/1997 |
| DE | 196 34 715 A1 | 3/1998 |
| DE | 196 50 935 A1 | 6/1998 |
| DE | 198 38 433 | 3/1999 |
| DE | 199 61 504 A1 | 6/2001 |
| DE | 102 10 184 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2010 016 584 | 11/2010 |
| DE | 10 2010 016 584 A1 | 11/2010 |
| DE | 10 2011 102483 | 11/2012 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0 504 583 | 9/1992 |
| EP | 0 680 103 A1 | 11/1995 |
| EP | 0 898 180 A2 | 2/1999 |
| EP | 0 944 888 B1 | 10/2001 |
| EP | 1 443 332 A1 | 8/2004 |
| EP | 1 580 560 A1 | 9/2005 |
| EP | 1 637 898 A1 | 3/2006 |
| EP | 1 662 353 A1 | 5/2006 |
| EP | 1 679 524 A1 | 7/2006 |
| EP | 1 850 143 A1 | 10/2007 |
| EP | 2 063 229 | 5/2009 |
| EP | 2 063 229 A1 | 5/2009 |
| EP | 2402719 | 1/2012 |
| EP | 2 730 893 A1 | 5/2014 |
| FR | 2 748 105 | 10/1997 |
| FR | 2 909 756 | 6/2008 |
| GB | 2276727 A | 10/1994 |
| GB | 2481482 | 12/2011 |
| JP | 61-48777 | 3/1986 |
| JP | 363 084176 A | 4/1988 |
| JP | 63-263782 | 10/1988 |
| JP | 63-300911 | 12/1988 |
| JP | H02-116753 | 5/1990 |
| JP | 02-149013 | 6/1990 |
| JP | H03-29817 | 2/1991 |
| JP | 04-152688 | 5/1992 |
| JP | H06-273437 | 9/1994 |
| JP | 08-97486 | 4/1996 |
| JP | 09-166612 | 6/1997 |
| JP | 10-38988 | 2/1998 |
| JP | 10-332725 | 12/1998 |
| JP | H 10318784 | 12/1998 |
| JP | 11-064363 | 3/1999 |
| JP | 11-74142 | 3/1999 |
| JP | 2000-183241 A | 6/2000 |
| JP | 2001-043475 | 2/2001 |
| JP | 2001-141738 A | 5/2001 |
| JP | 2001-165702 | 6/2001 |
| JP | 2001-1659951 | 6/2001 |
| JP | 2002-117500 | 4/2002 |
| JP | 2002-149013 | 5/2002 |
| JP | 2002-357920 | 12/2002 |
| JP | 2003-177171 | 6/2003 |
| JP | 2004-055932 | 2/2004 |
| JP | 2004-093381 | 3/2004 |
| JP | 2004-152688 | 5/2004 |
| JP | 2004-356338 | 12/2004 |
| JP | 2004-357858 | 12/2004 |
| JP | 2005-517928 | 6/2005 |
| JP | 2005-337866 | 12/2005 |
| JP | 2005-345302 | 12/2005 |
| JP | 2006-003096 | 1/2006 |
| JP | 2007-012582 A | 1/2007 |
| JP | 2007-218799 | 8/2007 |
| JP | 2008-264569 | 11/2008 |
| WO | WO 88/09026 | 11/1988 |
| WO | WO 93/12403 | 6/1993 |
| WO | WO 94/08203 | 4/1994 |
| WO | WO 95/18982 | 7/1995 |
| WO | WO 96/02849 A1 | 2/1996 |
| WO | WO 1999/49322 | 9/1999 |
| WO | WO 01/74139 A2 | 10/2001 |
| WO | WO 01/74139 A3 | 10/2001 |
| WO | WO 03/069358 A2 | 8/2003 |
| WO | WO 03/069358 A3 | 8/2003 |
| WO | WO 03/107018 A1 | 12/2003 |
| WO | WO 2004/027436 | 4/2004 |
| WO | WO 2004/072672 A1 | 8/2004 |
| WO | WO 2005/013363 A2 | 2/2005 |
| WO | WO 2005/013363 A3 | 2/2005 |
| WO | WO 2006/056829 | 6/2006 |
| WO | WO 2006/083479 | 8/2006 |
| WO | WO 2007/138508 A1 | 12/2007 |
| WO | WO 2008/008140 A2 | 1/2008 |
| WO | WO 2008/008140 A3 | 1/2008 |
| WO | WO 2008/048379 A1 | 4/2008 |
| WO | WO 2008/121443 A1 | 10/2008 |
| WO | WO 2008/145662 A1 | 12/2008 |
| WO | WO 2009/108422 A2 | 9/2009 |
| WO | WO 2009/108422 A3 | 9/2009 |
| WO | WO 2010/014309 A1 | 2/2010 |
| WO | WO 2010/065315 | 6/2010 |
| WO | WO 2010/096367 A1 | 8/2010 |
| WO | WO 2011/011479 | 1/2011 |
| WO | WO 2012/148646 | 11/2012 |
| WO | WO 2013/189455 | 11/2013 |

OTHER PUBLICATIONS

Response dated Nov. 9, 2015 to Office Action dated Jul. 9, 2015; For U.S. Appl. No. 13/946,380; 26 pages.

Final Office Action dated Aug. 28, 2015; for U.S. Appl. No. 13/946,417; 34 pages.

Office Action dated Jul. 4, 2016 for U.S. Appl. No. 14/529,594; 94 pages.

Response dated Mar. 3, 2016 to Office Action dated Dec. 3, 2015; For U.S. Appl. No. 13/946,417; 17 pages.

PCT International Search Report and Written Opinion of the ISA dated Dec. 23, 2015; For PCT App. No. PCT/US2015/055233; 12 pages.

Final Office Action dated Dec. 15, 2015; For U.S. Appl. No. 13/946,380; 36 pages.

Non-Final Office Action dated Dec. 3, 2015; for U.S. Appl. No. 13/946,417; 29 pages.

Office Action dated Jul. 9, 2015; for U.S. Appl. No. 13/946,380; 63 pages.

PCT Search Report and Written Opinion of the ISA dated Dec. 19, 2014; for PCT Pat. App. No. PCT/US2014/044236; 23 pages.

Office Action dated Mar. 20, 2015; for U.S. Appl. No. 13/946,417; 54 pages.

(56) References Cited

OTHER PUBLICATIONS

Response with RCE filed on Apr. 12, 2016 to the Final Office Action dated Dec. 15, 2015; for U.S. Appl. No. 13/946,380; 20 pages.
PCT International Search Report and Written Opinion of the ISA dated Feb. 4, 2016; For PCT Pat. App. No. PCT/US2015/055474; 15 pages.
Response dated Nov. 9, 2015 to Final Office Action dated Aug. 28, 2015; For U.S. Appl. No. 13/946,417; 14 pages.
Request for Continued Examination dated Nov. 9, 2015; For U.S. Appl. No. 13/946,417; 3 pages.
PCT International Preliminary Report on Patentability and Written Opinion of the ISA dated Jan. 28, 2016; For PCT Pat. App. No. PCT/US2014/044236; 17 pages.
Response filed on Jun. 19, 2015 to Office Action dated Mar. 20, 2015; for U.S. Appl. No. 13/946,417; 15 pages.
Office Action dated Jul. 28, 2016 for U.S. Appl. No. 14/529,669; 78 pages.
Response to Office Action dated Jul. 28, 2016 for U.S. Appl. No. 14/529,669; Response filed on Oct. 28, 2016; 18 Pages.
Response filed on Nov. 9, 2016 to the Non-Final Office Action dated Aug. 26, 2016; for U.S. Appl. No. 13/946,380; 19 pages.
Response to Office Action filed on Nov. 9, 2016 for U.S. Appl. No. 13/946,380; 19 pages.
EP Response filed on Dec. 9, 2016 to Official Communication dated Oct. 14, 2016 regarding European Pat. Appl. No. 14742067.3; 23 pages.
Response to Oct. 6, 2016 Final Office Action from U.S. Appl. No. 13/946,417, filed Jan. 24, 2017; 14 Pages.
Final Office Action dated Jan. 12, 2017 for U.S. Appl. No. 13/946,380; 32 pages.
International Search Report and Written Opinion of the ISA dated Aug. 3, 2016; for PCT Application No. PCT/US2015/055230; 12 pages.
Office Action dated Nov. 3, 2016 regarding U.S. Appl. No. 14/529,606; 12 pages.
Response to Office Action filed on Jan. 26, 2017 for U.S. Appl. No. 14/529,606; 19 pages.
Final Office Action dated Jan. 4, 2017 for U.S. Appl. No. 14/529,594; 38 pages.
Final Office Action dated Jan. 9, 2017 for U.S. Appl. No. 14/529,669; 11 pages.
Office Action dated Aug. 26, 2016 for U.S. Appl. No. 13/946,380; 40 pages.
Final Office Action dated Oct. 6, 2016; for U.S. Appl. No. 13/946,417; 45 pages.
Response to Office Action flied Oct. 14, 2016 for U.S. Appl. No. 14/529,594; 29 pages.
U.S. Appl. No. 12/840,324, filed Jul. 21, 2010, Cesaretti et al.
U.S. Appl. No. 12/959,672, filed Dec. 3, 2010, Doogue et al.
U.S. Appl. No. 12/968,353, filed Dec. 15, 2010, Donovan et al.
U.S. Appl. No. 13/095,371, filed Apr. 27, 2011, Cesaretti et al.
U.S. Appl. No. 13/350,970, filed Jan. 16, 2012, Milano et al.
U.S. Appl. No. 13/398,127, filed Feb. 16, 2012, Cesaeretti et al.
U.S. Appl. No. 13/424,618, filed Mar. 20, 2012, Doogue et al.
U.S. Appl. No. 13/526,106, filed Jun. 18, 2012, Vig et al.
Ahn et al., "A New Toroidal-Meander Type Integrated Inductor With a Multilevel Meander Magnetic Core", IEEE Transactions on Magnetics, vol. 30, No. 1, Jan. 1994, pp. 73-79.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro Microsystems, Inc. Data Sheet A1341; "High Precision, Highly Programmable Linear Hail Effect Sensor IC with EEPROM, Output Protocols SENT and PWM, and Advanced Output Linearization Capabilities;" May 17, 2010; 46 pages.
Allegro Microsystems, Inc. Data Sheet ATS601LSG; "Non-TPOS, Tooth Detecting Speed Sensor;" Nov. 1, 2011; 9 pages.
Allegro Microsystems, Inc., "Gear-Tooth Sensor for Automotive Applications," Aug. 3, 2001.

Allegro MicroSystems, Inc., Hall-Effect IC Applications Guide, http://www.allegromicro.com/en/Products/Design/an/an27701.pdf, Copyright 1987, 1997, pp. 1-36.
Alllegro "True Zero-Speed Low-Jitter High Accuracy Gear Tooth Sensor;" ATS625LSG; 2005; Allegro MicroSystems, Inc. Worcester, MA 01615; pp. 1-21.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "Limits of Offset Cancellation by the Principle of Spinning Current Hall Probe;" Proceedings of IEEE Sensors; Oct. 2004; pp. 1117-1120.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantilevers;" IEEE Transactions on Circuits and Systems—I Regular Papers vol. 54, No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011, pp. 162-165.
Demierre, et al.; "Reference Magnetic Actuator for Self-Calibration of a Very Small Hall Sensor Array;" Sensors and Actuators A97-98; Apr. 2002; pp. 39-46.
Dwyer, "Back-Biased Packaging Advances (SE, SG & SH versus SA & SB)," http://www.allegromicro.com/en/Products/Design/packaging_advances/index.asp, Copyright 2008, pp. 1-5.
Frick, et al.; "CMOS Microsystem for AC Current Measurement with Galvanic Isolation;" IEEE Sensors Journal; vol. 3, No. 6; Dec. 2003; pp. 752-760.
Halg; "Piezo-Hall Coefficients of n-Type Silicon;" Journal of Applied Physics; vol. 64, No. 1; Jul. 1, 1988; pp. 276-282.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Hosticka; "CMOS Sensor Systems;" Sensors and Actuators A66; Apr. 1998; pp. 335-341.
Infineon Product Brief, TLE 4941plusC, Differential Hall IC for Wheel Speed Sensing, Oct. 2010, www.infineon.com/sensors, 2 pages.
Infineon Technologies; Differential Two-Wire Hall Effect Sensor IC; TLE4942 Preliminary Data Sheet; Jun. 2000; pp. 1-13.
Johnson et al., "Hybrid Hall Effect Device," Appl. Phys. Lett., vol. 71, No. 7, Aug. 1997, pp. 974-976.
Kandy et al.; "The Piezo-Hall Effect in n-Silicon;" $22^{nd}$ International Conference on the Physics of Semiconductors; vol. 1, Jan. 1995; pp. 89-92.
Krammerer et al.: "A Hall effect sensors network insensitive to mechanical stress;" Prcoeedings of IEEE Sensors; vol. 3, Oct. 2004; pp. 1071-1074.
Lagorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.

(56) References Cited

OTHER PUBLICATIONS

Lequesne et al.; "High-Accuracy Magnetic Position Encoder Concept;" IEEE Transactions on Industry Applications; vol. 35, No. 3; May/Jun. 1999; pp. 568-576.
Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.
Manic et al.; "Short and Long-Term Stability Problems of Hall Plates in Plastic Packages;" IEEE $38^{th}$ Annual International Reliability Physics Symposium; Apr. 2000; pp. 225-230.
Manic; "Drift in Silicon Integrated Sensors and Circuits Due to the Thermo-Mechanical Stresses;" Lausanne, École Polytechnique Fédérale De Lausanne 2000; Part 1 of 2; 74 pages.
Manic; "Drift in Silicon Integrated Sensors and Circuits Due to the Thermo-Mechanical Stresses;" Lausanne, École Polytechnique Fédérale De Lausanne 2000; Part 2 of 2; 102 pages.
Melexis Microelectronic Systems, Hall Applications Guide, Section 3—Applications, 1997 (48 pages).
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN; 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuity for a Smart Spinning-current Hall Plate with Low Offset;" Sensors and Actuators A; Jun. 1991;.pp. 747-751.
Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper, 4 pages.
Park et al.: "Batch-Fabricated Microinductors with Electroplated Magnetically Anisotropic and Laminated Alloy Cores", IEEE Transactions on Magnetics, vol. 35, No. 5, Sep. 1999, 10 pages.
Park et al.; "Ferrite-Based integrated Planar Inductors and Transformers Fabricated at Low Temperature;" IEEE Transactions on Magnetics; vol. 33, No. 5; Sep. 1997; pp. 3322-3324.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic; "Sensor Microsystems;" Proc. $20^{th}$ International Conference on Microelectronics (MWIL 95); vol. 2, NIS, Serbia, Sep. 12-14, 1995; pp. 531-537.
Randhawa; "Monolithic Integrated Hall Devices in Silicon Circuits;" Microelectronics Journal; vol. 12, No. 6; Sep. 14-17, 1981; pp. 24-29.
Robert Bosch GmbH Stuttgart; "Active Sensor for ABS/ASR/VDC-Systems with 2-Wire-Current Interface;" Specification TLE4941/TLE4942; Version 5; Jun. 25, 2000; 44 pages.
Ruther et al.; "Integrated CMOS-Based Sensor Array for Mechanical Stress Mapping;" $5^{th}$ IEEE Conference on Sensors, Oct. 2007; pp. 1131-1134.
Ruther et al.; "Thermomagnetic Residual Offset in Integrated Hall Plates;" IEEE Sensors Journal; vol. 3, No. 6; Dec. 2003; pp. 693-699.
Sargent; "Switched-capacitor IC controls feedback loop;" EDN; Design Ideas; Feb. 17, 2000; pp. 154 and 156.
Schneider; "Temperature Calibration of CMOS Magnetic Vector Probe for Contactless Angle Measurement System," IEDM 1996 pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" $8^{th}$ International Conference on Solid-State Sensors and Actuators; vol. 2; Jun. 25, 1995; pp. 237-240.
Smith et al.; "Low Magnetic Field Sensing with GMR Sensors;" Sensor Magazine; Part 1; Sep. 1999; http://archives.sensorsmag.com/articles/0999/76mail.shtml; pp. 1-8.
Smith et al.; "Low Magnetic Field Sensing with GMR Sensors;" Sensor Magazine; Part 2; Oct. 1999; http://archives.sensorsmag.com/articles/1099/84/mail.shtml; pp. 1-11.
Steiner et al.; "Double-Hall Sensor with Self-Compensated Offset;" International Electron Devices Meeting; Dec. 7, 1997; ISBN: 0-7803-4100-7; pp. 911-914.
Steiner et al; Offset Reduction in Hall Devices by Continuous Spinning Current Method; Sensors and Actuators A66; 1998; pp. 167-172.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Reference in Magnetic Field Sensors on Common Substrate;" WEP 1-6; IMTC; May 1994; pp. 461-463.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
Office Action/Restriction Requirement dated May 14, 2010; for U.S. Appl. No. 12/037,393; 6 pages.
Response to Office Action/Restriction Requirement dated May 14, 2010; for U.S. Appl. No. 12/037,393; 6 pages.
Office Action dated Jun. 30, 2010; for U.S. Appl. No. 12/037,393; 21 pages.
Response to Office Action dated Jun. 30, 2010; for U.S. Appl. No. 12/037,393; 34 pages.
Notice of Allowance dated Nov. 3, 2010; for U.S. Appl. No. 12/037,393; 7 pages.
Request for Continued Examination dated Jan. 25, 2011; for U.S. Appl. No. 12/037,393; 1 page.
Notice of Allowance dated Feb. 11, 2011; for U.S. Appl. No. 12/037,393; 8 pages.
Office Action dated Feb. 2, 2011; for U.S. Appl. No. 12/959,672; 13 pages.
Response to Office Action dated Feb. 2, 2011; for U.S. Appl. No. 12/959,672; 8 pages.
Notice of Allowance dated Jun. 27, 2011; for U.S. Appl. No. 12/959,672; 8 pages.
Request for Continued Examination dated Jul. 12, 2011; for U.S. Appl. No. 12/959,672; 2 pages.
Notice of Allowance dated Jul. 19, 2011; for U.S. Appl. No. 12/959,672; 8 pages.
Office Action/Restriction Requirement dated Apr. 12, 2012; for U.S. Appl. No. 12/183,367; 6 pages.
Response to Office Action/Restriction Requirement dated Apr. 12, 2013; for U.S. Appl. No. 12/183,367;2 pages.

(56) References Cited

OTHER PUBLICATIONS

Office Action dated May 12, 2011; for U.S. Appl. No. 12/183,367; 17 pages.
Response to Office Action dated May 12, 2011; for U.S. Appl. No. 12/183,367; 13 pages.
Office Action dated Oct. 20, 2011; for U.S. Appl. No. 12/183,367; 11 pages.
Supplemental Response to Restriction Requirement dated Feb. 6, 2013; for U.S. Appl. No. 12/183,367; 2 pages.
Response to Office Action dated Oct. 20, 2011; for U.S. Appl. No. 12/183,367; 15 pages.
Final Office Action dated May 2, 2013; for U.S. Appl. No. 12/183,367; 15 pages.
Response to Final Office Action dated May 2, 2013; for U.S. Appl. No. 12/183,367; 8 pages.
Final Office Action dated Jul. 1, 2013; for U.S. Appl. No. 12/183,367; 6 pages.
Final Office Action dated Jul. 23, 2013; for U.S. Appl. No. 12/183,367; 8 pages.
Response to Office Action dated Jul. 23, 2013; for U.S. Appl. No. 12/183,367; 13 pages.
Notice of Allowance dated Sep. 6, 2013; for U.S. Appl. No. 12/183,367; 7 pages.
Office Action dated Jun. 7, 2012; for U.S. Appl. No. 12/360,889; 9 pages.
Response to Office Action dated Jun. 7, 2012; for U.S. Appl. No. 12/360,889; 11 pages.
Office Action dated Jan. 18, 2013; for U.S. Appl. No. 12/360,889; 7 pages.
Response to Office Action dated Jan. 18, 2013; for U.S. Appl. No. 12/360,889; 6 pages.
Office Action dated Jun. 28, 2013; for U.S. Appl. No. 12/360,889; 7 pages.
Response to Office Action dated Jun. 28, 2013; for U.S. Appl. No. 12/360,889; 15 pages.
Office Action/Restriction Requirement dated Oct. 23, 2009; for U.S. Appl. No. 12/328,798; 7 pages.
Response to Office Action/Restriction Requirement dated Oct. 23, 2009; for U.S. Appl. No. 12/328,798; 1 page.
Office Action dated Dec. 14, 2009; for U.S. Appl. No. 12/328,798; 20 pages.
Response to Office Action dated Dec. 14, 2009; for U.S. Appl. No. 12/328,798; 22 pages.
Office Action dated May 24, 2010; for U.S. Appl. No. 12/328,798; 22 pages.
Response to Office Action dated May 24, 2010; for U.S. Appl. No. 12/328,798; 23 pages.
Office Action dated Oct. 31, 2011; for U.S. Appl. No. 12/328,798; 23 pages.
Response to Office Action dated Oct. 31, 2011; for U.S. Appl. No. 12/328,798; 14 pages.
Final Office Action dated May 10, 2012; for U.S. Appl. No. 12/328,798; 17 pages.
Response to Final Office Action dated May 10, 2012; for U.S. Appl. No. 12/328,798; 6 pages.
Request for Continued Examination dated Aug. 9, 2012; for U.S. Appl. No. 12/328,798; 1 page.
Notice of Allowance dated Oct. 26, 2012; for U.S. Appl. No. 12/328,798; 13 pages.
Request for Continued Examination dated Jan. 24, 2013; for U.S. Appl. No. 12/328,798; 3 pages.
Notice of Allowance dated Mar. 1, 2013; for U.S. Appl. No. 12/328,798; 10 pages.
Office Office Action dated Feb. 22, 2012; for U.S. Appl. No. 13/241,380; 23 pages.
Response to Office Action dated Feb. 22, 2012; for U.S. Appl. No. 13/241,380; 16 pages.
Office Action dated Jul. 19, 2012; for U.S. Appl. No. 13/241,380; 18 pages.
Response to Office Action dated Jul. 19, 2012; for U.S. Appl. No. 13/241,380; 6 pages.
Notice of Allowance dated Oct. 29, 2012; for U.S. Appl. No. 13/241,380; 23 pages.
Request for Continued Examination dated Jan. 24, 2013; for U.S. Appl. No. 13/241,380; 3 pages.
Notice of Allowance dated Feb. 21, 2013; for U.S. Appl. No. 13/241,380; 9 pages.
Office Action dated Jul. 6, 2012; for U.S. Appl. No. 12/706,318; 29 pages.
Response to Office Action dated Jul. 6, 2012; for U.S. Appl. No. 12/706,318; 12 pages.
Supplemental Response to Office Action dated Jul. 6, 2012; for U.S. Appl. No. 12/706,318; 12 pages.
Notice of Allowance dated Dec. 10, 2012; for U.S. Appl. No. 12/706,318; 9 pages.
Office Action dated Sep. 11, 2012; for U.S. Appl. No. 12/840,324; 30 pages.
Response to Office Action dated Sep. 11, 2012; for U.S. Appl. No. 12/840,324; 15 pages.
Final Office Action dated Feb. 12, 2013; for U.S. Appl. No. 12/840,324; 19 pages.
Response to Final Office Action dated Feb. 12, 2013; for U.S. Appl. No. 12/840,324; 12 pages.
Notice of Allowance dated May 24, 2013; for U.S. Appl. No. 12/840,324; 12 pages.
Corrected Notice of Allowability dated Jul. 17, 2013; for U.S. Appl. No. 12/840,324; 7 pages.
Corrected Notice of Allowability dated Aug. 9, 2013; for U.S. Appl. No. 12/840,324; 6 pages.
Office Action dated Jun. 11, 2013; for U.S. Appl. No. 13/095,371; 31 pages.
Response to Office Action dated Jun. 11, 2013; for U.S. Appl. No. 13/095,371; 25 pages.
Notice of Allowance dated Oct. 28, 2013; for U.S. Appl. No. 13/096,371; 19 pages.
European Board of Appeals Decision dated Feb. 28, 2005; for European Pat. App. No. 03 710 766.1; 14 pages.
European Communication for the Board of Appeals dated Apr. 30, 2009; for European Pat. App. No. 03 710 766.1; 2 pages.
European Board of Appeals Datasheet for the Decision dated Nov. 22, 2007; for European Pat. App. No. 03 710 766.1; 22 pages.
European Preliminary Amendment from the Board of Appeal dated May 26, 2009; for European Pat. App. No. 03 710 766.1; pages.
Letter from Yuasa and Hara dated Jun. 4, 2008; Japanese First Office Action issued Apr. 7, 2008; for JP Pat. App. No. 2009-568426; 5 pages.
Letter from Yuasa and Hara dated Oct. 21, 2008; Japanese Response to First Office Action filed Sep. 22, 2008; for JP Pat. App. No. 2009-568426; 14 pages.
Letter from Yuasa and Hara dated Dec. 12, 2008; Japanese Second Office Action; for JP Pat. App. No. 2009-568426; 4 pages.
Letter from Yuasa and Hara dated Apr. 23, 2009; Japanese Response to Second Office Action filed Mar. 25, 2009; for JP Pat. App. No. 2009-568426; 8 pages.
Letter from Yuasa and Hara dated Jan. 17, 2011; Japanese Third Office Action dated Feb. 16, 2011; for JP Pat. App. No. 2009-568426; 5 pages.
Letter from Yuasa and Hara dated Jun. 9, 2011; Japanese Response to Third Office Action filed May 13, 2011; for JP Pat. App. No. 2009-568426; 27 pages.
Japanese Notice of Allowance dated Nov. 8, 2011; for Japanese Pat. App. No. 2009-568426; 3 pages.
Letter from NTD Patent & Trademark Agency Limited dated Oct. 13, 2010; for Chinese Pat. App. No. 200880008895.3; 2 pages.
Chinese Office Action (with English translation) dated Sep. 9, 2010; for Chinese Pat. App. No. 200880008895.3; 12 pages.
Letter from NTD Patent & Trademark Agency Limited dated Mar. 28, 2011; for Chinese Pat. App. No. 200880008895.3; 1 page.
Chinese Response to Office Action; for Chinese Pat. App. No. 200880008895.3; 7 pages.
Chinese Notice of Allowance (with English translation) dated Jul. 4, 2011; for Chinese Pat. App. No. 200880008895.3; 4 pages.

(56) References Cited

OTHER PUBLICATIONS

Letter from Yuasa and Hara dated Jul. 26, 2012; for Japanese Pat. App. No. 2010-201028; 5 pages.
Japanese First Office Action (English translation); for Japanese Pat. App. No. 2010-201028; 5 pages.
Letter from Yuasa and Hara dated Oct. 16, 2012; for Japanese Pat. App. No. 2010-201028; 2 pages.
Japanese Response to First Office Action (with English translation); for Japanese Pat. App. No. 2010-201028; 10 pages.
Letter from Yuasa and Hara dated Aug. 7, 2013; for Japanese Pat. App. No. 2010-201028; 4 pages.
Japanese Second Office Action (English translation); for Japanese Pat. App. No. 2010-201028; 3 pages.
Letter from NTD Patent and Trademark Office dated Oct. 10, 2012; for Chinese Pat. App. No. 200980106535.4; 2 pages.
Chinese First Office Action (with English translation) dated Aug. 29, 2012; for Chinese Pat. App. No. 200980106535.4; 8 pages.
Letter to NTD Patent and Trademark Office dated Dec. 11, 2012; for Chinese Pat. App. No. 200980106535.4; 8 pages.
Letter from NTD Patent and Trademark Office dated Jan. 19, 2013; for Chinese Pat. App. No. 200980106535.4; 1 page.
Response to Chinese First Office Action dated Aug. 29, 2012; for Chinese Pat. App. No. 200980106535.4; 12 pages.
Letter from NTD Patent and Trademark Office dated May 21, 2013; for Chinese Pat. App. No. 200980106535.4; 2 pages.
Chinese Second Office Action (with English translation) dated Apr. 15, 2013; for Chinese Pat. App. No. 200980106535.4; 9 pages.
Letter to NTD Patent and Trademark Agency dated Jun. 19, 2013; for Chinese Pat. App. No. 200980106535.4; 11 pages.
Letter from NTD Patent and Trademark Agency dated Jul. 11, 2013; for Chinese Pat. App. No. 200980106535.4; 1 pages.
Response to Chinese Second Office Action dated Aug. 29, 2012; for Chinese Pat. App. No. 200980106535.4; 12 pages.
Letter from Yuasa and Hara dated May 27, 2013; for Japanese Pat. App. No. 2010-547666; 2 pages.
Email from NTD Patent and Trademark Office dated Jun. 11, 2012; for Chinese Pat. App. No. 200920783766.7; 2 pages.
Japanese First Office Action (with English translation) dated May 3, 2012; for Chinese Pat. App. No. 200920783766.7; 13 pages.
Letter to NTD Patent and Trademark Office dated Aug. 29, 2012; for Chinese Pat. App. No. 200920783766.7; 20 pages.
Letter from NTD Patent and Trademark Office dated Oct. 18, 2012; for Chinese Pat. App. No. 200920783766.7; 1 pages.
Response to Japanese First Office Action dated May 3, 2013; for Chinese Pat. App. No. 200920783766.7; 9 pages.
Letter from NTD Patent and Trademark Agency dated Feb. 6, 2013; for Chinese Pat. App. No. 200920783766.7; 2 pages.
Japanese Second Office Action dated Jan. 18, 2013; for Chinese Pat. App. No. 200920783766.7; 8 pages.
Letter to NTD Patent and Trademark Agency dated Feb. 6, 2013; for Chinese Pat. App. No. 200920783766.7; 2 pages.
Letter from NTD Patent and Trademark Agency dated Mar. 21, 2013; for Chinese Pat. App. No. 200920783766.7; 1 page.
Response to Japanese Second Office Action (with English translation) dated Jan. 18, 2013; for Chinese Pat. App. No. 200920783766.7; 7 pages.
Chinese Notice of Completing Formalities for Patent Registration (with English translation); dated Mar. 6, 2013; for Chinese Pat. App. No. 200920783766.7; 4 pages.
Letter from Yuasa and Hara dated Aug. 16, 2013; for Japanese Pat. App. No. 2011-539582; 3 pages.
Japanese Notice of Reasons for Rejection; dated Jul. 16, 2013; for Japanese Pat. App. No. 2011-539582; 3 pages.
EP Official Communication; dated Feb. 23, 2012; for EP. Pat. App. No. 10739429.8; 2 pages.
Response to EP Official Communication dated Feb. 23, 2012 for EP. Pat. App. No. 10739429.8; filed on Sep. 4, 2012, 21 pages.
European Decision to Grant Patent dated Sep. 5, 2013; for European Pat. App. No. 10739429.8; 2 pages.

PCT Search Report dated Nov. 19, 2003 for PCT Pat. App. No. PCT/US03/02489; 5 pages.
PCT Search Report for PCT/US2006/000363 dated May 11, 2006.
PCT International Preliminary Report and Written Opinion on Patentability of the ISA dated Aug. 7, 2007; for PCT/US2006/000383; 9 pages.
PCT Search Report and Written Opinion of the ISA for PCT/US2008/053551; dated Jul. 15, 2008; 11 pages.
PCT International Preliminary Report on Patentability for PCT/US2008/053551; dated Oct. 8, 2009; 7 pages.
PCT Search Report of the ISA for PCT/US2009/031776 dated Oct. 23, 2009.
PCT International Preliminary Report on Patentability and Written Opinion mailed Sep. 10, 2010 for PCT/US2009/031776.
PCT Search Report of the ISA for PCT/US2009/048237 dated Aug. 25, 2009; 2 pages.
PCT International Preliminary Report on Patentability and Written Opinion for PCT/US2009/048237 dated Feb. 10, 2011, 8 pages.
European Response to Written Opinion dated Apr. 18, 2011; for European Pat. App. No. 09789890,2; 11 pages.
PCT Search Report and Written Opinion for PCT/US2009/065044 dated Jan. 7, 2010; 11 pages.
PCT International Preliminary Report on Patentability and Written Opinion of the ISA; dated Jun. 7, 2011; for PCT Pat. App. No. PCT/US2009/065044; 7 pages.
PCT Search Report and Written Opinion of the ISA for PCT/US2010/024256 dated Aug. 11, 2010; 11 pages.
Amendment under PCT Article 19 filed on Oct. 5, 2010 in PCT/US2010/024256; 18 pages.
PCT International Preliminary Report on Patentability and Written Opinion of the ISA dated Sep. 1, 2011; for PCT Pat. App. No. PCT/US2010/024256; 9 pages.
PCT Search Report and Written Opinion of the ISA for PCT/US2010/042694 dated Sep. 27, 2010; 13 pages.
PCT International Preliminary Report on Patentability end Written Opinion of the ISA; dated Feb. 2, 2012; for PCT Pat. App. No. PCT/US2010/042694; 11 pages.
European Search Report dated Jul. 4, 2011; for European Pat. App. No. 13169661.9; 11 pages.
PCT Search Report and Written Opinion of the ISA for PCT Pat. App. No. PCT/US2012/032315; dated Jun. 22, 2012; 16 pages.
PCT Search Report and the Written Opinion of the ISA dated Jul. 17, 2013; for PCT/US2013/037065; 13 pages.
U.S. Appl. No. 13/439,094, filed Apr. 4, 2012, Friedrich et al.
U.S. Appl. No. 13/748,999, filed Jan. 24, 2013, Vig et al.
U.S. Appl. No. 13/871,131, filed Apr. 26, 2013, David et al.
U.S. Appl. No. 13/946,010, filed Jul. 19, 2013, David et al.
U.S. Appl. No. 13/946,380, filed Jul. 19, 2013, Taylor et al.
U.S. Appl. No. 13/946,400, filed Jul. 19, 2013, David et al.
U.S. Appl. No. 13/946,417, filed Jul. 19, 2013, Burdette et al.
U.S. Appl. No. 13/946,830, filed Jul. 19, 2013, Taylor et al.
U.S. Appl. No. 14/529,594, filed Oct. 31, 2014, Drouin et al.
U.S. Appl. No. 14/529,606, filed Oct. 31, 2014, Foletto et al.
U.S. Appl. No. 14/529,669, filed Oct. 31, 2014, David et al.
Bowers et al.; "Microfabrication and Process Integration of Powder-Based Permanent Magnets;" Technologies for Future Micro-Nano Manufacturing Workshop; Aug. 2011; pp. 162-165.
Kapser et al.; "Integrated GMR Based Wheel Speed Sensor for Automotive Applications;" IEEE 2007 Conference on Sensors; Oct. 2007; pp. 848-851.
Oniku et al.; "High-Energy-Density Permanent Micromagnets Formed From Heterogeneous Magnetic Powder Mixtures;" IEEE 25$^{th}$ International Conference on Micro Electra Mechanical Systems, Jan. 2012; 4 pages.
Office Action in U.S. Appl. No. 13/468,478 dated Jan. 15, 2014, 36 pages.
International Search Report and Written Opinion dated Oct. 28, 2014 for Int'l PCT Application PCT/US2014/044991; 12 pages.
International Search Report and Written Opinion dated Nov. 4, 2014 for Int'l PCT Application PCT/US2014/044993; 13 pages.
PCT Invitation to Pay Additional Fees and Partial Search Report dated Nov. 4, 2014; for PCT Pat. App. No. PCT/US2014/044236; 7 pages.

(56) References Cited

OTHER PUBLICATIONS

PCT Search Report and Written Opinion of the ISA dated Dec. 19, 2014; for PCT Pat. App. No. PCT/US2014/044238; 23 pages.
Amendment filed Mar. 30, 2017 for U.S. Appl. No. 14/529,669; 12 pages.
Response to Final Office Action filed on Mar. 31, 2017 for U.S. Appl. No. 14/529,594, 16 pages.
European Search Report dated Apr. 5, 2017 for EP Pat. Appl, No. 16192498.0: 10 pages.
Request for Continued Examination filed on Apr. 11, 2017 for U.S. Appl. No. 13/946,380; 3 pages.
Amendment filed on Apr. 11, 2017 for U.S. Appl. No. 13/946,380; 18 pages.
Request for Continued Examination filed on Apr. 21, 2017 for U.S. Appl. No. 14/529,606; 3 pages.
Preliminary Amendment filed on Apr. 21, 2017 for U.S. Appl. No. 14/529,606; 12 pages.
Notice of Allowance dated May 10, 2017 for U.S. Appl. No. 14/529,594; 8 pages.
Non-final Office Action dated May 19, 2017 for U.S. Appl. No. 14/529,606; 11 pages.

\* cited by examiner

MAGNETIC FIELD SENSOR FOR SENSING A MOVEMENT OF A FERROMAGNETIC TARGET OBJECT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to magnetic field sensors having a substrate with magnetic field sensing elements thereupon to sense a motion of a ferromagnetic object, all arranged in a variety of relative positions.

BACKGROUND

Various types of magnetic field sensing elements are known, including Hall Effect elements and magnetoresistance elements. Magnetic field sensors generally include a magnetic field sensing element and other electronic components. Some magnetic field sensors also include a permanent magnet (a hard ferromagnetic object) in a so-called "back biased" arrangement described more fully below. Other magnetic field sensors sense motion of a magnet.

Magnetic field sensors provide an electrical signal representative of a sensed magnetic field. In some embodiments that have the magnet (back-biased arrangements), the sensed magnetic field is a magnetic field generated by the magnet, in which case, in the presence of a moving ferromagnetic object, the magnetic field generated by the magnet and sensed by the magnetic field sensor varies in accordance with a shape or profile of the moving ferromagnetic object. In contrast, magnetic field sensors that sense a moving magnet directly sense variations of magnetic field magnitude and direction that result from movement of the magnet.

Magnetic field sensors (back-biased) are often used to detect movement of features of a ferromagnetic gear, such as gear teeth and/or gear slots or valleys. A magnetic field sensor in this application is commonly referred to as a "gear tooth" sensor.

In some arrangements, the gear is placed upon a ferromagnetic target object, for example, a camshaft in an engine. Thus, it is the rotation of the ferromagnetic target object (e.g., camshaft) that is sensed by detection of the moving features of the gear. Gear tooth sensors are used, for example, in automotive applications to provide information to an engine control processor for ignition timing control, fuel management, anti-lock braking systems, wheel speed sensors, and other operations.

Information provided by the gear tooth sensor to the engine control processor can include, but is not limited to, an absolute angle of rotation of a ferromagnetic target object (e.g., a camshaft) as it rotates, a speed of the rotation, and a direction of the rotation. With this information, the engine control processor can adjust the timing of firing of the ignition system and the timing of fuel injection by the fuel injection system.

Many types of magnetic field sensors do not provide an accurate output signal (e.g., indication of absolute angle, speed, or direction of rotation) immediately upon power up, upon movement of the ferromagnetic target object from zero rotating speed, and/or upon movement slowing to zero rotating speed, but instead provide an accurate output signal only once the ferromagnetic target object has moved through a substantial rotation or is moving with substantial speed. For example, in one type of magnetic field sensor described in U.S. Pat. No. 6,525,531, entitled "Detection of Passing Magnetic Articles while Adapting the Detection Threshold," issued Feb. 25, 2003, a positive digital-to-analog converter (PDAC) and a negative digital-to-analog converter (NDAC) track positive and negative peaks of a magnetic field signal, respectively, for use in generating a threshold signal. A varying magnetic field signal is compared to the threshold signal. However, the outputs of the PDAC and the NDAC may not be accurate indications of the positive and negative peaks of the magnetic field signal until several cycles of the signal (i.e., signal peaks) occur (i.e., until several gear teeth have passed). This type of magnetic field sensor, which generally requires time to become fully accurate, is referred to herein as a so-called "precision rotation detector."

In contrast, a "true power on state" (TPOS) detector can provide an accurate output signal shortly after movement of a ferromagnetic target object (e.g., camshaft) from zero rotating speed, or a low rotation speed in some applications of, for example, less than 100 rpm, or also shortly before movement slowing to zero rotating speed. Furthermore, even when the ferromagnetic target object is not moving, the TPOS detector can provide an indication of whether the TPOS detector is in front of a tooth or a valley of a gear. However, when the ferromagnetic target object is stationary, the conventional TPOS detector is not able to identify an absolute or relative angle of rotation of the ferromagnetic target object. The TPOS detector can be used in conjunction with a precision rotation detector within a common integrated circuit, each providing information to the engine control processor at different times. For simplicity, TPOS detectors and precision rotation detectors are shown herein within a common integrated circuit. However, the TPOS detector or the precision rotation detector can also be used alone in separate circuits.

As described above, the conventional TPOS detector provides an accurate output signal with only a small initial rotation of the ferromagnetic target object, and before the precision rotation detector can provide an accurate output signal. The TPOS detector can provide information to the engine control processor that can be more accurate than information provided by the precision rotation detector for time periods at the beginning and at the end of rotation of the ferromagnetic target object (e.g., start and stop of the engine and camshaft), but which may be less accurate when the object is rotating at speed. For magnetic field sensor arrangements that have both a TPOS detector and a precision rotation detector within a common integrated circuit, when the object is not rotating or rotating slowly, the engine control processor can use the TPOS detector. When rotating at speed, the engine control processor can primarily use rotation information provided by the precision rotation detector. In most conventional applications, once the magnetic field sensor switches to use the precision rotation detector, it does not return to use the TPOS detector until the ferromagnetic target object stops rotating or nearly stops rotating.

A conventional TPOS detector is described in U.S. Pat. No. 7,362,094, entitled "Method and Apparatus for Magnetic Article Detection," issued Apr. 22, 2008. The conventional TPOS detector includes a comparator for comparing the magnetic field signal to a fixed, often trimmed, threshold signal. The conventional TPOS detector can be used in conjunction with and can detect rotational information about a TPOS cam (like a gear), which is disposed upon a ferromagnetic target object, e.g., an engine camshaft, configured to rotate.

An example of an output signal from a conventional TPOS detector has at least two states, and typically a high and a low state. The state of the conventional TPOS output signal is high at some times and low at other times as the ferromagnetic target object rotates, in accordance with features on the TPOS cam (or gear) attached to the ferromagnetic target object.

Similarly, an output signal from a conventional precision rotation detector also has at least two states, and typically a high and a low state. The state of the conventional precision rotation detector output signal is high at some times and low at other times as the ferromagnetic target object rotates, also in accordance with features on the TPOS cam (or gear) attached to the ferromagnetic target object As described above, conventional TPOS detectors have the ability to differentiate a gear tooth from a gear valley, and to make such detection when the gear is rotating and when the gear is not rotating. In contrast, some conventional precision rotation detectors have the ability to differentiate a gear tooth from a gear valley when the gear is rotating, but not when the gear is stationary. Detectors that can identify a gear tooth from a valley are sometimes referred to as "tooth detectors." Thus, TPOS detectors are usually tooth detectors. Some precision rotation detectors can also be tooth detectors.

Some other conventional precision rotation detectors are unable to differentiate a gear tooth from a valley, but instead, can differentiate an edge of a tooth of the gear from the tooth or the valley. Such detectors are sometimes referred to as "edge detectors." Usually, TPOS detectors are not edge detectors. However, some precision rotation detectors can be edge detectors.

The conventional magnetic field sensor must achieve an accurate output signal that accurately differentiates between gear teeth and gear valleys even in the presence of an air gap between the magnetic field sensor and the gear that may change from installation to installation or from time to time. Still further, the conventional magnetic field sensor must achieve these differentiations even in the presence of unit-to-unit variations in relative positions of the magnet and the magnetic field sensing element within the magnetic field sensor. Still further, the conventional magnetic field sensor must achieve these differentiations even in the presence of unit-to-unit variations in the magnetic field generated by the magnet. Still further, the conventional magnetic field sensor must achieve these differentiations even in the presence of variations of an axial rotation of the magnetic field sensor relative to the gear. Still further, the conventional magnetic field sensor must achieve these differentiations even in the presence of variations of temperature around the magnetic field sensor.

The above effects result in expensive design choices. In particular, some of the above effects result it use of an expensive magnet described below in conjunction with FIG. 1.

It would be desirable to provide a magnetic field sensor that can achieve an accurate output signal that accurately differentiates between gear teeth and gear valleys while using a simpler and less expensive magnet.

SUMMARY

A magnetic field sensor achieves an accurate output signal that accurately differentiates between gear teeth and gear valleys while using a simpler and less expensive magnet. The differentiation is achieved even in the presence of variations of mechanical and thermal parameters associated with the magnetic field sensor.

In accordance with an example useful for understanding an aspect of the present invention, a magnetic field sensor for sensing a movement of a ferromagnetic target object having ferromagnetic target object features with a target feature width, includes a substrate. The magnetic field sensor further includes a first full bridge circuit disposed upon the substrate and proximate to the ferromagnetic target object. The first full bridge circuit includes a first magnetoresistance element; a second magnetoresistance element, the first and second magnetoresistance elements proximate to each other forming a first proximate pair, a third magnetoresistance; and a fourth magnetoresistance element, the third and fourth magnetoresistance elements proximate to each other forming a second proximate pair. The first full bridge circuit further includes a first noninverting output node joining a selected two of the first, second, third and fourth magnetoresistance elements; and a first inverting output node joining a different selected two of the first, second, third and fourth magnetoresistance elements. A first differential signal is generated between the first noninverting node and the first inverting node. The magnetic field sensor further includes a second full bridge circuit disposed upon the substrate and proximate to the ferromagnetic target object. The second full bridge circuit includes a fifth magnetoresistance element; a sixth magnetoresistance element, the fifth and sixth magnetoresistance elements proximate to each other forming a third proximate pair, a seventh magnetoresistance element; and eighth magnetoresistance element, the seventh and eighth magnetoresistance elements proximate to each other forming a fourth proximate pair. The second full bridge circuit further includes a second noninverting output node joining a selected two of the fifth, sixth, seventh, and eighth magnetoresistance elements. The second full bridge circuit further includes a second inverting output node joining a different selected two of the fifth, sixth, seventh, and eighth magnetoresistance elements. A second differential signal is generated between the second noninverting node and the second inverting node. The magnetic field sensor further includes a first combining circuit disposed upon the substrate and configured to combine the first differential signal and the second differential signal to generate a feature signal having a largest value when a ferromagnetic target object feature is centered with the first and second full bridge circuits. The magnetic field sensor further includes a second combining circuit disposed upon the substrate and configured to combine the first differential signal and the second differential signal to generate an edge signal having a largest value when the first full bridge circuit is on one side of an edge of a ferromagnetic target object feature and the second magnetoresistance element is on the other side of the same edge.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
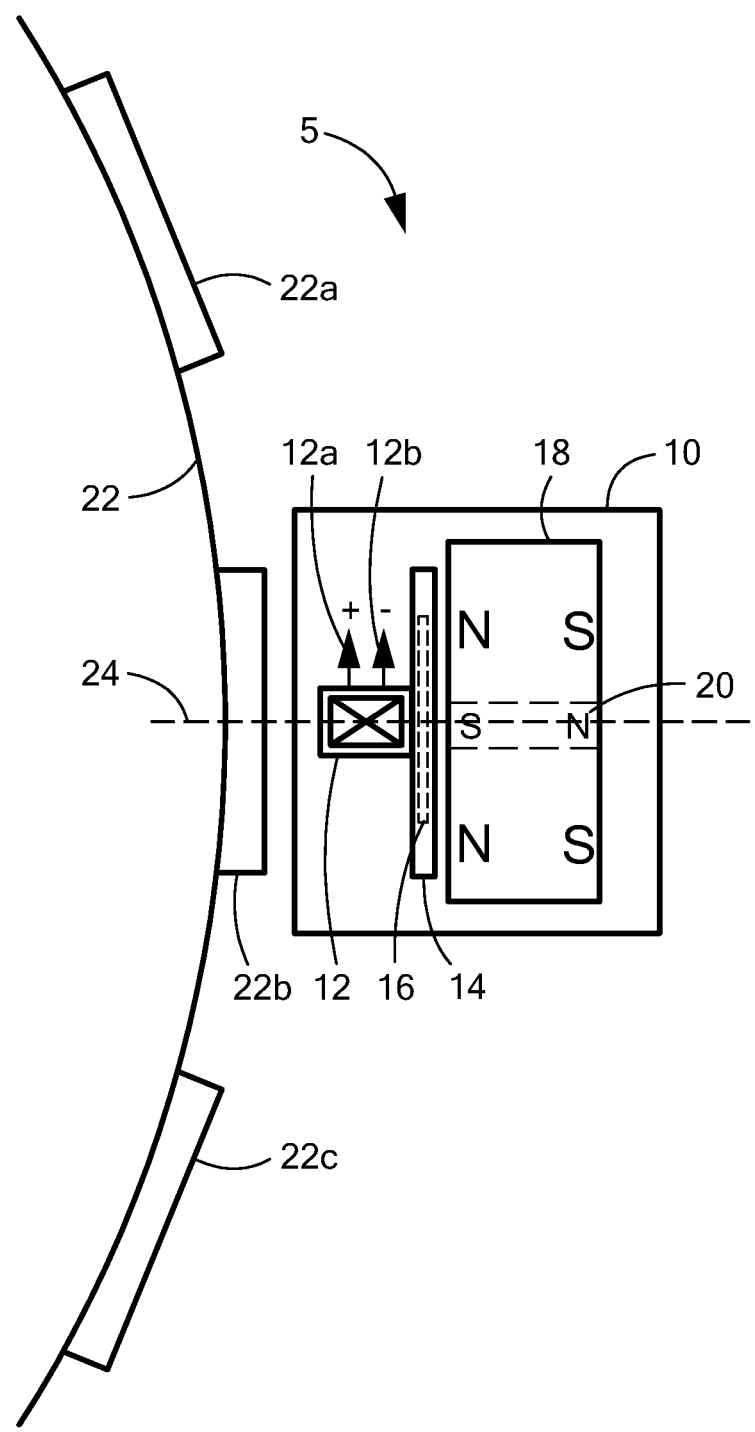
FIG. 1 is a block diagram of a prior art magnetic field sensor having a magnetic field sensing element, an electronic circuit, and a magnet.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Examples below describe a particular gear (or a particular ring magnet) as may be used upon an engine camshaft ferromagnetic target object. However, similar circuits and techniques can be used with other cams or gears or ring magnet disposed upon the engine camshaft, or upon other rotating parts of an engine (e.g., crank shaft, transmission gear, anti-lock braking system (ABS), or upon rotating parts of a device that is not an engine. Other applications may include linear translation sensors or other sensors where the target is not a rotating gear.

The gear (or target) or the ring magnet is not a part of the magnetic field sensors described below. The gear can have ferromagnetic gear teeth, which are generally soft ferromagnetic objects, but which can also be hard ferromagnetic objects, patterns, or domains which may or may not have actual physical changes in their shape.

Also, while examples are shown below of magnetic field sensors that can sense ferromagnetic gear teeth or gear teeth edges upon a gear configured to rotate, the magnetic field sensors can be used in other applications. The other applications include, but are not limited to, sensing ferromagnetic objects upon a structure configured to move linearly.

As used herein, the term "baseline" and the phrase "baseline level" are used to describe a lowest magnitude (which may be near zero or may be some other magnetic field) of a magnetic field experienced by a magnetic field sensing element within a magnetic field sensor when the magnetic field sensor is operating in a system. In some systems, this lowest magnetic field occurs when a magnetic field sensor is proximate to a gear valley as opposed to a gear tooth.

It will be understood that, in general, a difference between the baseline level and a higher level achieved, for example, when a gear tooth is proximate to a magnetic field sensor, is related to an ability of the magnetic field sensor to differentiate between a gear tooth and a valley, and thus, related to accuracy of the magnetic field sensor.

While it is described above that a baseline level is generated when a magnetic field sensor is proximate to a gear valley and a higher level is achieved when the magnetic field sensor is proximate to a gear tooth, other physical arrangements are also possible, for example, a reverse arrangement for which a baseline level is generated when a magnetic field sensor is proximate to a gear tooth and a higher level is achieved when the magnetic field sensor is proximate to a gear valley.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

It should be understood that electronic functions that may be described below to be analog functions can instead be implemented in digital circuits, in processors, or in modules. For example, it will be recognized that a comparator can be implemented as an analog comparator that compares analog voltages, as a digital comparator that compares digital values, or as a processor or module that compares digital values. Examples shown herein to be analog examples do not limit the scope of described embodiments to be analog embodiments only.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe and electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

In some embodiments, the term "magnetic field sensing element" and the term "magnetoresistance element" are used to describe one magnetic field sensing element and one magnetoresistance element, respectively. However, it should be understood that, in some embodiments, the term "magnetic field sensing element" and the term "magnetoresistance element" can be used to describe more than one physical semiconductor structure (for example, more than one magnetoresistance element yoke) coupled together in such a way as to generate one signal responsive to a magnetic field. Thus, individual magnetoresistance elements shown in figures below can instead each be comprised of more than one magnetoresistance element.

Referring to FIG. 1, an example of a magnetic field sensor 10 is responsive to a gear 22 having ferromagnetic gear teeth, e.g., gear teeth 22a, 22b, 22c. It should be recognized that the gear 22 is but one type of "ferromagnetic target object" or simply "target" which the magnetic field sensor 10 can be responsive.

The magnetic field sensor 10 includes a magnetic field sensing element 12 coupled to an electronic circuit 16. The magnetic field sensing element 12 and the electronic circuit 16 can be disposed upon (i.e., integrated within or upon) a substrate 14. For clarity, here the magnetic field sensing element 12 is shown to be a Hall element with an exaggerated size, and rotated out of the plane of the substrate 14. Furthermore, for clarity, the Hall element 12 is shown to be on top of the substrate 14, but it will be appreciated that Hall elements are usually disposed upon or within a surface of a substrate of an integrated circuit.

The magnetic field sensor 10 can also include a magnet 18 (e.g. a permanent magnet or hard ferromagnetic material). The magnet 18 is configured to generate a magnetic field, which is generally directed along an axis 24 at the position of the magnetic field sensing element 12, and which is subject to direction and amplitude changes depending upon positions of the gear teeth 22a, 22b, 22c relative to the magnetic field sensor 10. However, the structure of the magnetic field at faces of the magnet 18 can be more complex due to a core 20.

The electronic circuit 16 is configured to generate an output signal (not shown). The output signal, when the gear is not moving, is indicative of whether the magnetic field sensor 10 is over a gear tooth or a gear valley. Thus, the magnetic field sensor 10 is sometimes referred to as a "tooth detector" as opposed to an "edge detector." The output signal, when the gear is rotating, has an edge rate or a frequency indicative of a speed of rotation of the gear. Edges or transitions of states of the output signal can be used to identify positions of edges of the gear teeth as they pass by the magnetic field sensor.

The magnet 18 can include the central core 20 comprised of a soft ferromagnetic material disposed within the magnet 18. An example of a magnet with a core is described in U.S. Pat. No. 6,278,269, entitled "Magnet Structure," issued Aug. 21, 2001, which patent is assigned to the assignee of the present invention and incorporated herein by reference in its entirety. As described in U.S. Pat. No. 6,278,269, the pole configuration provided by the magnet 18 with the core 20 lowers the base field (or baseline) of a flux density of the magnetic field at some points above the surface of the core 20 (e.g., to the left of the core as shown) when a valley of the gear 22 is proximate to the magnetic field sensor 10. A predetermined baseline (e.g., within a range of about +/six hundred Gauss) at the magnetic field sensing element 12, and a resulting differential magnetic field signal 12a, 12b (i.e., an analog differential proximity signal) near zero, can be achieved with proper design.

In contrast, when a gear tooth of the gear 22 is proximate to the magnetic field sensing element 12, the magnetic field sensing element 12 experiences a higher magnetic field and generates the differential magnetic field signal 12a, 12b with a higher value. As described above, a difference between the baseline magnetic field and the higher magnetic field is related to ultimate accuracy of the magnetic field sensor 10.

The baseline magnetic field, which can occur when the magnetic field sensor 10 is proximate to a valley in the gear 22, remains relatively low, with little change, even as the air gap between the gear 22 and the magnetic field sensor 10 varies. This advantageous result of low baseline substantially independent of air gap is achieved by operation of the core 20, which results in opposite magnetic poles being presented at the face of the core 20 (i.e., left side as shown) proximate to the magnetic field sensing element 12, particularly when the magnetic field sensing element 12 is proximate to a valley in the gear 22. This effect is also described in U.S. Pat. No. 5,781,005, issued Jul. 14, 1998, entitled "Hall-Effect Ferromagnetic-Article-Proximity Sensor," which patent is assigned to the assignee of the present invention and incorporated herein by reference in its entirety.

The above-described low baseline, which occurs when the magnetic field sensor is proximate to a gear valley, results in an enhanced ability of the electronic circuit 16 to differentiate the presence of the gear tooth from a gear valley.

The above-described low baseline also provides an ability to more easily compensate for temperature effects, since the baseline magnetic field is relatively small, and therefore, circuit variations that occur due to temperature can have less influence when the magnetic field sensor 10 is proximate to a valley in the gear 22. Essentially, any error in the circuitry is able to be well corrected near the baseline magnetic field level or range, since any multiplication of the error (near zero) is smaller. Therefore, a magnetic field threshold used to distinguish a tooth from a valley can be made smaller while maintaining precision because there is less noise or error in the system over its operating conditions such as temperature, or humidity.

The magnetic field described above and provided by the magnet 18 with the core 20 results in an improved accuracy of the magnetic field sensor 10. For example, the low baseline allows the magnetic field sensing element 12 to be somewhat statically misaligned from a center of the magnet 18, as will occur due to unit-to-unit variations of mechanical alignments, without sacrificing accuracy of the magnetic field sensor 10. Accuracy is discussed above.

Figure 1A:
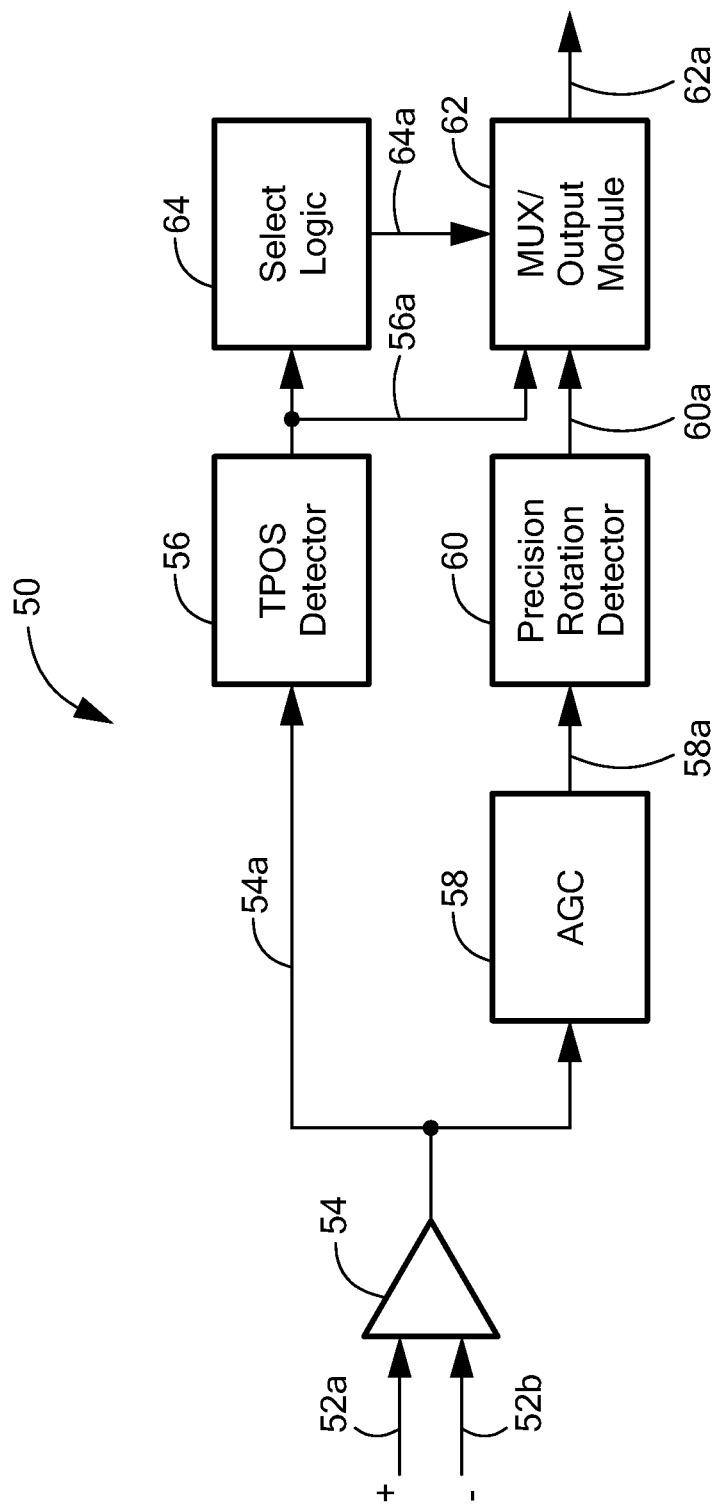
FIG. 1A is a block diagram of an example of an electronic circuit that can be used as the electronic circuit of FIG. 1.

Referring now to FIG. 1A, an example of a prior art electronic circuit 50 can be the same as or similar to electronic circuit 16 of FIG. 1. The electronic circuit 50 can include in amplifier 54 coupled to receive a differential signal 52a, 52b, which can be the same as or similar to the differential signal 12a, 12b generated by the magnetic field sensing element 12 of FIG. 1. The amplifier 54 is configured to generate an amplified signal 54a, which, in some embodiments, can split into two channels, a TPOS detector channel and a precision rotation detector channel.

In the true power on state (TPOS) channel, a TPOS detector 56 can be coupled to receive the amplified signal 54a and configured to generate a TPOS output signal 56a. In some embodiments, the TPOS detector 56 can include a comparator (not shown) configured to compare the amplified signal 54a with a fixed (and trimmed) threshold. In these embodiments, the TPOS output signal 56a can be a two-state binary signal for which a high state is indicative of a gear tooth being proximate to the magnetic field sensor 10 of FIG. 1 and a low state is indicative of a gear valley being proximate to the magnetic field sensor 10, or vice versa.

In the precision rotation detector channel, an automatic gain control (AGC) 58 can be coupled to receive the amplified signal 54a and configured to generate a gain controlled signal 58a. A precision rotation detector 60 can be coupled to receive the gain controlled signal 58a and configured to generate a precision rotation detector output signal 60a. Like the TPOS output signal 56a, the precision rotation detector output signal 60a can be a two-state binary signal for which a high state is indicative of a gear tooth being proximate to the magnetic field sensor 10 of FIG. 1 and a low state is indicative of a gear valley being proximate to the magnetic field sensor 10, or vice versa. Thus, both the TPOS detector 56 and the precision rotation detector 60 can be "tooth detectors." However, it should be understood that the precision rotation detector channel uses the AGC 58, which, when the gear 22 is not rotating, will settle to an undesirable gain, resulting, once the gear 22 starts to rotate, in a period of time during which the gain is incorrect and the precision rotation detector is not fully accurate. Even if the AGC 58 were not used, still the precision rotation detector 60 uses internal thresholds that are properly updated only when the gear 22 is rotating. However, in other embodiments, the threshold can be supplied from outside of the electronic circuit 50.

In some alternate embodiments, the precision rotation detector 60 can be an "edge detector," which is unable to identify whether the magnetic field sensor 12 is proximate to a gear tooth or a gear valley, particularly when the gear is not moving, but which is able to sense edges of gear teeth as they move past the magnetic field sensor 10.

Precision rotation detectors, e.g., the precision rotation detector 60, can have a variety of configurations. Some configurations are described in the above mentioned U.S. Pat. No. 6,525,531. However, other forms of precision rotation detectors are also known, including some that have two or more magnetic field sensing elements.

In general, from discussion above, it will be appreciated that the TPOS output signal 56a is indicative of whether the magnetic field sensing element 12 is proximate to a gear tooth or a gear valley, even when the gear, e.g., the gear 22 of FIG. 1, is stationary. However, since the TPOS detector 56 uses a fixed threshold, in some embodiments, having limited adjustment at power up, variations in the edge placement in the TPOS output signal 56a will occur due to a variety of factors, including, but not limited to, temperature variations, and variations in the air gap between the magnetic field sensing element 12 and the gear 22.

Unlike the TPOS detector 56, which uses fixed thresholds, the precision rotation detector 60 continually makes adjustments of thresholds to provide the precision rotation detector output signal 60a with better accuracy of edge placements of the precision rotation detector output signal 60a relative to physical positions of gear teeth. As described above, in part, it is these adjustments that make the precision rotation detector less accurate when it is first powered up or when the gear 22 first starts to rotate.

In some embodiments for which the TPOS detector 56 and the precision rotation detector 60 are integrated onto a common substrate, a multiplexer/output module 62 can be coupled to receive the TPOS output signal 56a and coupled to receive the precision rotation detector output signal 60a. Select logic 64 can provide a selection signal 64a, received by the multiplexer/output module 62. Depending upon the state of the selection signal 64a, the multiplexer/output module 62 is configured to generate an output signal 62a representative of a selected one of the TPOS output signal 56a or the precision rotation detector output signal 60a. The output signal 62a can be provided in a variety of signal formats, including, but not limited to, a SENT format, an I$^2$C format, a PWM format, or a two-state format native to the TPOS output signal 56a and to the precision rotation detector output signal 60a.

In some examples, the select logic 64 selects the output signal 62a to be representative of the TPOS output signal 56a for a predetermined amount of time after the gear 22 starts rotating as indicated by the TPOS output signal 56a.

Thereafter, the select logic 64 selects the output signal 62a to be representative of the precision rotation detector output signal 60a.

Figure 2:
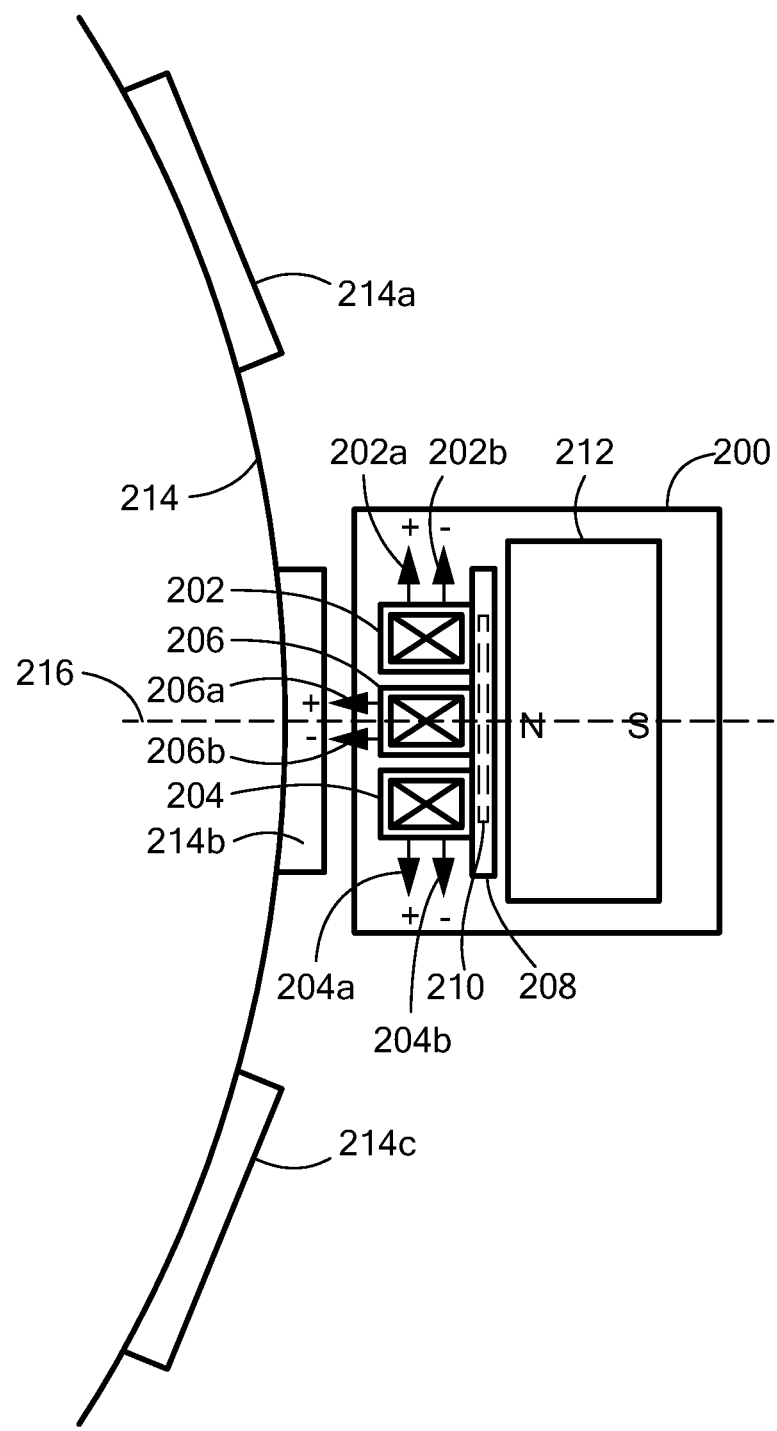
FIG. 2 is a block diagram of another prior art magnetic field sensor having three magnetic field sensing elements, an electronic circuit, and a magnet.

Referring now to FIG. 2, another example of a prior art magnetic field sensor 200 is responsive to a gear 214 having gear teeth, e.g., gear teeth 214a, 214b, 214c. The magnetic field sensor 200 includes three magnetic field sensing elements 202, 204, 206 coupled to an electronic circuit 210. In some embodiments, the magnetic field sensing elements 202, 204 are separated in a direction perpendicular to an axis 216 by a distance between about 1.5 millimeters and about 3.0 millimeters, and the magnetic field sensing element 206 is located midway between the magnetic field sensing elements 202, 204.

The three magnetic field sensing elements 202, 204, 206 and an electronic circuit 210 can be disposed upon (i.e., integrated within or upon) a substrate 208. For clarity, here the magnetic field sensing elements 202, 204, 206 are shown to be Hall elements with an exaggerated size, and rotated out of the plane of the substrate 208. Furthermore, for clarity, the Hall elements 202, 204, 206 are shown to be on top of the substrate 208, but it will be appreciated that Hall elements are usually disposed upon or within a surface of a substrate of an integrated circuit.

The magnetic field sensor 200 can also include a magnet 212. The magnet 212 is configured to generate a magnetic field, which is generally directed along an axis 216 at the position of the magnetic field sensing elements 202, 204, 206.

The electronic circuit 210 is configured to generate an output signal (not shown). An exemplary electronic circuit 210 is described below in conjunction with FIG. 2A. Let it suffice here to say that the electronic circuit generates differences of signals. Thus, it will be apparent that the magnetic field sensor 200 is an edge detector and not a tooth detector.

The output signal, when the gear 214 is rotating, is indicative speed of rotation of the gear 214 and also indicative of positions of edges of the gear teeth. The magnetic field sensor 200 is unable to provide a TPOS function, and, when the gear 214 is stationary, is unable to identify whether the magnetic field sensing elements 202, 204, 206 are proximate to a gear tooth or a valley in the gear 214.

The magnet 212 can be comprised of one uniform material, and can have no central core, which is shown and described in conjunction with FIG. 1. However, in other embodiments, the magnet 212 can have a central core the same as or similar to that shown and described in conjunction with FIG. 1.

The magnetic field sensor 200 uses the three magnetic field sensing elements 202, 204, 206 to generate a respective three differential signals 202a, 202b, and 204a, 204b, and 206a, 206b. Though the simple magnet 212 does not provide the low baseline of a magnet with a core, differences of the above differential signals result in the effect of a low baseline. In essence, when the three magnetic field sensing elements 202, 204, 206 experience the same magnetic field, a differencing of the above differential signals results in a zero electronic signal.

Figure 2A:
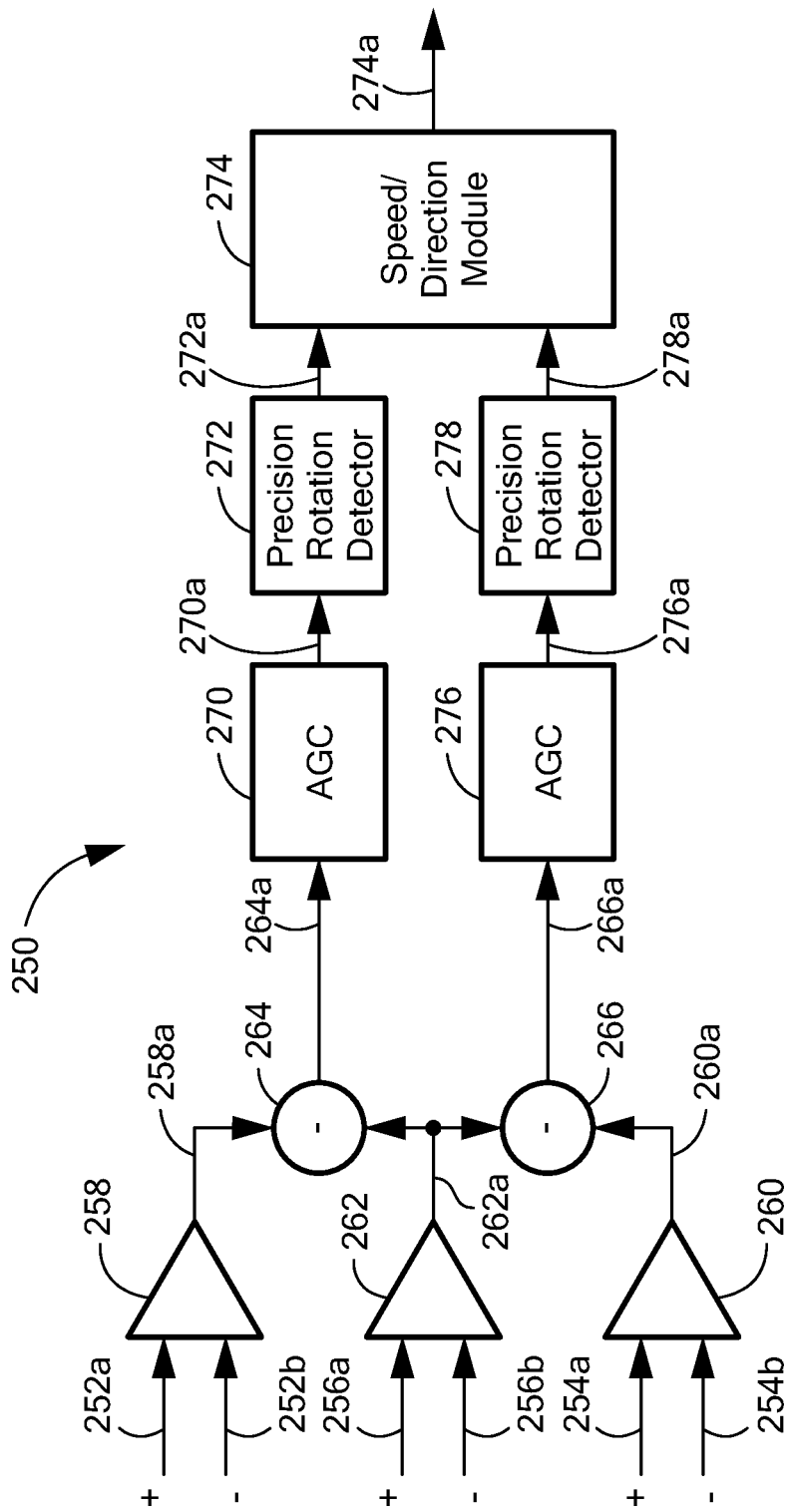
FIG. 2A is a block diagram of an example of an electronic circuit that can be used as the electronic circuit of FIG. 2.

Referring now to FIG. 2A, an example of a prior art electronic circuit 250 can be the same as or similar to electronic circuit 210 of FIG. 2. The electronic circuit 250 can include amplifiers 258, 260, 262 coupled to receive differential signals 252a, 252b, and 254a, 254b, and 256a, 256b, respectively. The differential signal 252a, 252b can be the same as or similar to the differential signal 202a, 202b, the differential signal 254a, 254b can be the same as or similar to the differential signals 204a, 204b, and the differential signal 256a, 256b can be the same as or similar to the differential signal 206a, 206b generated, respectively, by the magnetic field sensing elements 202, 204, 206 of FIG. 2. The amplifiers 258, 260, 262 are configured to generate amplified signals 258a, 260a, 262a, respectively.

The amplified signals 258a, 260a are received by a first differencing module 264, which is configured to generate a first difference signal 264a. The amplified signals 260a, 262a are received by a second differencing module 266, which is configured to generate a second difference signal 266a.

The electronic circuit 250 includes two precision rotation detector channels, described above in conjunction with FIG. 1A. A AGCs 270, 276 can be the same as or similar to the AGC 56 of FIG. 1A. Precisions rotation detectors 272, 278 can be the same as or similar to the precision rotation detector 60 of FIG. 1A. The precision rotation detector 272 can generate a precision rotation detector output signal 272a and the precision rotation detector 278 can generate a precision rotation detector output signal 278a. The precision rotation detector output signals 272a, 278a can be the same as or similar to the precision rotation detector output signal 60a of FIG. 1A.

A speed and direction module 274 can be coupled to receive the precision rotation detector output signals 272a, 278a.

It should be apparent that the precision rotation detector output signals 272a, 278a are at relative phases that are determined by a direction of rotation of the gear 214. It should also be apparent that the state transition rates of the precision rotation detector output signals 272a, 278a are representative of a speed of rotation of the gear 214.

The speed and direction module is configured to generate an output signal that can be representative of at least one of the speed of rotation or a direction of rotation of the gear 214. In some embodiments, the output signal 62a is representative of both the speed of rotation and the direction of rotation.

Figure 3:
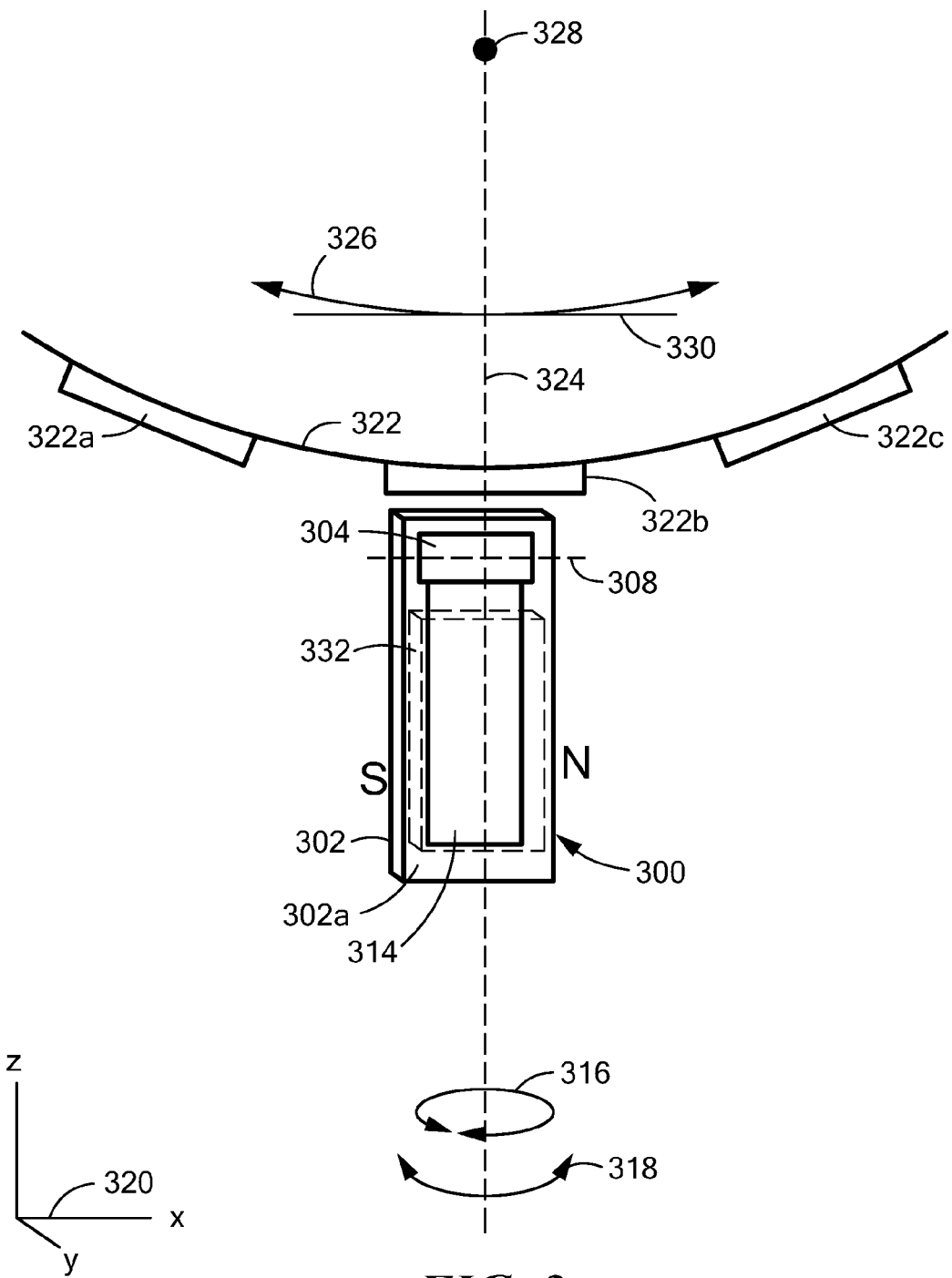
FIG. 3 is a block diagram showing an example of a magnetic field sensor having magnetic field sensing elements and an electronic circuit both disposed on a substrate, and also having a magnet, the magnetic field sensor dispose proximate to a ferromagnetic object in the form of a ferromagnetic gear.

Referring now to FIG. 3, a magnetic field sensor 300 is responsive to a gear 322 having gear teeth, e.g., gear teeth 322a, 322b, 322c. The gear 322 can be a ferromagnetic gear, i.e., a ferromagnetic target object having ferromagnetic teeth, also ferromagnetic objects, and referred to herein as target features. The magnetic field sensor 300 can include a substrate 302 with a major surface 302a.

The magnetic field sensor 300 can include magnetic field sensing elements 304 disposed on the major surface 302a of the substrate 302. Further details of the magnetic field sensing elements 304 are described below. However, let is suffice here to say that the magnetic field sensing elements 304 can include at least two magnetoresistance elements.

The magnetic field sensing elements 304 can be coupled to or within an electronic circuit 314 also disposed on the major surface 302a of the substrate 302.

The magnetic field sensor 300 can also include a magnet 332. The magnet 332 is configured to generate a magnetic field, which is generally directed along an axis 308 at the position of the magnetic field sensing elements 304, and is generally parallel to the major surface 302a of the substrate 302.

The magnetic field sensing elements 304 have respective maximum response axes parallel to the major surface 302a of the substrate 302. In some embodiments, the maximum response axes are parallel to each other. In some embodiments, the maximum response axes are substantially parallel to the axis 308. In other embodiments, the maximum response axes are substantially perpendicular to the axis 308.

A line perpendicular to the major surface 302a of the substrate (i.e., into the page) intersects the magnet 332 and does not intersect the gear 322. Furthermore, in some embodiments, the magnetic field sensing elements 304 are disposed at positions such that an axis (e.g., 308) between (i.e., passing through) the magnetic field sensing elements 304 does not intersect the gear 322. In some embodiments, the axis (e.g., 308) between (i.e., passing through) the magnetic field sensing elements 304 is substantially parallel to a tangent 330 to a direction of movement, e.g., 326, of the gear 322.

In the embodiment shown, a line between north (N) and south (S) poles of the magnet 332 is substantially parallel to the major surface 302a of the substrate 302, and is substantially parallel to the axis (e.g., 308) between (i.e., passing through) the two magnetic field sensing elements 304, 306. In some embodiments, the line between the north and south poles of the magnet 332 does not intersect the gear 322 and is not in a direction toward the gear 322.

The electronic circuit 314 is configured to generate an output signal (not shown). An exemplary electronic circuit 314 is described below in conjunction with FIG. 26. Let it suffice here to say that the electronic circuit 314 generates a difference of signals and a sum of signals. Thus, it will become apparent that the magnetic field sensor 300 is both an edge detector and a tooth detector.

The output signal, when the gear 322 is rotating, is indicative of a speed of rotation of the gear 322 and also indicative of positions of edges of the gear teeth. The magnetic field sensor 300 is able to provide a tooth detecting (e.g., TPOS) function, and, when the gear 322 is stationary, is able to identify whether the magnetic field sensing elements 304 are proximate to a gear tooth or a valley in the gear 322.

The magnet 332 can be comprised of one uniform material, and can have no central core, which is shown and described in conjunction with FIG. 1. However, in other embodiments, the magnet 332 can have a central core the same as or similar to that shown and described in conjunction with FIG. 1. Such core can have an axis aligned with an axis 324.

The magnetic field sensor 300 can be rotated in a direction 316 to a next position three hundred and sixty degrees apart from the position shown, with no degradation of performance. However, intermediate rotations may result in a degradation of performance.

The magnetic field sensor 300 can be rotated in a direction of and arrow 318 with a center of rotation anywhere along a line 324, through approximately +/−twenty degrees, without substantial degradation of performance.

In some embodiments, the magnetic field sensing elements 304 are magnetoresistance elements.

Figure 4:
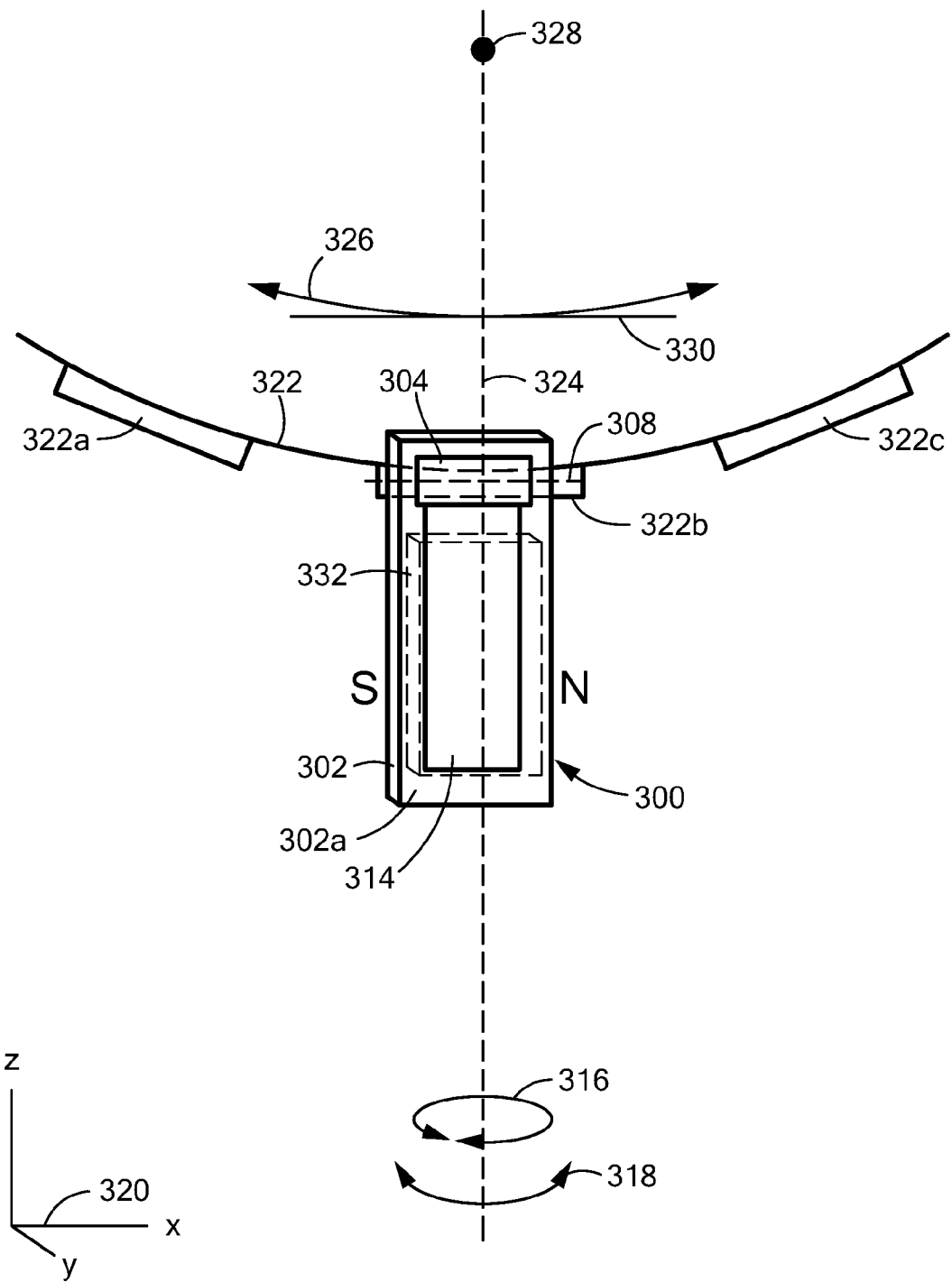
FIG. 4 is a block diagram showing an example of the magnetic field sensor of FIG. 3 disposed to overlap the ferromagnetic object.

Referring now to FIG. 4, in which like elements of FIG. 3 are shown having like reference designations, the magnetic field sensor 300 is shown in an arrangement wherein the substrate 302, and the magnetic field sensing elements 304 thereon, overlap the gear 322. A line perpendicular to the surface 302a of the substrate and passing through the magnetic field sensing elements 304 intersects the gear 322.

Figure 5:
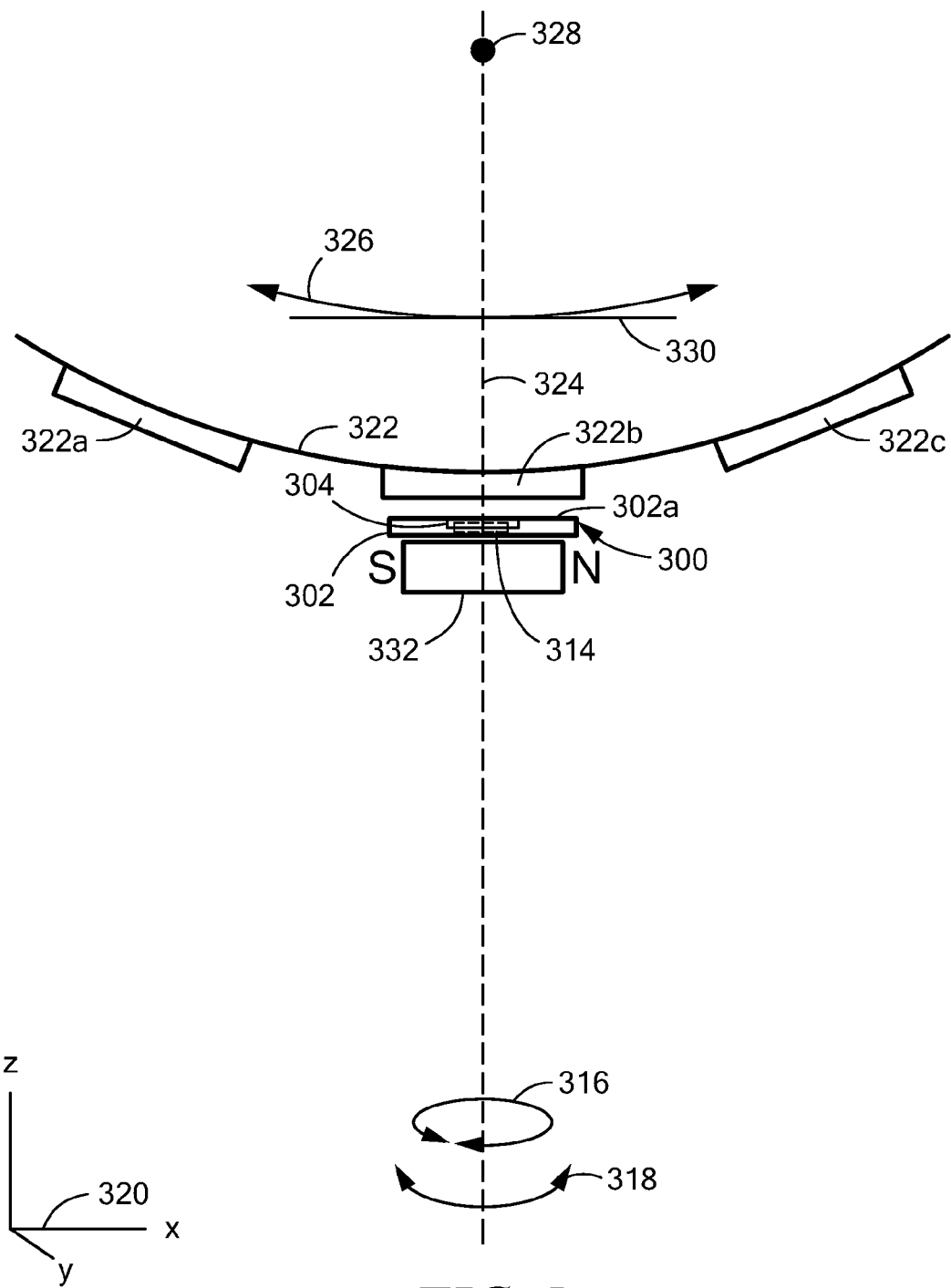
FIG. 5 is a block diagram showing an example of the magnetic field sensor of FIG. 3 disposed proximate to the ferromagnetic object but with a different orientation.

Referring now to FIG. 5, in which like elements of FIG. 3 are shown having like reference designations, the magnetic field sensor 300 is shown in an arrangement rotated about the x-axis ninety degrees outward from the page or ninety degrees into the page as compared to the arrangement shown in FIG. 3. The magnetic field sensing elements 304 remain disposed proximate to the gear 322.

Figure 6:
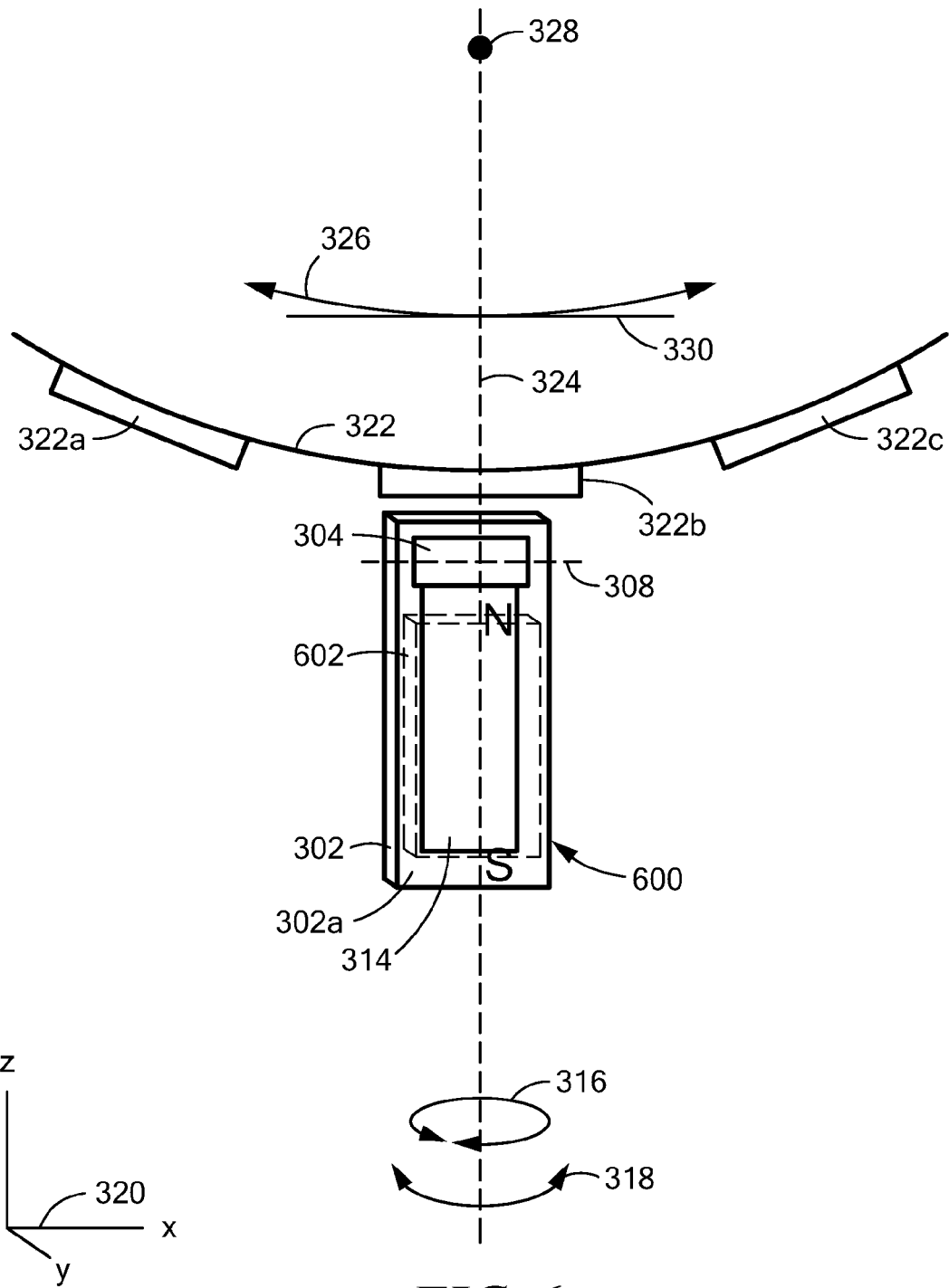
FIG. 6 is a block diagram showing another example of a magnetic field sensor having magnetic field sensing elements and an electronic circuit both disposed on a substrate, and also having a different magnet, the magnetic field sensor dispose proximate to the ferromagnetic object.

Referring now to FIG. 6, in which like elements of FIG. 3 are shown having like reference designations, a magnetic field sensor 600 is like the magnetic field sensor 300 of FIG. 3, but the magnetic field sensor 600 has a different magnet 602. The magnetic field sensor 600 has the different magnet 602 for which a line between north (N) and south (S) poles of the magnet 602 is substantially parallel to the major surface 302a of the substrate 302, but substantially perpendicular to the axis (e.g., 308) between (i.e., passing through) the magnetic field sensing elements. In some embodiments, the line between the north and south poles of the magnet 602 is in a direction toward the gear 322.

In some embodiments, the magnet 602 is a simple magnet without a core, such core described above in conjunction with FIG. 1. In other embodiments, the magnet 602 has a core with an axis along the line 324.

Magnetic field sensors shown and described above are shown to sense a movement of ferromagnetic target object in the form of a gear or cam. However, FIGS. 7-9 described below show the same or similar magnetic field sensors for sensing movement of a ring magnet. Comments made above about edge detectors, tooth detectors, and TPOS functions apply in a similar way when sensing a ring magnet.

Figure 7:
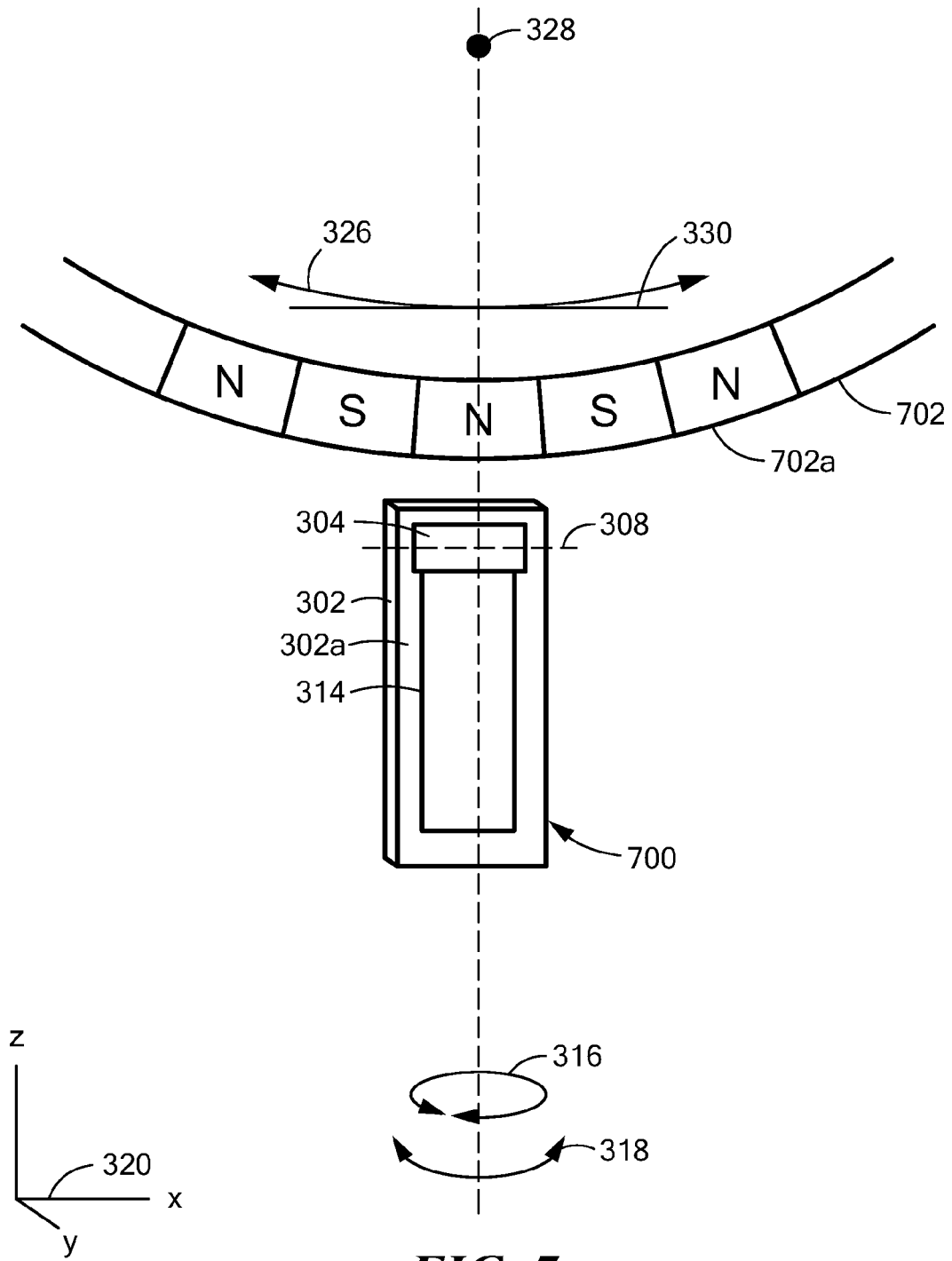
FIG. 7 is a block diagram showing another example of a magnetic field sensor having magnetic field sensing elements and an electronic circuit both disposed on a substrate, having no magnet, the magnetic field sensor dispose proximate to a different ferromagnetic object in the form of a ring magnet.

Referring now to FIG. 7, in which like elements of FIG. 3-6 are shown having like reference designations, a magnetic field sensor 700 is like the magnetic field sensor 300 of FIG. 3. However, the magnetic field sensor 700 has no internal magnet. Instead, the magnetic field sensor 700 is responsive to passing magnetic domains, e.g., 702a, of a ring magnet 702.

In some embodiments, the magnetic domains of the ring magnet 702 are polarized parallel to the page. In some other embodiments, the magnetic domains of the ring magnet 702 are polarized perpendicular to the page.

Figure 8:
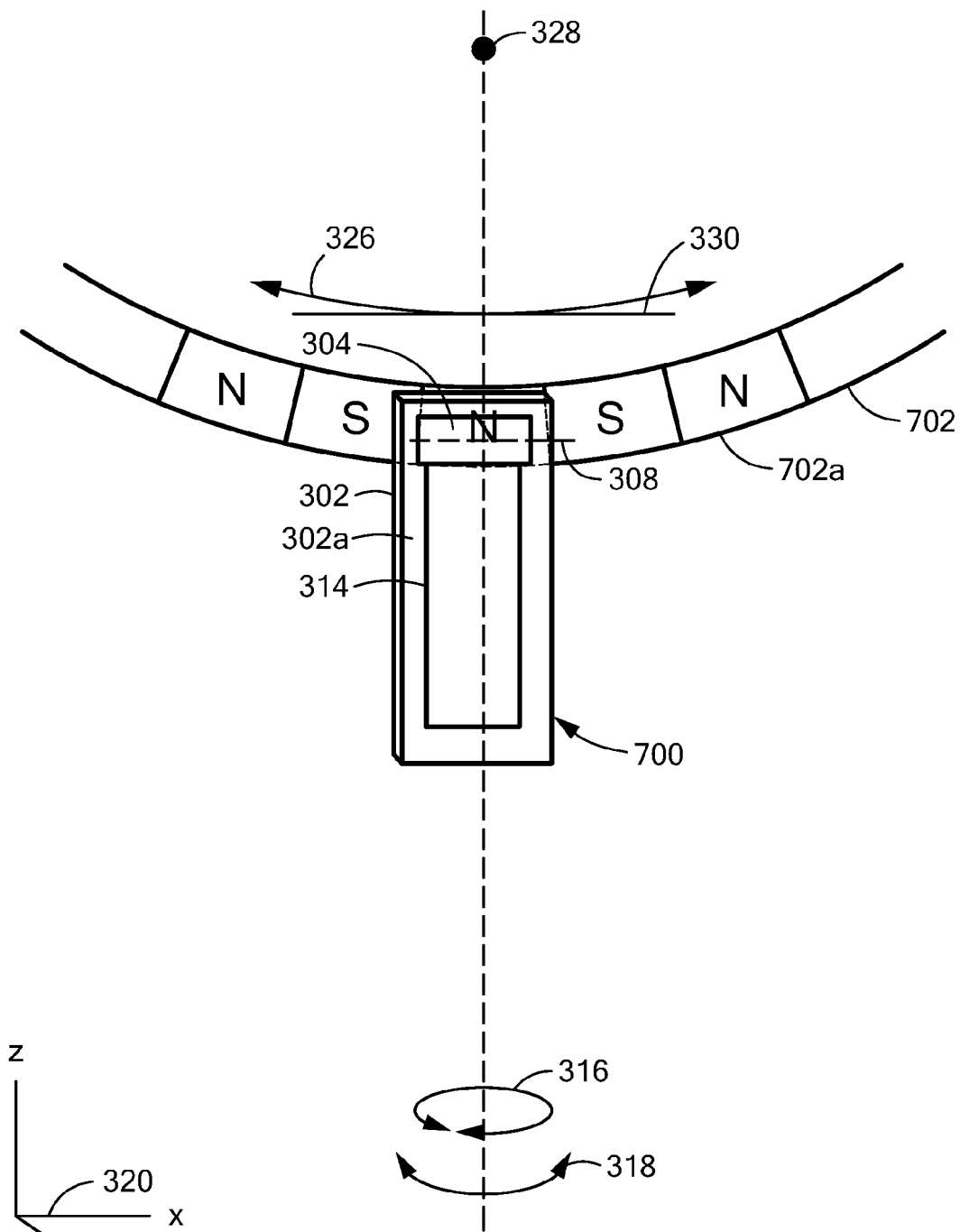
FIG. 8 is a block diagram showing an example of the magnetic field sensor of FIG. 7 disposed to overlap the ferromagnetic object.

Referring now to FIG. 8, in which like elements of FIG. 3-7 are shown having like reference designations, the magnetic field sensor 700 is shown in an arrangement wherein the substrate 302, and the magnetic field sensing elements 304 thereon, overlap the ring magnet 702. It should be apparent that the magnetic fields sensor 700 could be rotated one hundred eighty degrees about the y-axis such that the magnetic field sensing elements 304 still overlap the magnetic domains, e.g., 702a, of the ring magnet 702. A line perpendicular to the surface 302a of the substrate 302 and passing through the magnetic field sensing elements 304 intersects the ring magnet 702.

Figure 9:
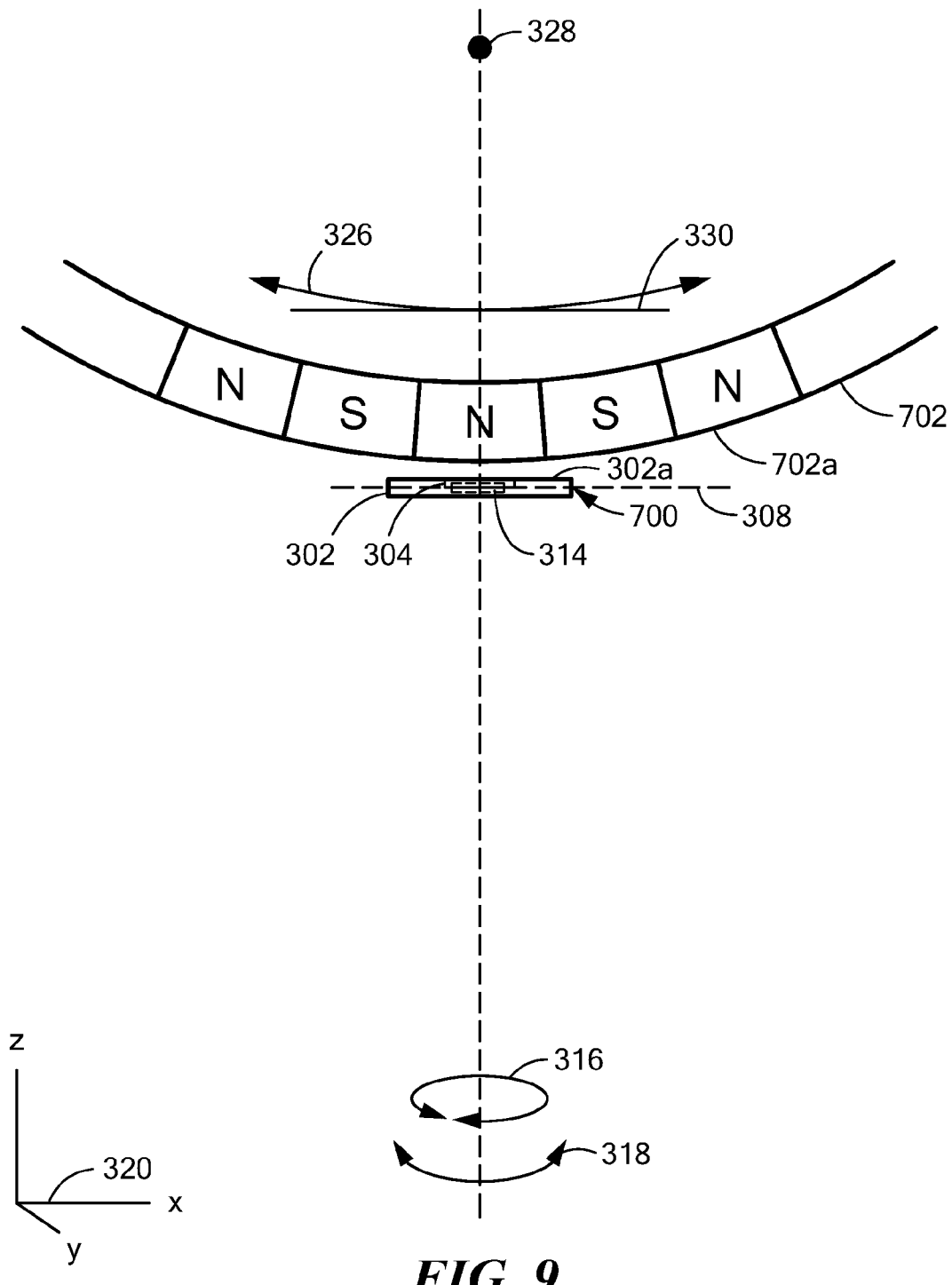
FIG. 9 is a block diagram showing an example of the magnetic field sensor of FIG. 7 disposed proximate to the ferromagnetic object but with a different orientation.

Referring now to FIG. 9, in which like elements of FIGS. 3-8 are shown having like reference designations, the magnetic field sensor 700 is shown in an arrangement rotated about the x-axis ninety degrees outward from the page or ninety degrees into the page as compared to the arrangement shown in FIG. 5. The magnetic field sensing elements 304 remained disposed proximate to the ring magnet 702.

In figures below, designations A, B, C, D, A1, A2, B1, B2, C1, C2, D1, D2, P1, P2, P3, P4 are shown to designate magnetoresistance elements. It should be understood that these designations indicate a logical relationship between similar designations in similar figures. However, these designations do not indicate that a magnetoresistance element so designated in one figure is the same magnetoresistance element as one with the same designation in other figures.

Similarly, in figures below, designations V1, V2 are shown to designate two signals. It should be understood that these designations indicate a logical relationship between similar designations in similar figures. However, these designations do not indicate that a signal so designated in one figure is the same signal as one with the same designation in other figures.

Similarly, in figures below, designations R1, R2 are shown to designate two fixed resistors. It should be understood that these designations indicate a logical relationship between similar designations in similar figures. However, these designations do not indicate that a resistor so designated in one figure is the same resistor as one with the same designation in other figures.

Figure 10:
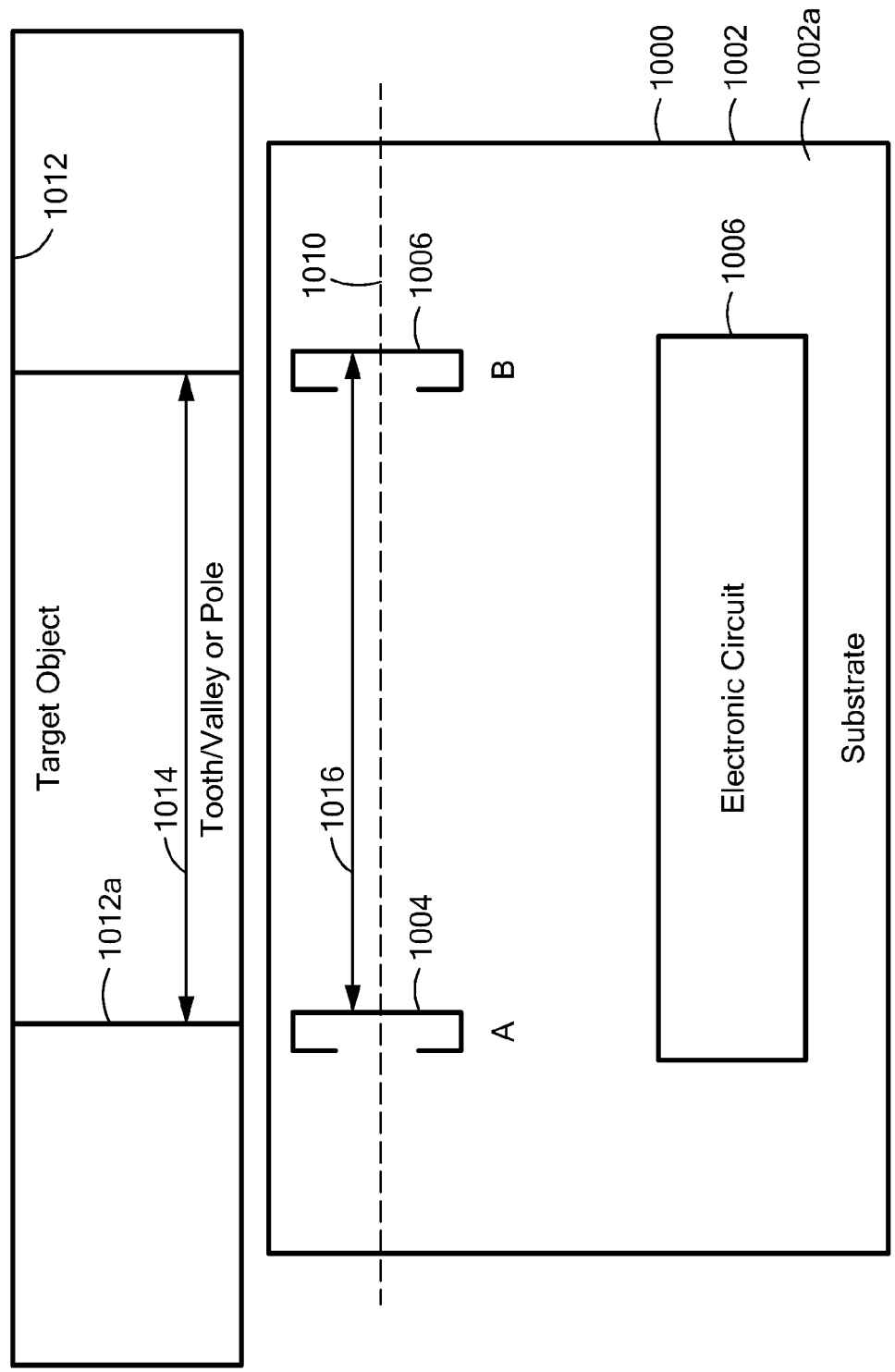
FIG. 10 is a block diagram showing two magnetoresistance elements and an electronic circuit disposed upon a substrate, which can be representative of any of the above magnetic field sensing elements of FIGS. 3-9, all disposed proximate to a ferromagnetic object.

Referring now to FIG. 10, a magnetic field sensor 1000 can include a substrate 1002 having a surface 1002a, which is one of two parallel major surfaces of the substrate 1002.

Two magnetoresistance elements 1004, 1006 (also referred to herein as magnetoresistance elements A and B) can be disposed upon the surface 1002a along an axis 1010. The two magnetoresistance elements 1004, 1006 (A, B) can be part of or coupled to an electronic circuit 1008, which is also disposed upon or within the surface 1002a of the substrate 1002. The two magnetoresistance elements 1004, 1006 (A, B) can be the same as or similar to the magnetic field sensing elements 304 of FIGS. 3-9. The axis 1010 can be parallel to the axis 308 of FIGS. 3-9.

Magnetoresistance elements, e.g., 1004, 1006 (A, B), are shown in all embodiments herein to be in the form of so-called "yokes," which have a C-shape (or a reverse C-shape). In some embodiments, the yokes can have longest yoke axes substantially perpendicular to the axis 1010. Advantages of yoke shapes are known. It will be understood that other magnetoresistance elements used in embodiments herein can have other shapes, for example, lines, polylines, or rectangles.

Maximum response axes of the magnetoresistance elements 1004, 1006 (A, B) can be parallel to and along the axis 1010 and in the same direction. It should be understood that the magnetoresistance elements 1004, 1006 (A, B) having maximum response axes parallel to the axis 1010 are also responsive to magnetic fields at other angles in the plane of the substrate 1002 (and also out of the plane of the substrate 1002). The degree to which the magnetoresistance elements 1004, 1006 (A, B) are responsive to magnetic fields at other angles not parallel to the axis 1010 (and not perpendicular to the longest yoke axes) is determined by a magnitude of a geometric projection of the magnetic field at the other angle onto the axis 1010. Thus, the term "projected magnetic field" is used below to describe this projection.

In some other embodiments, where the yoke shapes of the magnetoresistance elements 1004, 1006 may be rotated so that the longest yokes axes are not perpendicular to the axis 1010, the degree to which the magnetoresistance elements 1004, 1006 (A, B) are responsive to magnetic fields at other angles not parallel to the axis 1010 is determined by a magnitude of a geometric projection of the magnetic field at the other angle onto an axis that is perpendicular to the longest axes of the yoke shapes. This is also referred to herein as a projected magnetic field.

The magnetic field sensor 1000 is responsive to movement of a ferromagnetic target object 1012 having features, e.g., 1012a, with width 1014. The ferromagnetic target object 1012 can be the same as or similar to the gear 322 of FIGS. 3-6 or the ring magnet 702 of FIGS. 7-9. The features, e.g., 1012a, can be the same as or similar to the gear teeth, e.g., 322a, of FIGS. 3-6 or the magnetic regions, e.g., 702a, of the ring magnet 702 of FIGS. 7-9.

The magnetic field sensor 1000 can be the same as or similar to the magnetic field sensor 300 of FIGS. 3-5, the magnetic field sensor 600 of FIG. 6, and the magnetic field sensor 700 of FIGS. 7-9. However, the magnetic field sensor 1000 is not shown in the rotated position described above in conjunction with FIGS. 5 and 9. Nevertheless the magnetic field sensor 1000 can be rotated into or out of the page in the same way.

In some embodiments, the two magnetoresistance elements 1004, 1006 (A, B) have a separation 1016 between about one half and about one and one half of the width 1014 of the target feature 1012a, for example, a gear tooth of a ferromagnetic gear or a magnetic domain of a ferromagnetic ring magnet. In some other embodiments, the two magnetoresistance elements 1004, 1006 (A, B) have a separation 1016 between about one half and about twice the width 1014 of the target feature 1012a. However, in other embodiments, the separation 1016 is much smaller than half of the width 1014, for example, one one hundredth of the width 1014, or larger than twice the width 1014.

In some embodiments used in examples below, the separation 1016 is about equal to the width 1014 of the target feature 1012a, for example, a gear tooth of a ferromagnetic gear or a magnetic domain of a ferromagnetic ring magnet.

In operation, the two magnetoresistance elements 1004, 1006 (A, B) can generate two output signals. Figures shown and described below are representative of a variety of ways in which the two magnetic field sensing elements 1004, 1006 can generate two output signals.

Using as an example the target feature 1012a with a width 1014 equal to the spacing 1016 between the two magnetoresistance elements 1004, 1006, when the target feature 1012a is centered about (i.e., between) the two magnetoresistance elements 1004, 1006 (A, B), it can be shown that any magnetoresistance element(s) (e.g., 1004 (A)) on one side of a center of the target feature 1012a experience a projected magnetic field pointed in one direction along the axis 1010, and any magnetoresistance element(s) (e.g., 1006 (B)) on the other side of the center of the target feature 1012a experience a projected magnetic field pointed in the other direction.

Therefore, when the target feature 1012a is centered about the two magnetoresistance elements 1004, 1006, any magnetoresistance element(s) (e.g., 1004 (A)) on one side of the center of the target feature 1012a changes resistance in one direction, and any magnetoresistance element(s) (e.g., 1006 (B)) on the other side of the center of the target feature 1012a changes resistance in the other direction.

In contrast, when an edge of the target feature 1012a is centered about (i.e., between) the two magnetoresistance elements 1004, 1006 (A, B), it can be shown that the two magnetoresistance elements 1004, 1006 (A, B) experience projected magnetic fields pointed in the same direction along the axis 1010. Thus, resistance of both of the two magnetoresistance elements 1004, 1006 (A, B) change in the same direction.

While a magnet like the magnet 332 of FIG. 3 is not shown, it should be understood that in some embodiments, the magnetic field sensor 1000 can include a magnet.

Figure 11:
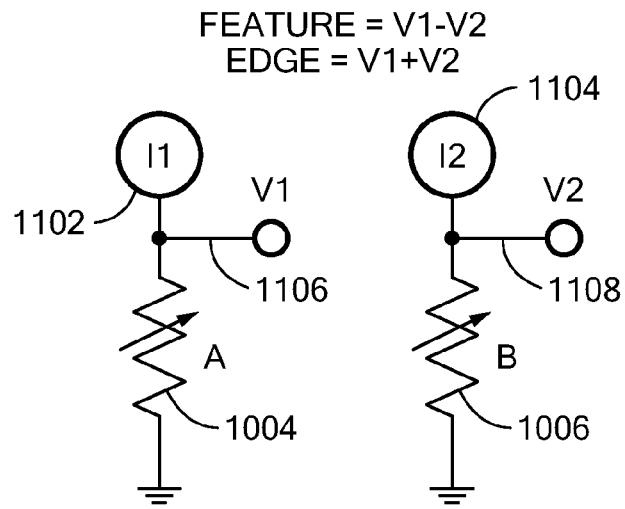
FIG. 11 is a block diagram of two magnetoresistance elements, which can be used as the magnetic field sensing elements of any of the above magnetic field sensing elements of FIGS. 3-9 and which can be used as the two magnetoresistance elements of FIG. 10.

Referring now to FIG. 11, in which like elements of FIG. 10 are shown having like reference designations, the two magnetoresistance elements 1004, 1006 (A, B), are coupled between a respective current sources 1102, 1104 and ground. Two output signals 1106=V1 and 1108=V2 result. Designations V1 and V2 are used below for clarity as described above.

Processing of the two output signals V1, V2 is described more fully below in conjunction with FIG. 26. However, let it suffice here to say that, with this arrangement, when the target feature 1012a of FIG. 10 is centered with the two magnetoresistance elements 1004, 1006 (A, B), a difference V1–V2 of the two output signals V1, V2 has a maximum (positive or negative) instantaneous value. As described above, the target feature 1012a can be a tooth, e.g., 322a, (or alternatively, a valley) of the gear 322 of FIG. 3, or a magnetic domain, e.g. 702a, (north, or alternatively, south) of the ring magnet 702 of FIG. 7. Thus, the difference V1–V2 is representative of a proximity of a tooth or proximity of a magnetic domain, and is, therefore, representative of a "feature" of the ferromagnetic target object.

In contrast, when the two magnetoresistance elements 1004, 1006 (A, B) are on opposite sides an edge 1012a of the target feature 1012a of FIG. 10, a sum V1+V2 of the two output signals V1, V2 has a maximum (positive or negative) instantaneous value. Thus, the sum V1+V2 is representative of a proximity of an edge, and is, therefore, representative of an "edge" of the ferromagnetic target object.

A magnetic field sensor using both the difference V1–V2 of the two signals V1, V2 and also the sum V1+V2 of the two signals V1, V2 can operate both as a tooth detector and a an edge detector, respectively. In some embodiments, the tooth detector capability allows a magnetic field sensor using the two magnetoresistance elements 1004, 1006, coupled as shown, to operate with a true-power-on-state (TPOS) function.

As described below in conjunction with FIGS. 27 and 28, the two signals V1, V2 here and in figures below can be used to determine both speed and direction of a moving ferromagnetic object. It will also become apparent from discussion below that the sum V1+V2 of the two signals is ninety degrees apart from the difference V1–V2 of the two signals.

Figure 12:
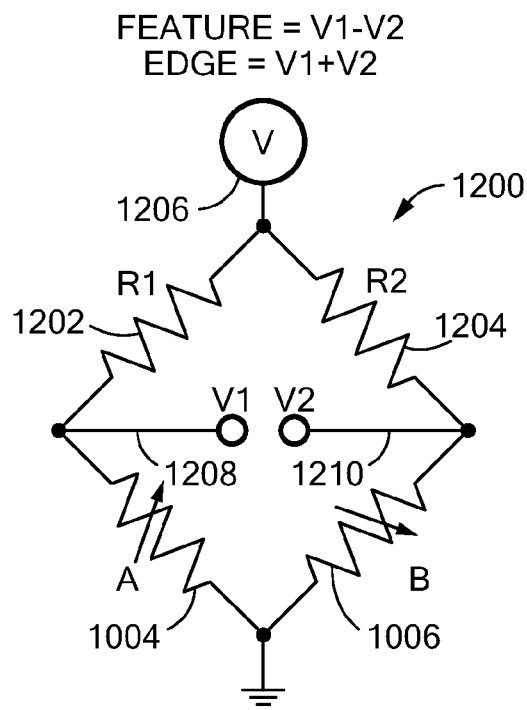
FIG. 12 is a schematic diagram showing an example of two magnetoresistance elements arranged in a bridge, where the two magnetoresistance elements can be used as any of the magnetic field sensing elements of FIGS. 3-9 and as the two magnetoresistance elements of FIGS. 10-11.

Referring now to FIG. 12, in which like elements of FIG. 10 are shown having like reference designations, the two magnetoresistance elements 1004, 1006 (A, B) are coupled in a bridge arrangement 1200 with fixed resistors 1202, 1204, also referred to herein as resistors R1, R2. In some embodiments, the fixed resistors 1202, 1204 (R1, R2) can be magnetically insensitive elements (or less sensitive elements) having some layers like a magnetoresistance element, as described, for example, in U.S. Pat. No. 7,777,607, issued Aug. 17, 2010, assigned to the assignee of the present application, and incorporated by reference herein in its entirety. Such magnetically insensitive elements tend to have a temperature coefficient the same as that of the two magnetoresistance elements 1104, 1106 (A, B), and thus, the bridge 1200 can be substantially insensitive to temperature variations.

The bridge 1200 can be powered by a voltage source 1206. Two output signals 1208=V1, 1210=V2 result. Designations V1 and V2 are used below for clarity as discussed above.

Often, for a bridge arrangement, the two output signals V1, V2 are treated as one differential signal V1, V2. Here, however, the two output signals V1, V2 are treated separately.

Processing of the two output signals V1, V2 is described more fully below in conjunction with FIG. 26. However, let it suffice here to say that, with this arrangement, when the target feature 1012a of FIG. 10 is centered with the two magnetoresistance elements 1004, 1006 (A, B), a difference V1–V2 of the two output signals V1, V2 has a maximum (positive or negative) instantaneous value. As described above, the target feature 1012a can be a tooth, e.g., 322a, (or alternatively, a valley) of the gear 322 of FIG. 3, or a magnetic domain, e.g. 702a, (north, or alternatively, south) of the ring magnet 702 of FIG. 7. Thus, the difference V1–V2 is representative of a proximity of a tooth or proximity of a magnetic domain, and is, therefore, representative of a "feature" of the ferromagnetic target object.

In contrast, when the two magnetoresistance elements 1004, 1006 (A, B) are on opposite sides an edge 1012a of the target feature 1012a of FIG. 10, a sum V1+V2 of the two output signals V1, V2 has a maximum (positive or negative) instantaneous value. Thus, the sum V1+V2 is representative of a proximity of an edge, and is, therefore, representative of an "edge" of the ferromagnetic target object.

A magnetic field sensor using both the difference V1–V2 of the two signals V1, V2 and also the sum V1+V2 of the two signals V1, V2 can operate both as a tooth detector and a an edge detector, respectively. In some embodiments, the tooth detector capability allows a magnetic field sensor using the two magnetoresistance elements 1004, 1006 (A, B), coupled as shown, to operate with a true-power-on-state (TPOS) function.

Figure 13:
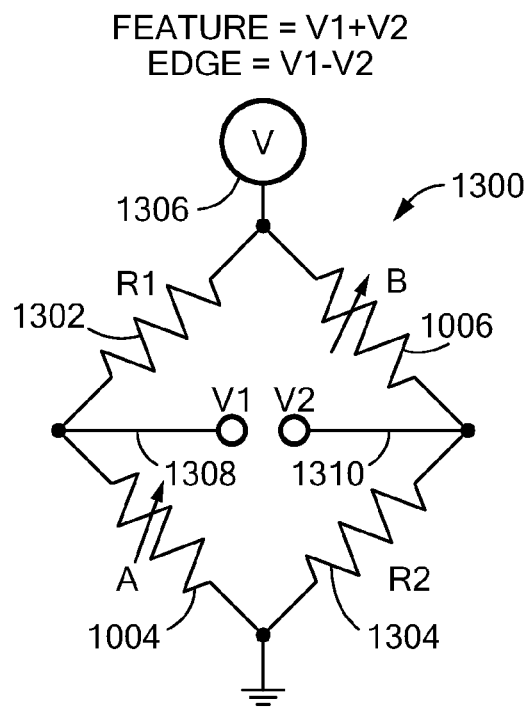
FIG. 13 is a schematic diagram showing another example of two magnetoresistance elements arranged in a bridge, where the two magnetoresistance elements can be used as any of the magnetic field sensing elements of FIGS. 3-9 and as the two magnetoresistance elements of FIGS. 10-11.

Referring now to FIG. 13, in which like elements of FIG. 10 are shown having like reference designations, the two magnetoresistance elements 1004, 1006 (A, B) are coupled in a bridge arrangement 1300 with fixed resistors 1302, 1304 (also referred to herein as R1, R2). In some embodiments, the fixed resistors 1302, 1304 can be magnetically insensitive elements having some layers like a magnetoresistance element, as described, for example, in U.S. Pat. No. 7,777,607, issued Aug. 17, 2010.

The bridge 1300 can be powered by a voltage source 1306. Two output signals 1308=V1, 1310=V2 result. Designations V1 and V2 are used below for clarity.

Often, for a bridge arrangement, the two output signals V1, V2 are treated as one differential signal V1, V2. Here, however, the two output signals V1, V2 are treated separately.

Processing of the two output signals V1, V2 is described more fully below in conjunction with FIG. 26. However, let it suffice here to say that, with this arrangement, when the target feature 1012a of FIG. 10 is centered with the two magnetoresistance elements 1004, 1006 (A, B), a sum V1+V2 of the two output signals V1, V2 has a maximum (positive or negative) instantaneous value. As described above, the target feature 1012a can be a tooth, e.g., 322a, (or alternatively, a valley) of the gear 322 of FIG. 3, or a magnetic domain, e.g. 702a, (north, or alternatively, south) of the ring magnet 702 of FIG. 7. Thus, the sum V1+V2 is representative of a proximity of a tooth or proximity of a magnetic domain, and is, therefore, representative of a "feature" of the ferromagnetic target object.

In contrast, when the two magnetoresistance elements 1004, 1006 (A, B) are on opposite sides an edge 1012a of the target feature 1012a of FIG. 10, a difference V1–V2 of the two output signals V1, V2 has a maximum (positive or negative) instantaneous value. Thus, the difference V1–V2 is representative of a proximity of an edge, and is, therefore, representative of an "edge" of the ferromagnetic target object.

A magnetic field sensor using both the sum V1+V2 of the two signals V1, V2 and also the difference V1–V2 of the two signals V1, V2 can operate both as a tooth detector and a an edge detector, respectively. In some embodiments, the tooth detector capability allows a magnetic field sensor using the two magnetoresistance elements 1004, 1006 (A, B), coupled as shown, to operate with a true-power-on-state (TPOS) function.

While FIGS. 12 and 13 above show particular bridge arrangements, there are other possible bridge arrangements that should be apparent. For example, the magnetic field sensing elements 1004, 1006 can be interchanged in position.

Figure 14:
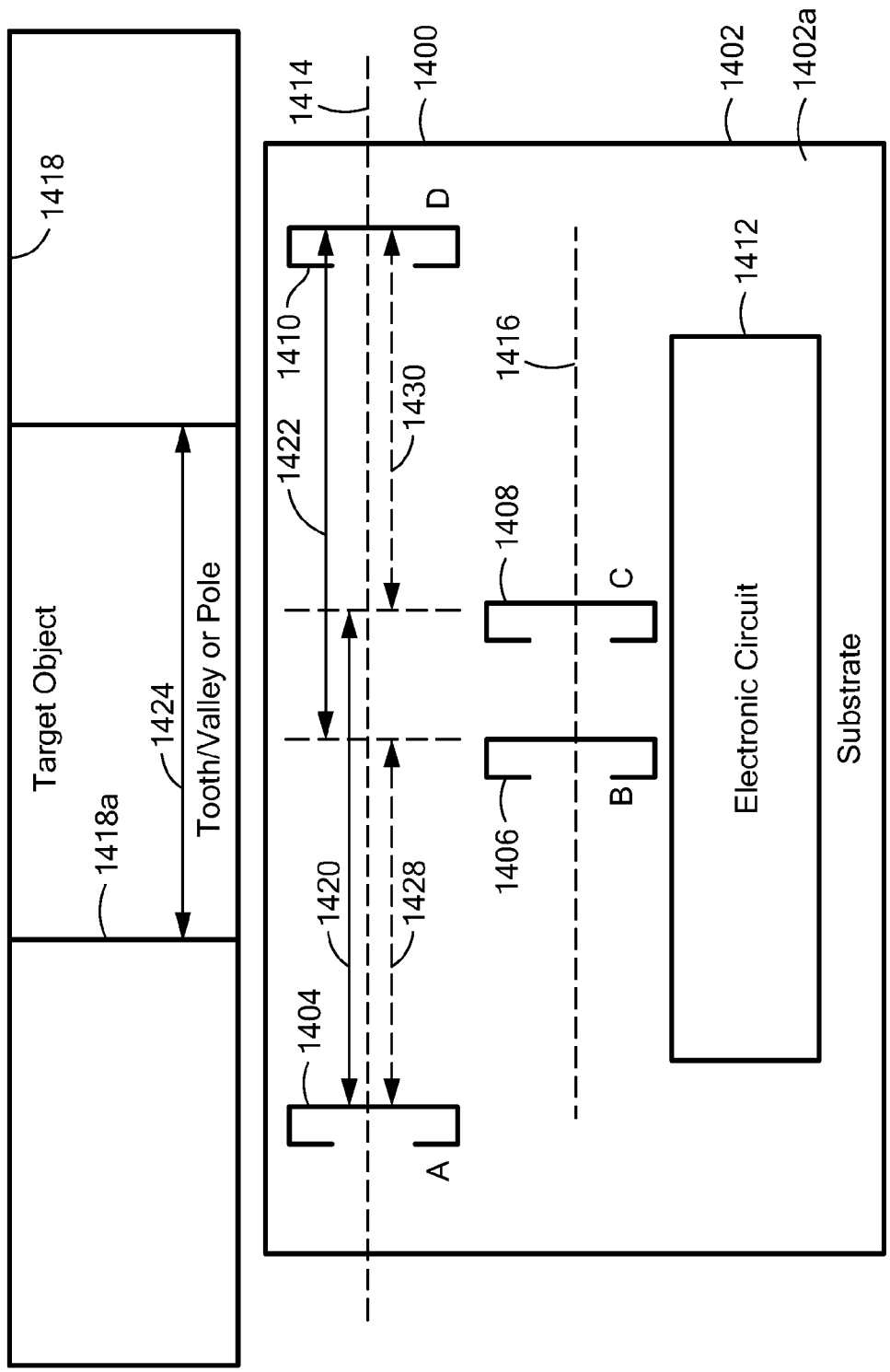
FIG. 14 is a block diagram showing an example of four magnetoresistance elements and an electronic circuit disposed upon a substrate, which can be representative of any of the above magnetic field sensing elements of FIGS. 3-9, all disposed proximate to a ferromagnetic object.

Referring now to FIG. 14, a magnetic field sensor 1400 can include a substrate 1402 having a surface 1402*a*, which is one of two parallel major surfaces of the substrate 1402.

Four magnetoresistance elements 1404, 1406, 1408, 1410 (also referred to herein as A, B, C, D) can be disposed upon the surface 1402*a*. The four magnetoresistance elements 1404, 1406, 1408, 1410 (A, B, C, D) can be part of or coupled to an electronic circuit 1412, which is also disposed upon or within the surface 1402*a* of the substrate 1412. The four magnetoresistance elements 1404, 1406, 1408, 1410 (A, B, C, D) can be the same as or similar to the magnetic field sensing elements 304 of FIGS. 3-9.

Maximum response axes of the magnetoresistance elements 1404, 1410 (A, D) can be parallel to and along an axis 1414. Maximum response axes of the magnetoresistance elements 1406, 1408 (B, C) can be parallel to and along an axis 1416. The axes 1414, 1416 can be parallel to the axis 308 of FIGS. 3-9.

Angles of magnetic fields are discussed above in conjunction with FIG. 10. As described above, the term "projected magnetic field" is used to describe geometric projections of magnetic fields upon the axes 1414, 1416.

The magnetic field sensor 1400 is responsive to movement of a ferromagnetic target object 1418 having features, e.g., 1418*a*, with width 1424. The ferromagnetic target object 1418 can be the same as or similar to the gear 322 of FIGS. 3-6 or the ring magnet 702 of FIGS. 7-9. The features, e.g., 1418*a*, can be the same as or similar to the gear teeth, e.g., 322*a*, of FIGS. 3-6 or the magnetic regions, e.g., 502*a*, of the ring magnet 702 of FIGS. 7-9.

The magnetic field sensor 1400 can be the same as or similar to the magnetic field sensor 300 of FIGS. 3-5, the magnetic field sensor 600 of FIG. 6, and the magnetic field sensor 700 of FIGS. 7-9. However, the magnetic field sensor 1400 is not shown in the rotated position described above in conjunction with FIGS. 5 and 9. Nevertheless the magnetic field sensor 1400 can be rotated into or out of the page in the same way.

In some embodiments, the magnetoresistance elements 1404, 1410 are disposed along the axis 1414 proximate to the ferromagnetic target object 1418 and the magnetoresistance elements 1406, 1408 are disposed along the axis 1416 more distant from the ferromagnetic target object 1418.

The axes 1414, 1416 can be parallel to the axis 308 of FIGS. 3-9.

In some embodiments, the two magnetoresistance elements 1404, 1408 (A, C) have a separation 1420 between about one half and about one and one half of the width 1424 of the target feature 1418*a*, for example, a gear tooth of a ferromagnetic gear or a magnetic domain of a ferromagnetic ring magnet. In some other embodiments, the two magnetoresistance elements 1404, 1408 (A, C) have a separation 1420 between about between about one half and about twice the width 1424 of the target feature 1418*a*. However, in other embodiments, the separation 1420 is much smaller than half of the width 1424, for example, one one hundredth of the width 1424, or larger than twice the width 1424.

In some embodiments used in examples below, the separation 1420 is about equal to the width 1424 of the target feature 1418*a*.

Similarly, in some other embodiments, the two magnetoresistance elements 1406, 1410 (B, D) have a separation 1422 between about one half and about one and one half of the width 1424 of the target feature 1418*a*, for example, a gear tooth of a ferromagnetic gear or a magnetic domain of a ferromagnetic ring magnet. In some other embodiments, the two magnetoresistance elements 1406, 1410 (B, D) have a separation 1422 between about one half and about twice the width 1424 of the target feature 1418*a*. However, in other embodiments, the separation 1422 is much smaller than half of the width 1424, for example, one one hundredth of the width 1424, or larger than twice the width 1424.

In some embodiments used in examples below, the separation 1422 is about equal to the width 1424 of the target feature 1418*a*.

In some other embodiments, the two magnetoresistance elements 1404, 1406 (A, B) have a separation 1428 between about one half and about one and one half of the width 1424 of the target feature 1418*a*. In some other embodiments, the two magnetoresistance elements 1404, 1406 (A, B) have a separation 1428 between about one half and about twice the width 1424 of the target feature 1418*a*. In some embodiments used in examples below, the separation 1428 is about equal to the width 1424 of the target feature 1418*a*. However, in other embodiments, the separation 1428 is much smaller than half of the width 1424, for example, one one hundredth of the width 1424, or larger than twice the width 1424.

In some embodiments used in examples below, the separation 1428 is about equal to the width 1424 of the target feature 1418*a*.

Similarly, in some other embodiments, the two magnetoresistance elements 1408, 1410 (C, D) have a separation 1430 between about one half and about one and one half of the width 1424 of the target feature 1418*a*. In some other embodiments, the two magnetoresistance elements 1408, 1410 (C, D) have a separation 1430 between about one half and about twice the width 1424 of the target feature 1418*a*. In some embodiments used in examples below, the separation 1430 is about equal to the width 1424 of the target feature 1418*a*. However, in other embodiments, the separation 1430 is much smaller than half of the width 1424, for example, one one hundredth of the width 1424 or larger than twice the width 1424.

In some embodiments used in examples below, the separation 1430 is about equal to the width 1424 of the target feature 1418*a*.

In operation, the four magnetoresistance elements 1404, 1406, 1408, 1410 (A, B, C, D) can generate at least two output signals. Figures shown and described below are representative of a variety of ways in which the four magnetoresistance elements 1404, 1406, 1408, 1410 (A, B, C, D) can generate at least two output signals.

Using as an example the target feature 1418*a* with a width 1424 equal to the spacings 1420, 1422, when the target feature 1418*a* is centered about (i.e., between) the four magnetoresistance elements 1404, 1406, 1408, 1410 (A, B, C, D), it can be shown that any magnetoresistance element(s) (e.g., 1404, 1406 (A, B)) on one side of a center of the target feature 1418*a* experiences a projected magnetic field pointed in one direction along the axes 1414, 1416, and any magnetoresistance element(s) (e.g., 1408, 1410 (C, D)) on the other side of the center of the target feature 1418*a* experiences a projected magnetic field pointed in the other direction.

Therefore, when the target feature 1418*a* is centered about four magnetoresistance elements 1404, 1406, 1408, 1410 (A, B, C, D), any magnetoresistance element(s) (e.g., 1404, 1406 (A, B)) on one side of the center of the target feature 1418*a* changes resistance in one direction, and any magnetoresistance element(s) (e.g., 1408, 1410 (C, D)) on the other side of the center of the target feature 1418a changes resistance in the other direction. However, with this particular physical arrangement of the four magnetoresistance elements 1404, 1406, 1408, 1410 (A, B, C, D), it should be recognized that the two magnetoresistance elements 1406, 1408 (B, C), being distal from the target feature 1418a, experience relatively little magnetic field fluctuation and relatively little resistance change as the ferromagnetic target object 1418 moves.

In contrast, when an edge of the target feature 1418a is centered about (i.e., between) the four magnetoresistance elements 1404, 1406, 1408, 1410 (A, B, C, D), it can be shown that the two magnetoresistance elements 1404, 1410 (A, D) experience projected magnetic fields pointed in the same direction along the axis 1414. Thus, resistance of both of the two magnetoresistance elements 1404, 1410 (A, D) change in the same direction.

At the same time, when an edge of the target feature 1418a is centered, the two magnetoresistance elements 1406, 1408 (B, C) experience projected magnetic fields pointed in the same direction along the axis 1416, but opposite in direction to the projected magnetic fields experienced by the two magnetoresistance elements 1404, 1410 (A, D). Thus, resistance of both of the two magnetoresistance elements 1406, 1408 (B, C) change in the same direction but opposite to the resistance change of the two magnetoresistance elements 1404, 1410 (A, D). However, as described above, the resistance change of the two magnetoresistance elements 1406, 1408 (B, C) is small, if any.

While a particular example of the spacings 1420, 1422, and 1428, 1430 relative to the width 1424 of the target feature 1418a is given above, it should be appreciated that for other relative dimensions, magnetic fields at the four magnetoresistance elements 1404, 1406, 148, 1410 (A, B, C, D) may not be exactly as described above and some resistance changes may be in other directions. However, it should be apparent how to modify equations shown in figures below to accomplish both a feature signal and an edge signal.

While a magnet like the magnet 332 of FIG. 3 is not shown, it should be understood that in some embodiments, the magnetic field sensor 1400 can include a magnet.

Figure 15:
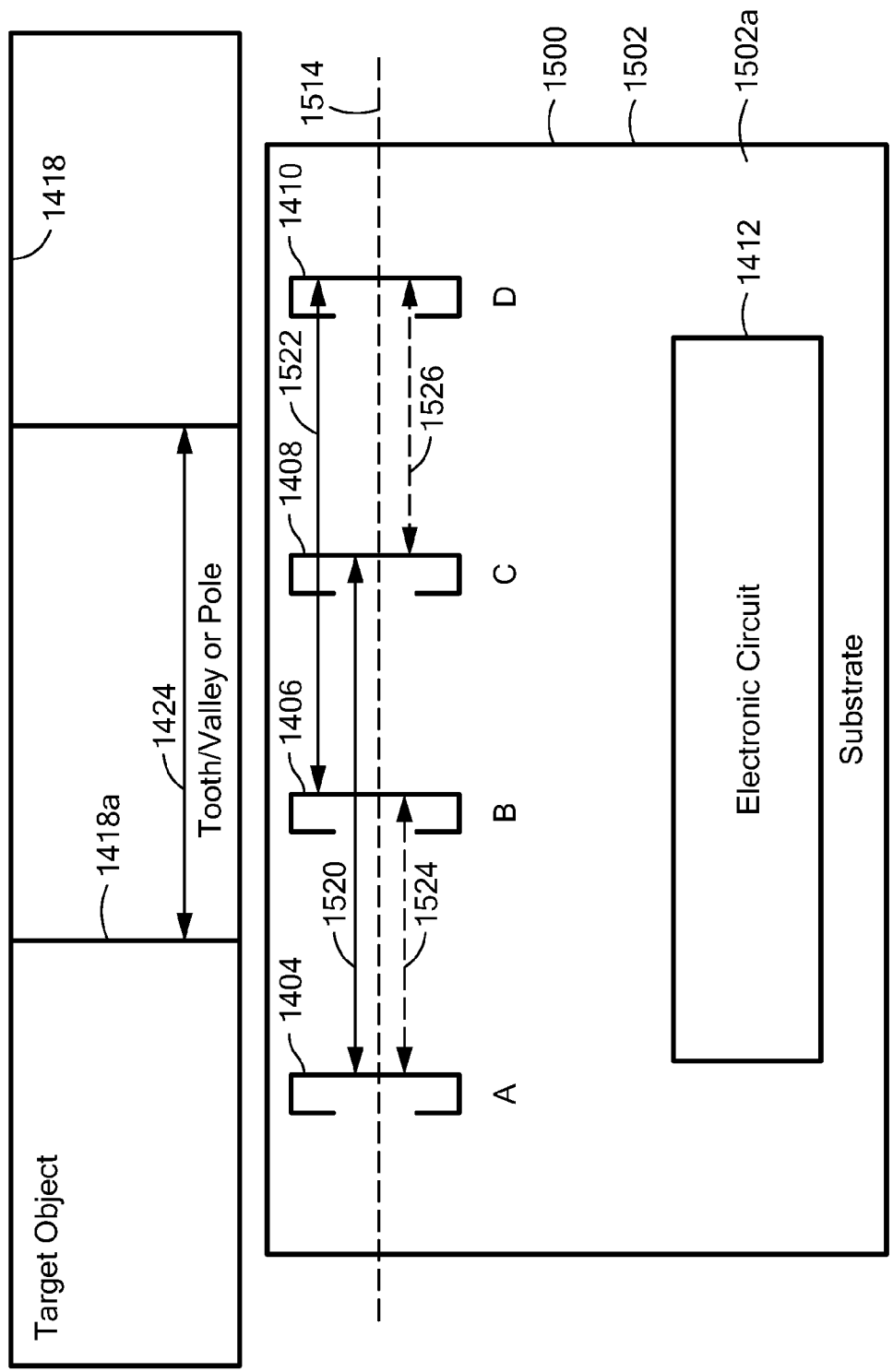
FIG. 15 is a block diagram showing another example of four magnetoresistance elements and an electronic circuit disposed upon a substrate, which can be representative of any of the above magnetic field sensing elements of FIGS. 3-9, all disposed proximate to a ferromagnetic object.

Referring now to FIG. 15, in which like elements of FIG. 14 are shown having like reference designations, a magnetic field sensor 1500 can include a substrate 1502 having a surface 1502a, which is one of two parallel major surfaces of the substrate 1502.

The four magnetoresistance elements 1404, 1406, 1408, 1410 (A, B, C, D) can be disposed upon the surface 1502a along an axis 1514. The four magnetoresistance elements 1404, 1406, 1408, 1410 (A, B, C, D) can be part of or coupled to the electronic circuit 1412, which is also disposed upon or within the surface 1502a of the substrate 1502. The four magnetoresistance elements 1404, 1406, 1408, 1410 (A, B, C, D) can be the same as or similar to the magnetic field sensing elements 304 of FIGS. 3-9. The axis 1514 can be parallel to the axis 308 of FIGS. 3-9.

Maximum response axes of the four magnetoresistance elements 1404, 1406, 1408, 1410 (A, B, C, D) can be parallel to and along an axis 1514, and in the same direction. Angles of magnetic fields are discussed above in conjunction with FIG. 10. As described above, the term "projected magnetic field" is used to describe geometric projections of magnetic fields upon the axis 1514.

The magnetic field sensor 1500 is responsive to movement of the ferromagnetic target object 1418.

In some embodiments, the four magnetoresistance elements 1404, 1406, 1408, 1410 (A, B, C, D) are disposed along the axis 1514 proximate to the ferromagnetic target object 1418.

The magnetic field sensor 1500 can be the same as or similar to the magnetic field sensor 300 of FIGS. 3-5, the magnetic field sensor 600 of FIG. 6, of the magnetic field sensor 700 of FIGS. 7-9. However, the magnetic field sensor 1500 is not shown in the rotated position described above in conjunction with FIGS. 5 and 9. Nevertheless the magnetic field sensor 1500 can be rotated into or out of the page in the same way.

As described above in conjunction with FIG. 14, the four magnetoresistance elements 1404, 1406, 1408, 1410 (A, B, C, D) can be the same as or similar to the magnetic field sensing elements 304 of FIGS. 3-9.

Also as described above in conjunction with FIG. 14, the ferromagnetic target object 1418 can be the same as or similar to the gear 322 of FIGS. 3-6 or the ring magnet 702 of FIGS. 7-9.

The axis 1514 can be parallel to the axis 308 of FIGS. 3-9.

In some embodiments, the two magnetoresistance elements 1404, 1408 (A, C) have a separation 1520 between about one half and about one and one half of the width 1424 of the target feature 1418a, for example, a gear tooth of a ferromagnetic gear or a magnetic domain of a ferromagnetic ring magnet. In some other embodiments, the two magnetoresistance elements 1404, 1408 (A, C) have a separation 1520 between about one half and about twice the width 1424 of the target feature 1418a. However, in other embodiments, the separation 1520 is much smaller than half of the width 1424, for example, one one hundredth of the width 1424 or larger than twice the width 1424.

In some embodiments used in examples below, the separation 1520 is about equal to the width 1424 of the target feature 1418a.

Similarly, in some embodiments, the two magnetoresistance elements 1406, 1410 (B, D) have a separation 1522 between about one half and about one and one half of the width 1424 of the target feature 1418a, for example, a gear tooth of a ferromagnetic gear or a magnetic domain of a ferromagnetic ring magnet. In some embodiments, the two magnetoresistance elements 1406, 1410 (B, D) have a separation 1522 between about one half and about twice the width 1424 of the target feature 1418a. However, in other embodiments, the separation 1522 is much smaller than half of the width 1424, for example, one one hundredth of the width 1424 or larger than twice the width 1424.

In some embodiments used in examples below, the separation 1522 is about equal to the width 1424 of the target feature 1418a.

In some other embodiments, the two magnetoresistance elements 1404, 1406 (A, B) have a separation 1524 between about one half and about one and one half of the width 1424 of the target feature 1418a. In some other embodiments, the two magnetoresistance elements 1404, 1406 (A, B) have a separation 1524 between about one half and about twice the width 1424 of the target feature 1418a. However, in other embodiments, the separation 1424 is much smaller than half of the width 1424, for example, one one hundredth of the width 1424 or larger than twice the width 1424.

In some embodiments used in examples below, the separation 1524 is about equal to the width 1424 of the target feature 1418a.

Similarly, in some other embodiments, the two magnetoresistance elements 1408, 1410 (C, D) have a separation 1526 between about one half and about one and one half of the width 1424 of the target feature 1418a. In some other embodiments, the two magnetoresistance elements 1408, 1410 (C, D) have a separation 1526 between about one half and twice the width 1424 of the target feature 1418a. However, in other embodiments, the separation 1526 is much smaller than half of the width 1424, for example, one one hundredth of the width 1424 or larger than twice the width 1424.

In some embodiments used in examples below, the separation 1526 is about equal to the width 1424 of the target feature 1418a.

In operation, the four magnetoresistance elements 1404, 1406, 1408, 1410 (A, B, C, D) can generate at least two output signals. Figures shown and described below are representative of a variety of ways in which the four magnetoresistance elements 1404, 1406, 1408, 1410 (A, B, C, D) can generate at least two output signals.

Using as an example the target feature 1012a with a width 1014 equal to the spacings 1520, 1522, when the target feature 1418a is centered about (i.e., between) the four magnetoresistance elements 1404, 1406, 1408, 1410 (A, B, C, D), it can be shown that any magnetoresistance element (s) (e.g., 1404, 1406 (A, B)) on one side of a center of the target feature 1418a experiences a projected magnetic field pointed in one direction along the axis 1514, and any magnetoresistance element(s) (e.g., 1408, 1410 (C, D)) on the other side of the center of the target feature 1418a experiences a projected magnetic field pointed in the other direction.

Therefore, when the target feature 1418a is centered about four magnetoresistance elements 1404, 1406, 1408, 1410 (A, B, C, D), any magnetoresistance element(s) (e.g., 1404, 1406 (A, B)) on one side of the center of the target feature 1418a change resistance in one direction, and any magnetoresistance element(s) (e.g., 1408, 1410 (C, D)) on the other side of the center of the target feature 1418a change resistance in the other direction.

In contrast, when an edge of the target feature 1418a is centered about (i.e., between) the four magnetoresistance elements 1404, 1406, 1408, 1410 (A, B, C, D), it can be shown that the two magnetoresistance elements 1404, 1410 (A, D) experience projected magnetic fields pointed in the same direction along the axis 1514. Thus, resistance of both of the two magnetoresistance elements 1404, 14010 change in the same direction.

At the same time, when an edge of the target feature 1418a is centered, the two magnetoresistance elements 1406, 1408 (B, C) experience projected magnetic fields pointed in the same direction along the axis 1514, but opposite in direction from the projected magnetic fields experienced by the two magnetoresistance elements 1404, 1410 (A, D). Thus, resistance of both of the two magnetoresistance elements 1406, 1408 (B, C) change in the same direction but opposite to the resistance change of the two magnetoresistance elements 1404, 1410 (A, D).

While a particular example of the spacings 1520, 1522 and 1524, 1526 relative to the width 1424 of the target feature 1418a is given above, it should be appreciated that for other relative dimensions, magnetic fields at the four magnetoresistance elements 1404, 1406, 148, 1410 (A, B, C, D) may not be exactly as described above and some resistance changes may be in other directions. However, it should be apparent how to modify equations shown in figures below to accomplish both a feature signal and an edge signal.

While a magnet like the magnet 332 of FIG. 3 is not shown, it should be understood that in some embodiments, the magnetic field sensor 1400 can include a magnet. Figures below use the spacing used in examples above.

Figure 16:
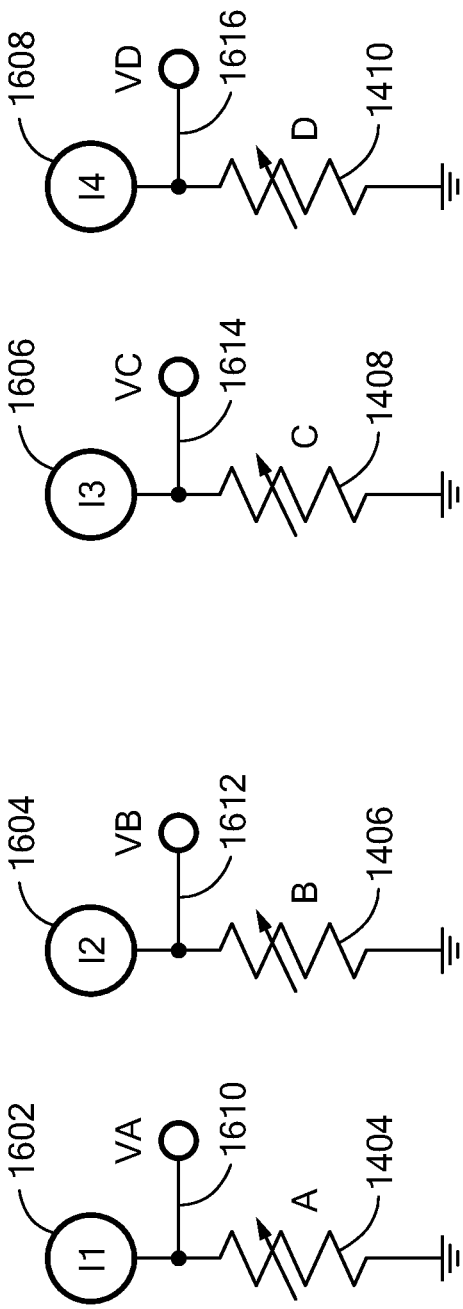
FIG. 16 is a schematic diagram showing an example of four magnetoresistance elements arranged separately, where the four magnetoresistance elements can be used as any of the magnetic field sensing elements of FIGS. 3-9 and as the four magnetoresistance elements of FIGS. 14-15.

Referring now to FIG. 16, in which like elements of FIGS. 14 and 15 are shown having like reference designations, the four magnetoresistance elements 1404, 1406, 1408, 1410, are coupled to respective current sources 1602, 1604, 1606, 1608 resulting in respective signals 1610, 1612, 1614, 1616, also referred to generically herein as signals VA, VB, VC, VD, respectively.

In some embodiments, V1=VA−VC and V2=VB−VD. In other embodiments, V1=VA+VB and V2=−(VC+VD).

Processing of the two signals V1, V2 is described more fully below in conjunction with FIG. 26. However, let it suffice here to say that, with these arrangements, a sum V1+V2 of the two signals V1, V2 has a maximum (positive or negative) instantaneous value when the object feature 1418a of FIGS. 14 and 15 is centered about the four magnetoresistance elements 1404, 1406, 1408, 1410 (A, B, C, D). The sum V1+V2, therefore, provides a feature signal.

In contrast, a difference V1−V2 of the two output signals V1, V2 has a maximum (positive or negative) instantaneous value when an edge of the target feature 1418a is centered about (i.e., between) the four magnetoresistance elements 1404, 1406, 1408, 1410 (A, B, C, D). Largest signals can be achieved when the distances 1520, 1522 are equal to the distance 1424.

A magnetic field sensor using the four magnetoresistance elements 1404, 1406, 1408, 1410 (A, B, C, D) and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using the four magnetoresistance elements 1404, 1406, 1408, 1410 (A, B, C, D) to operate with a true-power-on-state (TPOS) function.

Figures 17, 18:
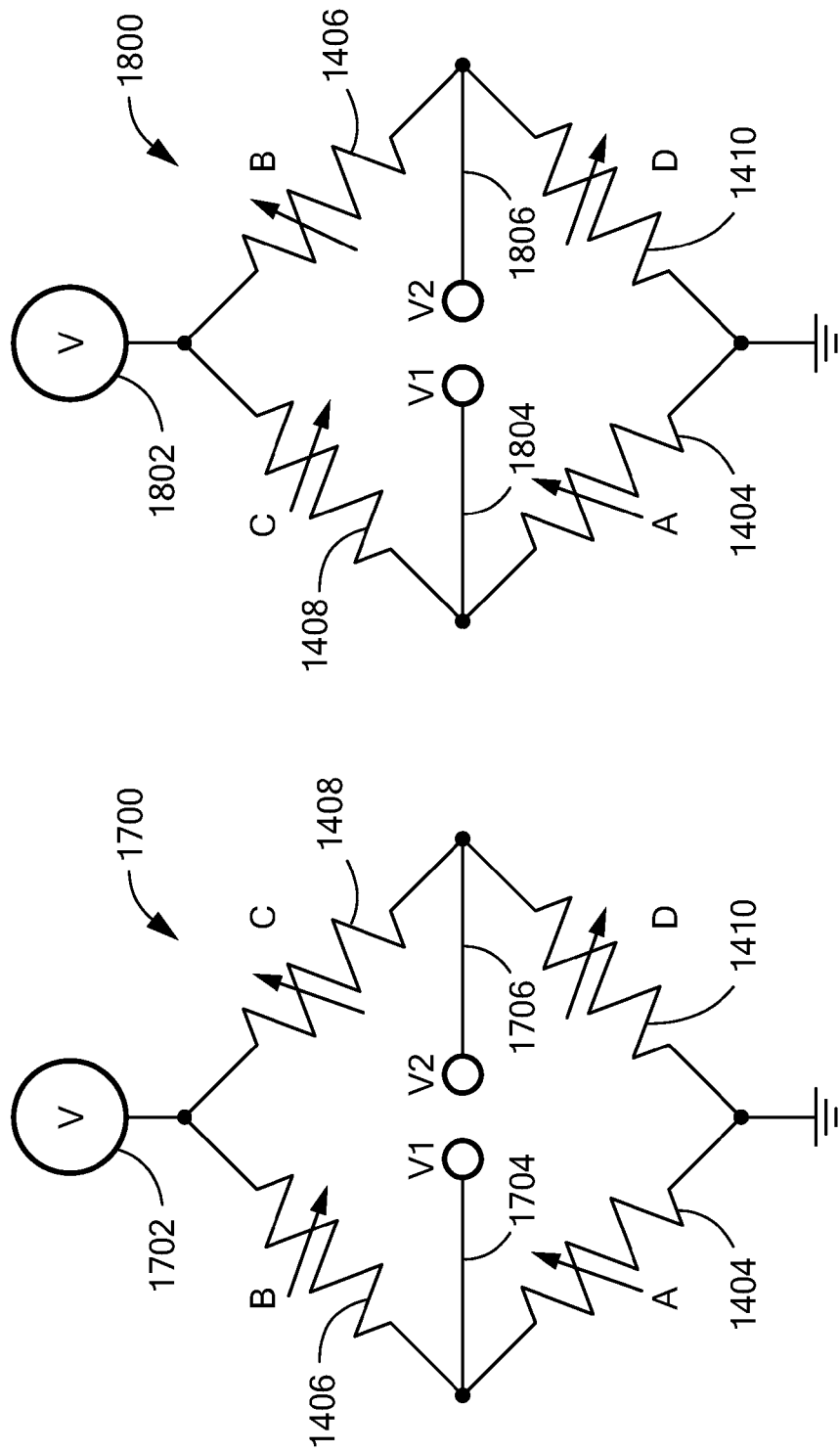
FIG. 17 is a schematic diagram showing an example of four magnetoresistance elements arranged in a bridge, where the four magnetoresistance elements can be used as any of the magnetic field sensing elements of FIGS. 3-9 and as the four magnetoresistance elements of FIGS. 14-15.
FIG. 18 is a schematic diagram showing another example of four magnetoresistance elements arranged in a bridge, where the four magnetoresistance elements can be used as any of the magnetic field sensing elements of FIGS. 3-9 and as the four magnetoresistance elements of FIGS. 14-15.

Referring now to FIG. 17, in which like elements of FIGS. 14 and 15 are shown having like reference designations, the four magnetoresistance elements 1404, 1406, 1408, 1410 (A, B, C, D) are coupled in a bridge arrangement 1700.

The bridge 1700 can be powered by a voltage source 1702. Two output signals 1704=V, 1706=V2 result. Designations V1 and V2 are used below for clarity.

Often, for a bridge arrangement, the two output signals V1, V2 are treated as one differential signal V1, V2. Here, however, the two output signals V1, V2 are treated separately.

Processing of the two output signals V1, V2 is described more fully below in conjunction with FIG. 26. However, let it suffice here to say that, with these arrangements, a difference V1−V2 of the two signals V1. V2 has a maximum (positive or negative) instantaneous value when the object feature 1418a of FIGS. 14 and 15, but particularly FIG. 14, is centered about the four magnetoresistance elements 1404, 1406, 1408, 1410 (A, B, C, D). The difference V1−V2, therefore, provides a feature signal.

In contrast, a sum V1+V2 of the two output signals V1, V2 has a maximum (positive or negative) instantaneous value when an edge of the target feature 1418a is centered about (i.e., between) the four magnetoresistance elements 1404, 1406, 1408, 1410 (A, B, C, D).

A magnetic field sensor using the bridge 1700 and using both the difference V1−V2 of the two signals V1, V2 and also the sum V1+V2 of the two signals V1, V2 can operate both as a tooth detector and a an edge detector, respectively. In some embodiments, the tooth detector capability allows a magnetic field sensor using the four magnetoresistance elements 1404, 1406, 1408, 1410 (A, B, C, D) to operate with a true-power-on-state (TPOS) function.

The bridge 1700 is best suited for the arrangement of FIG. 14, but can also function with the arrangement of FIG. 15.

Referring now to FIG. 18, in which like elements of FIGS. 14 and 15 are shown having like reference designations, the four magnetoresistance elements 1404, 1406, 1408, 1410 (A, B, C, D) are coupled in a bridge arrangement 1800.

The bridge 1800 can be powered by a voltage source 1802. Two output signals 1804=V1, 1806=V2 result. Designations V1 and V2 are used below for clarity.

Often, for a bridge arrangement, the two output signals V1, V2 are treated as one differential signal V1, V2. Here, however, the two output signals V1, V2 are treated separately.

Processing of the two output signals V1, V2 is described more fully below in conjunction with FIG. 26. However, let it suffice here to say that, with these arrangements, a difference V1−V2 of the two signals V1, V2 has a maximum (positive or negative) instantaneous value when the object feature 1418a of FIGS. 14 and 15 is centered about the four magnetoresistance elements 1404, 1406, 1408, 1410 (A, B, C, D). The difference V1−V2, therefore, provides a feature signal.

In contrast, a sum V+V2 of the two output signals V1, V2 has a maximum (positive or negative) instantaneous value when an edge of the target feature 1418a is centered about (i.e., between) the four magnetoresistance elements 1404, 1406, 1408, 1410 (A, B, C, D).

A magnetic field sensor using the bridge 1700 and using both the difference V1−V2 of the two signals V1, V2 and also the sum V1+V2 of the two signals V1, V2 can operate both as a tooth detector and a an edge detector, respectively. In some embodiments, the tooth detector capability allows a magnetic field sensor using the four magnetoresistance elements 1404, 1406, 1408, 1410 (A, B, C, D) to operate with a true-power-on-state (TPOS) function.

The bridge 1800 is well suited for the arrangements of FIGS. 14 and 15.

Figure 19:
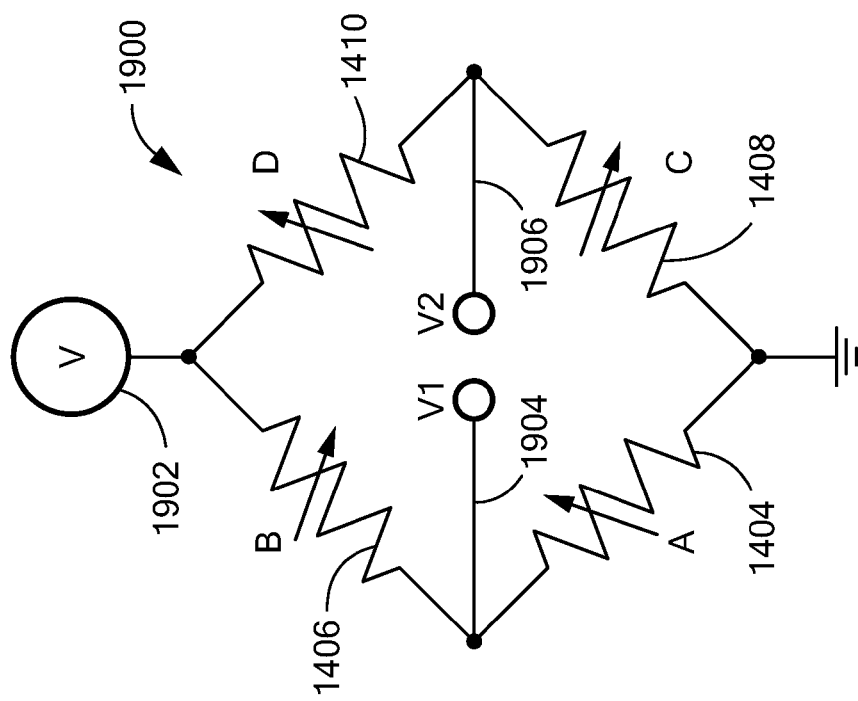
FIG. 19 is a schematic diagram showing an example of four magnetoresistance elements arranged in a bridge, where the four magnetoresistance elements can be used as any of the magnetic field sensing elements of FIGS. 3-9 and as the four magnetoresistance elements of FIGS. 14-15.

Referring now to FIG. 19, in which like elements of FIGS. 14 and 15 are shown having like reference designations, the four magnetoresistance elements 1404, 1406, 1408, 1410 (A, B, C, D) are coupled in a bridge arrangement 1900.

The bridge 1900 can be powered by a voltage source 1902. Two output signals 1904=V1, 1906=V2 result. Designations V1 and V2 are used below for clarity.

Often, for a bridge arrangement, the two output signals V1, V2 are treated as one differential signal V1, V2. Here, however, the two output signals V1, V2 are treated separately.

Processing of the two output signals V1, V2 is described more fully below in conjunction with FIG. 26. However, let it suffice here to say that, with these arrangements, a sum V1+V2 of the two signals V1, V2 has a maximum (positive or negative) instantaneous value when the object feature 1418a of FIGS. 14 and 15, but particularly FIG. 14, is centered about the four magnetoresistance elements 1404, 1406, 1408, 1410 (A, B, C, D). The sum V+V2, therefore, provides a feature signal.

In contrast, a difference V1−V2 of the two output signals V1, V2 has a maximum (positive or negative) instantaneous value when an edge of the target feature 1418a is centered about (i.e., between) the four magnetoresistance elements 1404, 1406, 1408, 1410 (A, B, C, D).

A magnetic field sensor using the bridge 1900 and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using bridge 1900 to operate with a true-power-on-state (TPOS) function.

The bridge 1900 is best suited for the arrangement of FIG. 14, but can also function with the arrangement of FIG. 15.

Figure 20:
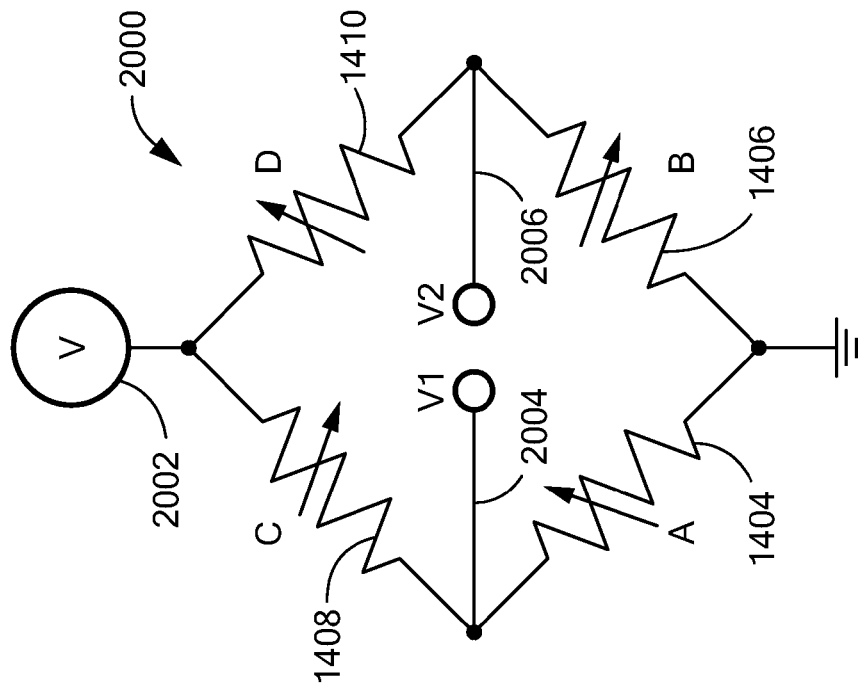
FIG. 20 is a schematic diagram showing an example of four magnetoresistance elements arranged in a bridge, where the four magnetoresistance elements can be used as any of the magnetic field sensing elements of FIGS. 3-9 and as the four magnetoresistance elements of FIGS. 14-15.

Referring now to FIG. 20, in which like elements of FIGS. 14 and 15 are shown having like reference designations, the four magnetoresistance elements 1404, 1406, 1408, 1410 (A, B, C, D) are coupled in a bridge arrangement 2000.

The bridge 2000 can be powered by a voltage source 2002. Two output signals 2004=V1, 2006=V2 result. Designations V1 and V2 are used below for clarity.

Often, for a bridge arrangement, the two output signals V1, V2 are treated as one differential signal V1, V2. Here, however, the two output signals V1, V2 are treated separately.

Processing of the two output signals V1, V2 is described more fully below in conjunction with FIG. 26. However, let it suffice here to say that, with these arrangements, a sum V1+V2 of the two signals V1, V2 has a maximum (positive or negative) instantaneous value when the object feature 1418a of FIGS. 14 and 15 is centered about the four magnetoresistance elements 1404, 1406, 1408, 1410 (A, B, C, D). The sum V1+V2, therefore, provides a feature signal.

In contrast, a difference V1−V2 of the two output signals V1, V2 has a maximum (positive or negative) instantaneous value when an edge of the target feature 1418a is centered about (i.e., between) the four magnetoresistance elements 1404, 1406, 1408, 1410 (A, B, C, D).

A magnetic field sensor using the bridge 2000 and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using bridge 2000 to operate with a true-power-on-state (TPOS) function.

The bridge 2000 is well suited for the arrangements of FIGS. 14 and 15.

While various bridge arrangements are shown in FIGS. 17-20, there are other similar bridge arrangements that can be used to generate a feature signal and an edge signal.

Figure 21:
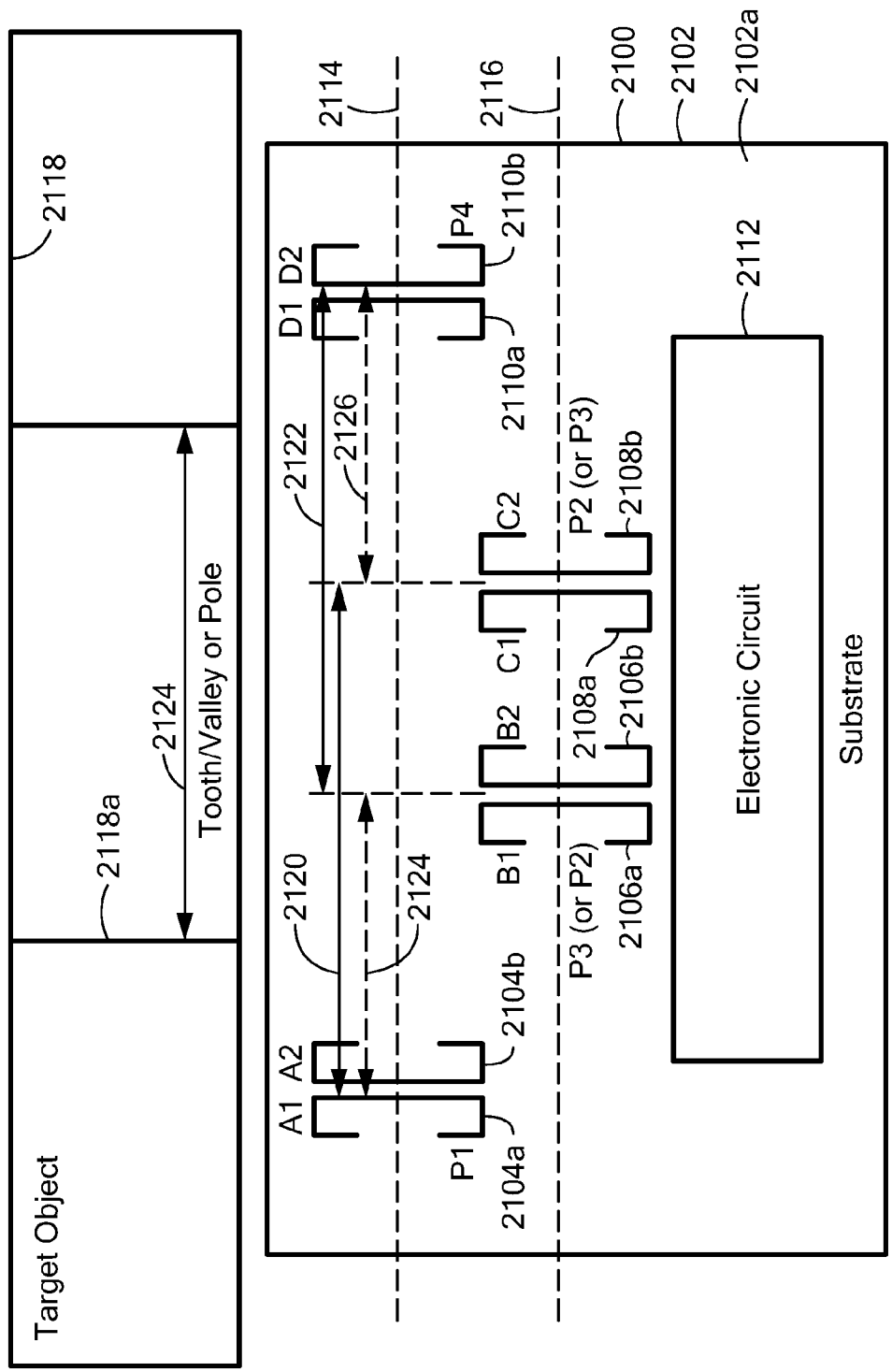
FIG. 21 is a block diagram showing an example of eight magnetoresistance elements and an electronic circuit disposed upon a substrate, which can be representative of any of the above magnetic field sensing elements of FIGS. 3-9, all disposed proximate to a ferromagnetic object.

Referring now to FIG. 21, a magnetic field sensor 2100 can include a substrate 2102 having a surface 2102a, which is one of two parallel major surfaces of the substrate 2102.

Eight magnetoresistance elements 2104a, 2104b, 2106a, 2106b, 2108a, 2108b, 2110a, 2110b (also referred to herein as A1, A2, B1, B2, C1, C2, D1, D2) can be disposed upon the surface 2102a. The eight magnetoresistance elements 2104a, 2104b, 2106a, 2106b, 2108a, 2108b, 2110a, 2110b (A1, A2, B1, B2, C1, C2, D1, D2) can be arranged in proximate pairs P1, P2, P3, P4.

The eight magnetoresistance elements 2104a, 2104b, 2106a, 2106b, 2108a, 2108b, 2110a, 2110b (A1, A2, B1, B2, C1, C2, D1, D2) can be part of or coupled to an electronic circuit 2112, which is also disposed upon or within the surface 2102a of the substrate 2102. The eight magnetoresistance elements 2104a, 2104b, 2106a, 2106b, 2108a, 2108b, 2110a, 2110b (A1, A2, B1, B2, C1, C2, D1, D2) can be the same as or similar to the magnetic field sensing elements 304 of FIGS. 3-9.

Maximum response axes of the magnetoresistance elements 2104a, 2104b, 2110a, 2110b (A1, A2, D1, D2) can be parallel to and along an axis 2114. Maximum response axes of the magnetoresistance elements 2106a, 2106b, 2108a, 2108b (B1, B2, C1, C2) can be parallel to and along an axis 2116. The axes 2114, 2116 can be parallel to the axis 308 of FIGS. 3-9.

Angles of magnetic fields are discussed above in conjunction with FIG. 10. As described above, the term "projected magnetic field" is used to describe geometric projections of magnetic fields upon the axes 2114, 2116.

The magnetic field sensor 2100 is responsive to movement of a ferromagnetic target object 2118 having features, e.g., 2118a, with width 2124. The ferromagnetic target object 2118 can be the same as or similar to the gear 322 of FIGS. 3-6 or the ring magnet 702 of FIGS. 7-9. The features, e.g., 2118a, can be the same as or similar to the gear teeth, e.g., 322a, of FIGS. 3-6 or the magnetic regions, e.g., 502a, of the ring magnet 702 of FIGS. 7-9.

The magnetic field sensor 2100 can be the same as or similar to the magnetic field sensor 300 of FIGS. 3-5, the magnetic field sensor 600 of FIG. 6, and the magnetic field sensor 700 of FIGS. 7-9. However, the magnetic field sensor 2100 is not shown in the rotated position described above in conjunction with FIGS. 5 and 9. Nevertheless the magnetic field sensor 2100 can be rotated into or out of the page in the same way.

In some embodiments, the magnetoresistance elements 2104a, 2104b, 2110a, 2110b (A1, A2, D1, D2) are disposed along the axis 2114 proximate to the ferromagnetic target object 2118 and the magnetoresistance elements 2106a, 2106b, 2108a, 2108b (B1, B2, C1, C2) are disposed along the axis 2116 more distant from the ferromagnetic target object 2118.

The axes 2114, 2116 can be parallel to the axis 308 of FIGS. 3-9.

In some embodiments, the two magnetoresistance elements 2104a, 2104b (A1, A2) have a separation 2120 to the two magnetoresistance elements 2108a, 2108b (C1, C2) between about one half and about one and one half of the width 2124 of the target feature 2118a, for example, a gear tooth of a ferromagnetic gear or a magnetic domain of a ferromagnetic ring magnet. In some other embodiments, the two magnetoresistance elements 2104a, 2104b (A1, A2) have a separation 2120 to the two magnetoresistance elements 2108a, 2108b (C1, C2) between about one half and about twice the width 2124 of the target feature 2118a. However, in other embodiments, the separation 2120 is much smaller than half of the width 2124, for example, one one hundredth of the width 2124, or larger than twice the width 2124.

In some embodiments used in examples below, the separation 2120 is about equal to the width 2124 of the target feature 2118a.

Similarly, in some embodiments, the two magnetoresistance elements 2106a, 2106b (B1, B2) have a separation 2122 to the two magnetoresistance elements 2110a, 2110b (D1, D2) between about one half and about one and one half of the width 2124 of the target feature 2118a, for example, a gear tooth of a ferromagnetic gear or a magnetic domain of a ferromagnetic ring magnet. In some embodiments, the two magnetoresistance elements 2106a, 2106b (B1, B2) have a separation 2122 to the two magnetoresistance elements 2110a, 2110b (D1, D2) between about one half and about twice the width 2124 of the target feature 2118a. However, in other embodiments, the separation 2122 is much smaller than half of the width 2124, for example, one one hundredth of the width 2124, or larger than twice the width 2124.

In some embodiments used in examples below, the separation 2122 is about equal to the width 2124 of the target feature 2118a.

In some other embodiments, the two magnetoresistance elements 2104a, 2104b (A1, A2) have a separation 2124 to the two magnetoresistance elements 2106a, 2106b (B1, B2) between about one half and about one and one half of the width 2124 of the target feature 2118a. In some other embodiments, the two magnetoresistance elements 2104a, 2104b (A1, A2) have a separation 2124 to the two magnetoresistance elements 2106a, 2106b (B1, B2) between about one half and about twice the width 2124 of the target feature 2118a. However, in other embodiments, the separation 2124 is much smaller than half of the width 2124, for example, one one hundredth of the width 2124, or larger than twice the width 2124.

In some embodiments used in examples below, the separation 2124 is about equal to the width 2124 of the target feature 2118a.

Similarly, in some other embodiments, the two magnetoresistance elements 2108a, 2108b (C1, C2) have a separation 2126 to the two magnetoresistance elements 2110a, 2110b (D1, D2) between about one half and about one and one half of the width 2124 of the target feature 2118a. In some other embodiments, the two magnetoresistance elements 2108a, 2108b (C1, C2) have a separation 2126 to the two magnetoresistance elements 2110a, 2110b (D1, D2) between about one half and about twice the width 2124 of the target feature 2118a. However, in other embodiments, the separation 2126 is much smaller than half of the width 2124, for example, one one hundredth of the width 2124, or larger than twice the width 2124.

In some embodiments used in examples below, the separation 2126 is about equal to the width 2124 of the target feature 2118a.

In operation, the eight magnetoresistance elements 2104a, 2104b, 2106a, 2106b, 2108a, 2108b, 2110a, 2110b (A1, A2, B1, B2, C1, C2, D1, D2) can generate at least two output signals. Figures shown and described below are representative of a variety of ways in which the eight magnetoresistance elements 2104a, 2104b, 2106a, 2106b, 2108a, 2108b, 2110a, 2110b (A1, A2, B1, B2, C1, C2, D1, D2) can generate at least two output signals.

Using as an example the target feature 2118aa with a width 2124 equal to the spacings 2120, 2122, when the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2), it can be shown that any magnetoresistance element(s) (e.g., 2104a, 4104b, 2106a, 2106b (A1, A2, B1, B2) on one side of a center of the target feature 2118a experiences a projected magnetic field pointed in one direction along the axes 2114, 2116, and any magnetoresistance element(s) (e.g., 2108a, 2108b, 2110a, 2110b (C1, C2, D1, Dl)) on the other side of the center of the target feature 2118a experiences a projected magnetic field pointed in the other direction.

Therefore, when the target feature 2118a is centered about eight magnetoresistance elements 2104a, 2104b, 2106a, 2106b, 2108a, 2108b, 2110a, 2110b (A1, A2, B1, B2, C1, C2, D1, D2), any magnetoresistance element(s) (e.g., 2104a, 2104b, 2106a, 2106b (A1, A2, B1, B2)) on one side of the center of the target feature 2118a changed resistance in one direction, and any magnetoresistance element(s) (e.g., 2108a, 2108b, 2110a, 2110b (C1, C2, D1, D2)) on the other side of the center of the target feature 2118a changed resistance in the other direction. However, with this particular physical arrangement of the eight magnetoresistance elements 2104a, 2104b, 2106a, 2106b, 2108a, 2108b, 2110a,2110b (A1, A2, B1, B2, C1, C2, D1, D2), it should be recognized that the four magnetoresistance elements 2106a, 2106b, 2108a, 2108b (B1, B2, C1, C2), being distal from the target feature 2118a, experience relatively little magnetic field variation and relatively little resistance change as the ferromagnetic target object 2118 moves.

In contrast, when an edge of the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2), it can be shown that the four magnetoresistance elements 2104a, 2104b, 2110a, 2110b (A1, A2, D1, D2) experience projected magnetic fields pointed in the same direction along the axis 2114. Thus, resistances of the four magnetoresistance elements 2104a, 2104b, 2110a, 2110b (A1, A2, D1, D2) change in the same direction.

At the same time, when an edge of the target feature 2118a is centered, the four magnetoresistance elements 2106a, 2106b, 2108a, 2108b (B1, B2, C1, C2) experience projected magnetic fields pointed in the same direction along the axis 2116, but opposite in direction from the projected magnetic fields experienced by the four magnetoresistance elements 2104a, 2104b, 2110a, 2110b (A1, A2, D1, D2). Thus, resistance of four magnetoresistance elements 2106a, 2106b, 2108a, 2108b (B1, B2, C1, C2) change in the same direction but opposite to the resistance change of the four magnetoresistance elements 2104a, 2104b, 2110a, 2110b (A1, A2, D1, D2). However, as described above, the resistance change of the two magnetoresistance elements 1406, 1408 (B, C) is small, if any.

While a particular example of the spacings 2120, 2122 and 2124, 2126 relative to the width 2124 of the target feature 2118a is given above, it should be appreciated that for other relative dimensions, magnetic fields at the eight magnetoresistance elements 2104a, 2104b, 2106a, 2106b, 2108a, 2108b, 2110a, 2110b (A1, A2, B1, B2, C1, C2, D1, D2) may not be exactly as described above and some resistance changes may be in other directions. However, it should be apparent how to modify equations shown in figures below to accomplish both a feature signal and an edge signal.

While a magnet like the magnet 332 of FIG. 3 is not shown, it should be understood that in some embodiments, the magnetic field sensor 2100 can include a magnet.

Figure 22:
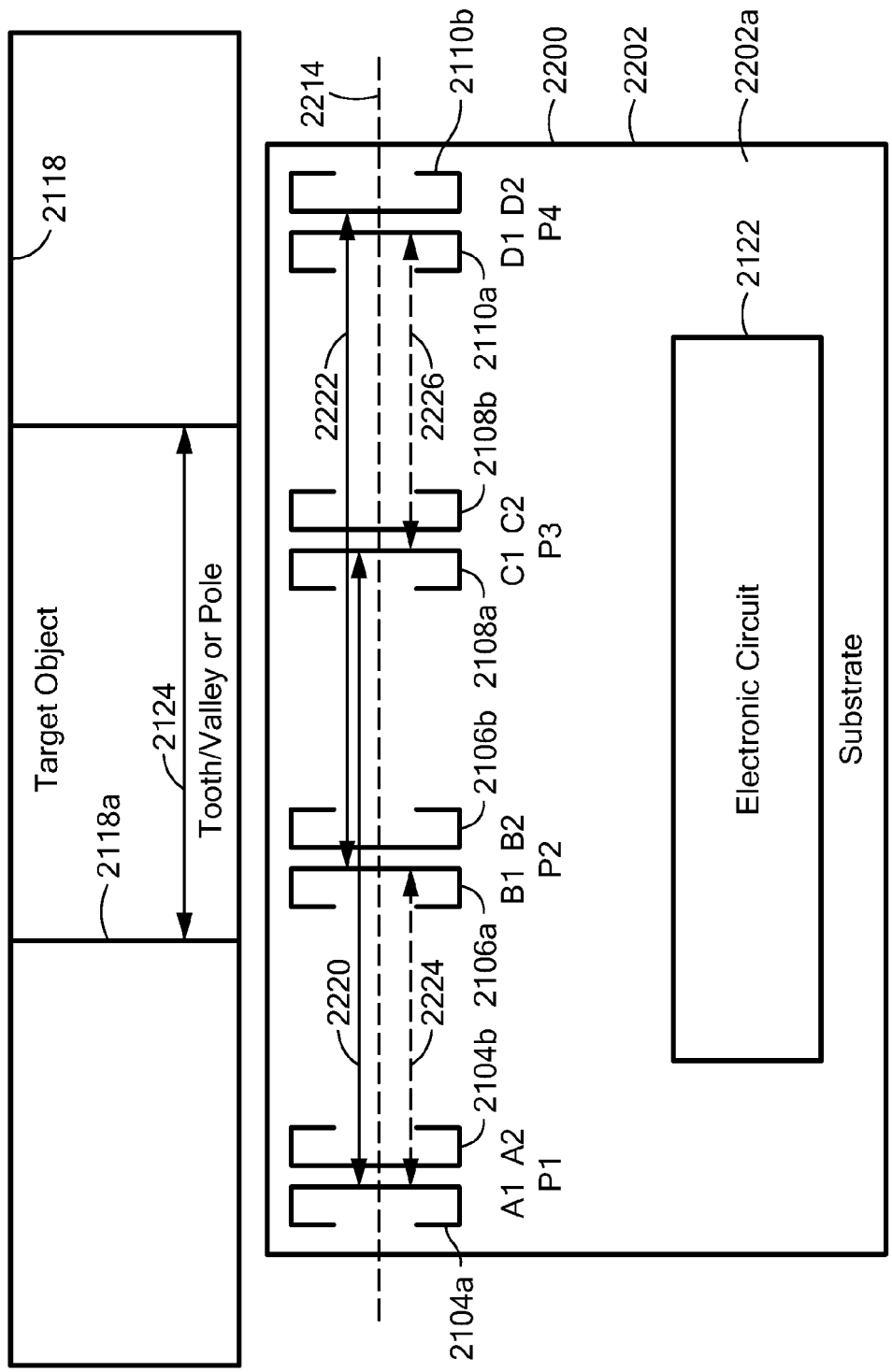
FIG. 22 is a block diagram showing another example of eight magnetoresistance elements and an electronic circuit disposed upon a substrate, which can be representative of any of the above magnetic field sensing elements of FIGS. 3-9, all disposed proximate to a ferromagnetic object.

Referring now to FIG. 22, in which like elements of FIG. 21 are shown having like reference designations, a magnetic field sensor 2200 can include a substrate 2202 having a surface 2202a, which is one of two parallel major surfaces of the substrate 2202.

The eight magnetoresistance elements 2104a, 2104b, 2106a, 2106b, 2108a, 2108b, 2110a, 2110b (A1, A2, B1, B2, C1, C2, D1, D2) can be disposed upon the surface 2202a along an axis 2214. The eight magnetoresistance elements 2104a, 2104b, 2106a, 2106b, 2108a, 2108b, 2110a, 2110b (A1, A2, B1, B2, C1, C2, D1, D2) can be part of or coupled to the electronic circuit 2112, which is also disposed upon or within the surface 2202a of the substrate 2202. The eight magnetoresistance elements 2104a, 2104b, 2106a, 2106b, 2108a, 2108b, 2110a, 2110b (A1, A2, B1, B2, C1, C2, D1, D2) can be the same as or similar to the magnetic field sensing elements 304 of FIGS. 3-9. The axis 2214 can be parallel to the axis 308 of FIGS. 3-9.

Maximum response axes of the eight magnetoresistance elements 2104a, 2104b, 2106a, 2106b, 2108a, 2108b, 2110a, 2110b (A1, A2, B1, B2, C1, C2, D1, D2) can be parallel to and along an axis 2214, and in the same direction. Angles of magnetic fields are discussed above in conjunction with FIG. 10. As described above, the term "projected magnetic field" is used to describe geometric projections of magnetic fields upon the axis 2214.

The magnetic field sensor 2200 is responsive to movement of the ferromagnetic target object 2118.

In some embodiments, the eight magnetoresistance elements 2104a, 2104b, 2106a, 2106b, 2108a, 2108b, 2110a, 2110b (A1, A2, B1, B2, C1, C2, D1, D2) are disposed along the axis 2214 proximate to the ferromagnetic target object 2118.

The magnetic field sensor 2200 can be the same as or similar to the magnetic field sensor 300 of FIGS. 3-5, the magnetic field sensor 600 of FIG. 6, of the magnetic field sensor 700 of FIGS. 7-9. However, the magnetic field sensor 1500 is not shown in the rotated position described above in conjunction with FIGS. 5 and 9. Nevertheless the magnetic field sensor 2200 can be rotated into or out of the page in the same way.

As described above in conjunction with FIG. 21, the eight magnetoresistance elements 2104a, 2104b, 2106a, 2106b, 2108a, 2108b, 2110a, 2110b (A1, A2, B1, B2, C1, C2, D1, D2) can be the same as or similar to the magnetic field sensing elements 304 of FIGS. 3-9.

Also as described above in conjunction with FIG. 21, the ferromagnetic target object 2118 can be the same as or similar to the gear 322 of FIGS. 3-6 or the ring magnet 702 of FIGS. 7-9.

The axis 2214 can be parallel to the axis 308 of FIGS. 3-9.

In some embodiments, the two magnetoresistance elements 2104a, 2104b (A1, A2) have a separation 2220 to the two magnetoresistance elements 2108a, 2108b (C, C2) between about one half and about one and one half of the width 2124 of the target feature 2118a, for example, a gear tooth of a ferromagnetic gear or a magnetic domain of a ferromagnetic ring magnet. In some embodiments, the two magnetoresistance elements 2104a, 2104b (A1, A2) have a separation 2220 to the two magnetoresistance elements 2108a, 2108b (C1, C2) between about one half and about twice the width 2124 of the target feature 2118a. However, in other embodiments, the separation 2220 is much smaller than half of the width 2124, for example, one one hundredth of the width 2124, or larger than twice the width 2124.

In some embodiments used in examples below, the separation 2220 is about equal to the width 2124 of the target feature 2118a.

Similarly, in some embodiments, the two magnetoresistance elements 2106a, 2106b (B1, B2) have a separation 2222 to the two magnetoresistance elements 2110a, 2110b (D1, D2) between about one half and about one and one half of the width 2124 of the target feature 2118a, for example, a gear tooth of a ferromagnetic gear or a magnetic domain of a ferromagnetic ring magnet. In some embodiments, the two magnetoresistance elements 2106a, 2106b (B1, B2) have a separation 2222 to the two magnetoresistance elements 2110a, 2110b (D1, D2) between about one half and about twice the width 2124 of the target feature 2118a. However, in other embodiments, the separation 2221 is much smaller than half of the width 2124, for example, one one hundredth of the width 2124, or larger than twice the width 2124.

In some embodiments used in examples below, the separation 2222 is about equal to the width 2124 of the target feature 2118a.

In some other embodiments, the two magnetoresistance elements 2104a, 2104b (A1, A2) have a separation 2224 to the two magnetoresistance elements 2106a, 2106b (B1, B2) between about one half and about one and one half of the width 2124 of the target feature 2118a. In some other embodiments, the two magnetoresistance elements 2104a, 2104b (A1, A2) have a separation 2224 to the two magnetoresistance elements 2106a, 2106b (B1, B2) between about one half and twice the width 2124 of the target feature 2118a. However, in other embodiments, the separation 2224 is much smaller than half of the width 2124, for example, one one hundredth of the width 2124, or larger than twice the width 2124.

In some embodiments used in examples below, the separation 2224 is about equal to the width 2124 of the target feature 2118a.

Similarly, in some other embodiments, the two magnetoresistance elements 2108a, 2108b (C1, C2) have a separation 2226 to the two magnetoresistance elements 2110a, 2110 b (D1, D2) between about one half and about one and one half of the width 2124 of the target feature 2118a. In some other embodiments, the two magnetoresistance elements 2108a, 2108b (C1, C2) have a separation 2226 to the two magnetoresistance elements 2110a, 2110b (D1, D2) between about twice the width 2124 of the target feature 2118a. However, in other embodiments, the separation 2226 is much smaller than half of the width 2124, for example, one one hundredth of the width 2124, or larger than twice the width 2124.

In some embodiments used in examples below, the separation 2226 is about equal to the width 2124 of the target feature 2118a.

In operation, the eight magnetoresistance elements 2104a, 2104b, 2106a, 2106b, 2108a, 2108b, 2110a, 2110b (A1, A2, B1, B2, C1, C2, D1, D2) can generate at least two output signals. Figures shown and described below are representative of a variety of ways in which the eight magnetoresistance elements 2104a, 2104b, 2106a, 2106b, 2108a, 2108b, 2110a, 2110b (A1, A2, B1, B2, C1, C2, D1, D2) can generate at least two output signals.

Using as an example the target feature 2118aa with a width 2124 equal to the spacings 2220, 2222, when the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2), it can be shown that any magnetoresistance element(s) (e.g., 2104a, 4104b, 2106a, 2106b (A1, A2, B1, B2) on one side of a center of the target feature 2118a experiences a projected magnetic field pointed in one direction along the axis 2114, and any magnetoresistance element(s) (e.g., 2108a, 2108b, 2110a, 2110b (C1, C2, D1, D1)) on the other side of the center of the target feature 2118a experiences a projected magnetic field pointed in the other direction.

Therefore, when the target feature 2118a is centered about eight magnetoresistance elements 2104a, 2104b, 2106a, 2106b, 2108a, 2108b, 2110a, 2110b (A1, A2, B1, B2, C1, C2, D1, D2), any magnetoresistance element(s) (e.g., 2104a, 2104b, 2106a, 2106b (A1, A2, B1, B2)) on one side of the center of the target feature 2118a changes resistance in one direction, and any magnetoresistance element(s) (e.g., 2108a, 2108b, 2110a, 2110b (C1, C2, D1, D2)) on the other side of the center of the target feature 2118a changes resistance in the other direction.

In contrast, when an edge of the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2), it can be shown that the four magnetoresistance elements 2104a, 2104b, 2110a, 2110b (A1, A2, D1, D2) experience projected magnetic fields pointed in the same direction along the axis 2114. Thus, resistances the four magnetoresistance elements 2104a, 2104b, 2110a, 2110b (A1, A2, D1, D2) change in the same direction.

At the same time, when an edge of the target feature 2118a is centered, the four magnetoresistance elements 2106a, 2106b, 2108a, 2108b (B1, B2, C1, C2) experience projected magnetic fields pointed in the same direction along the axis 2116, but opposite in direction from the projected magnetic fields experienced by the four magnetoresistance elements 2104a, 2104b, 2110a, 2110b (A1, A2, D1, D2). Thus, resistance of four magnetoresistance elements 2106a, 2106b, 2108a, 2108b (B1, B2, C1, C2) change in the same direction but opposite to the resistance change of the four magnetoresistance elements 2104a, 2104b, 2110a, 2110b (A1, A2, D1, D2).

While a particular example of the spacings 2220, 2222 and 2224, 2226 relative to the width 2124 of the target feature 2118a is given above, it should be appreciated that for other relative dimensions, magnetic fields at the eight magnetoresistance elements 2104a, 2104b, 2106a, 2106b, 2108a, 2108b, 2110a, 2110b (A1, A2, B1, B2, C1, C2, D1, D2) may not be exactly as described above and some resistance changes may be in other directions. However, it should be apparent how to modify equations shown in figures below to accomplish both a feature signal and an edge signal.

While a magnet like the magnet 332 of FIG. 3 is not shown, it should be understood that in some embodiments, the magnetic field sensor 2200 can include a magnet.

Referring now to FIGS. 23-26, four different arrangements of the eight magnetoresistance elements 2104a, 2104b, 2106a, 2106b, 2108a, 2108b, 2110a, 2110b (A1, A2, B1, B2, C1, C2, D1, D2) of FIGS. 21 and 22 are shown. In each arrangement, the eight magnetoresistance elements 2104a, 2104b, 2106a, 2106b, 2108a, 2108b, 2110a, 2110b (A1, A2, B1, B2, C1, C2, D1, D2) are coupled into two different bridge circuits. Unlike bridges described above which treat signals V1, V2 from bridges as two separate signals, in FIGS. 23-26, signals V1, V2 are treated as differential signal and any sums or differences of the signals V1, V2 are taken with the differential signals.

Polarities of the differential signals V1, V2 are indicated with plus and minus symbols. Reversal of the plus and minus symbols results in changes to equations shown in the figures.

Figure 23:
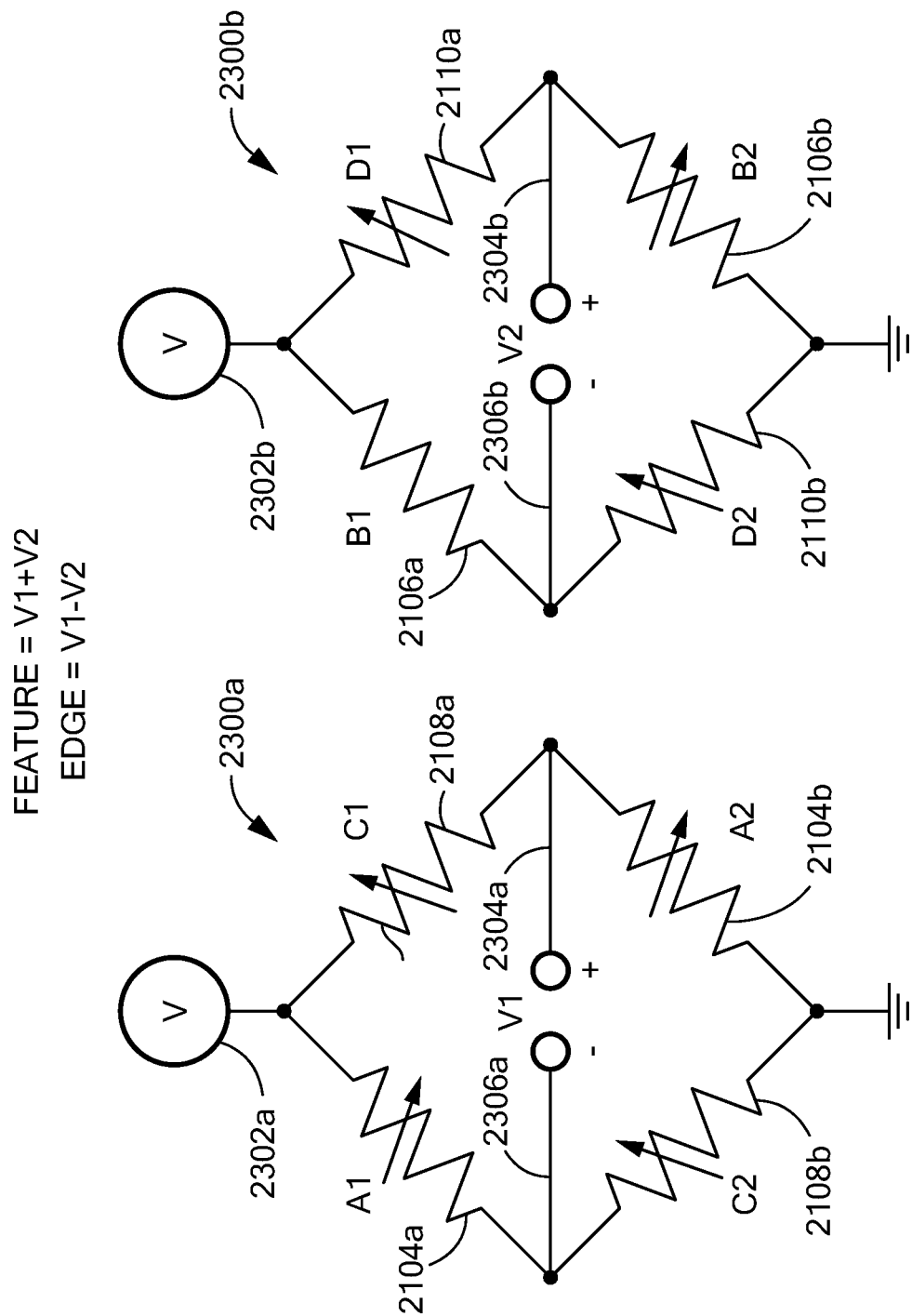
FIG. 23 is a schematic diagram showing an example of eight magnetoresistance elements arranged in two bridges, where the eight magnetoresistance elements can be used as any of the magnetic field sensing elements of FIGS. 3-9 and as the eight magnetoresistance elements of FIGS. 21 and 22.

Referring now to FIG. 23, in which like elements of FIGS. 21 and 22 are shown having like reference designations, the eight magnetoresistance elements 2104a, 2104b, 2106a, 2106b, 2108a, 2108b, 2110a, 2110b (A1, A2, B1, B2, C1, C2, D1, D2) are coupled in two bridge arrangements 2300a, 2300b The bridge 2300a can be powered by a voltage source 2302a and the bridge 2300b can be powered by a voltage source 2302b. Two differential output signals 2304a, 2306a=V1, 2304a, 2306b=V2 result. Designations V1 and V2 are used below for clarity.

The two output signals V1, V2 are treated as two differential signals V1, V2.

Processing of the two differential signals V1, V2 is described more fully below in conjunction with FIG. 27. However, let it suffice here to say that, with these arrangements, a sum V1+V2 of the two signals V1, V2 has a maximum (positive or negative) instantaneous value when the object feature 2118a of FIGS. 21 and 22 is centered about the eight magnetoresistance elements 2104a, 2104b, 2106a, 2106b, 2108a, 2108b, 2110a, 2110b (A1, A2, B1, B2, C1, C2, D1, D2). The sum V1+V2, therefore, provides a feature signal.

In contrast, a difference V1−V2 of the two output signals V1, V2 has a maximum (positive or negative) instantaneous value when an edge of the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2).

A magnetic field sensor using the two bridges 2300a, 2300b and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using the two bridges 2300a, 2300b to operate with a true-power-on-state (TPOS) function.

A magnetic field sensor using the two bridges 2300a, 2300b is well suited for the arrangements of FIGS. 21 and 22.

Figure 24:
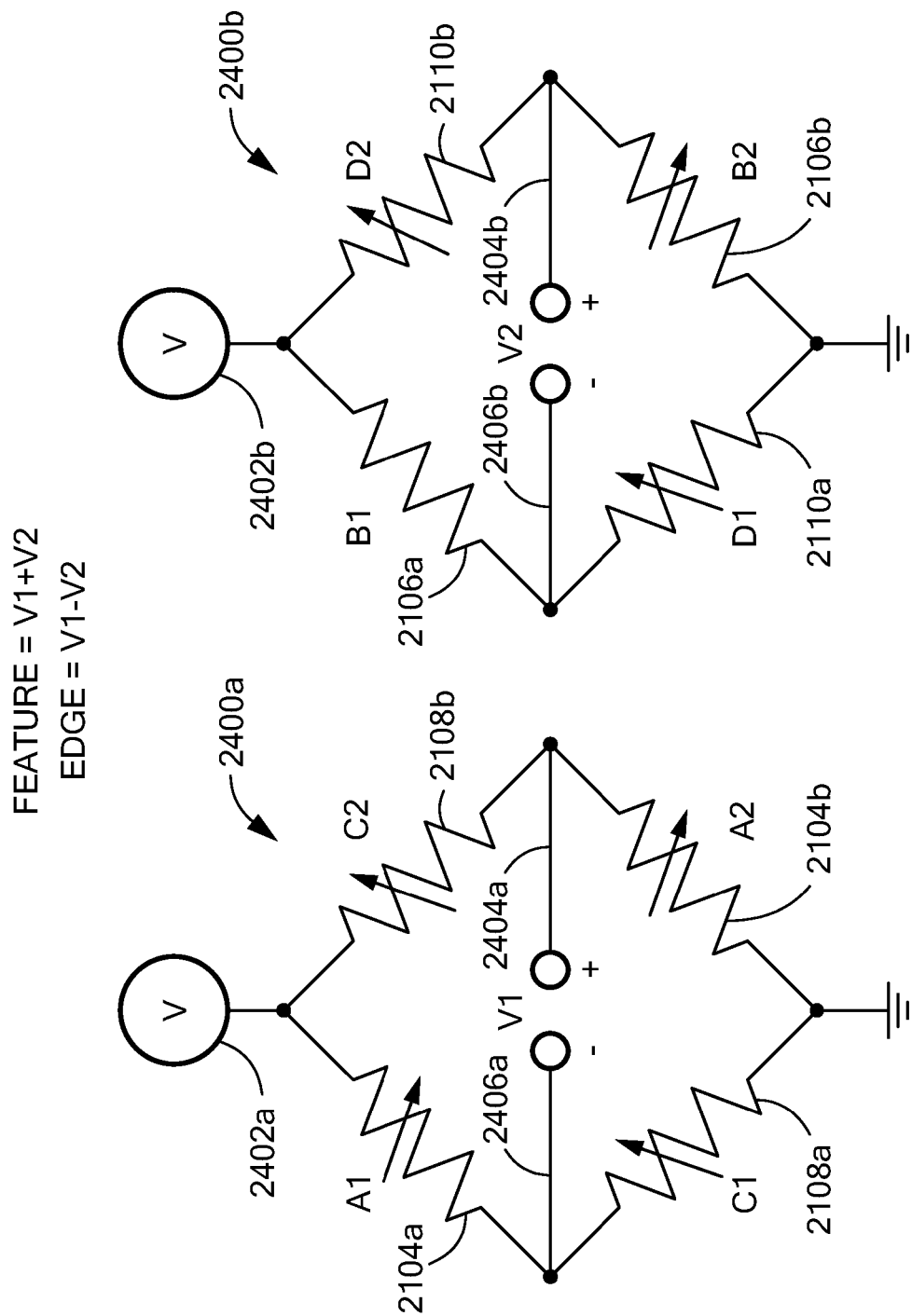
FIG. 24 is a schematic diagram showing another example of eight magnetoresistance elements arranged in two bridges, where the eight magnetoresistance elements can be used as any of the magnetic field sensing elements of FIGS. 3-9 and as the eight magnetoresistance elements of FIGS. 21 and 22.

Referring now to FIG. 24, in which like elements of FIGS. 21 and 22 are shown having like reference designations, the eight magnetoresistance elements 2104a, 2104b, 2106a, 2106b, 2108a, 2108b, 2110a, 2110b (A1, A2, B1, B2, C1, C2, D1, D2) are coupled in two bridge arrangements 2400a, 2400b The bridge 2400a can be powered by a voltage source 2402a and the bridge 2400b can be powered by a voltage source 2402b. Two differential output signals 2404a, 2406a=V1, 2406a, 2406b=V2 result. Designations V1 and V2 are used below for clarity.

The two output signals V1, V2 are treated as two differential signals V1, V2.

Processing of the two differential signals V1, V2 is described more fully below in conjunction with FIG. 27. However, let it suffice here to say that, with these arrangements, a sum V1+V2 of the two signals V1, V2 has a maximum (positive or negative) instantaneous value when the object feature 2118a of FIGS. 21 and 22 is centered about the eight magnetoresistance elements 2104a, 2104b, 2106a, 2106b, 2108a, 2108b, 2110a, 2110b (A1, A2, B1, B2, C1, C2, D1, D2). The sum V1+V2, therefore, provides a feature signal.

In contrast, a difference V1−V2 of the two output signals V1, V2 has a maximum (positive or negative) instantaneous value when an edge of the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2). Largest signals can be achieved when the distances 2120, 2122 are equal to the distance 2124.

A magnetic field sensor using the two bridges 2400a, 2400b and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using the two bridges 2400a, 2400b to operate with a true-power-on-state (TPOS) function.

A magnetic field sensor using the two bridges 2400a, 2400b is well suited for the arrangements of FIGS. 21 and 22.

Figure 25:
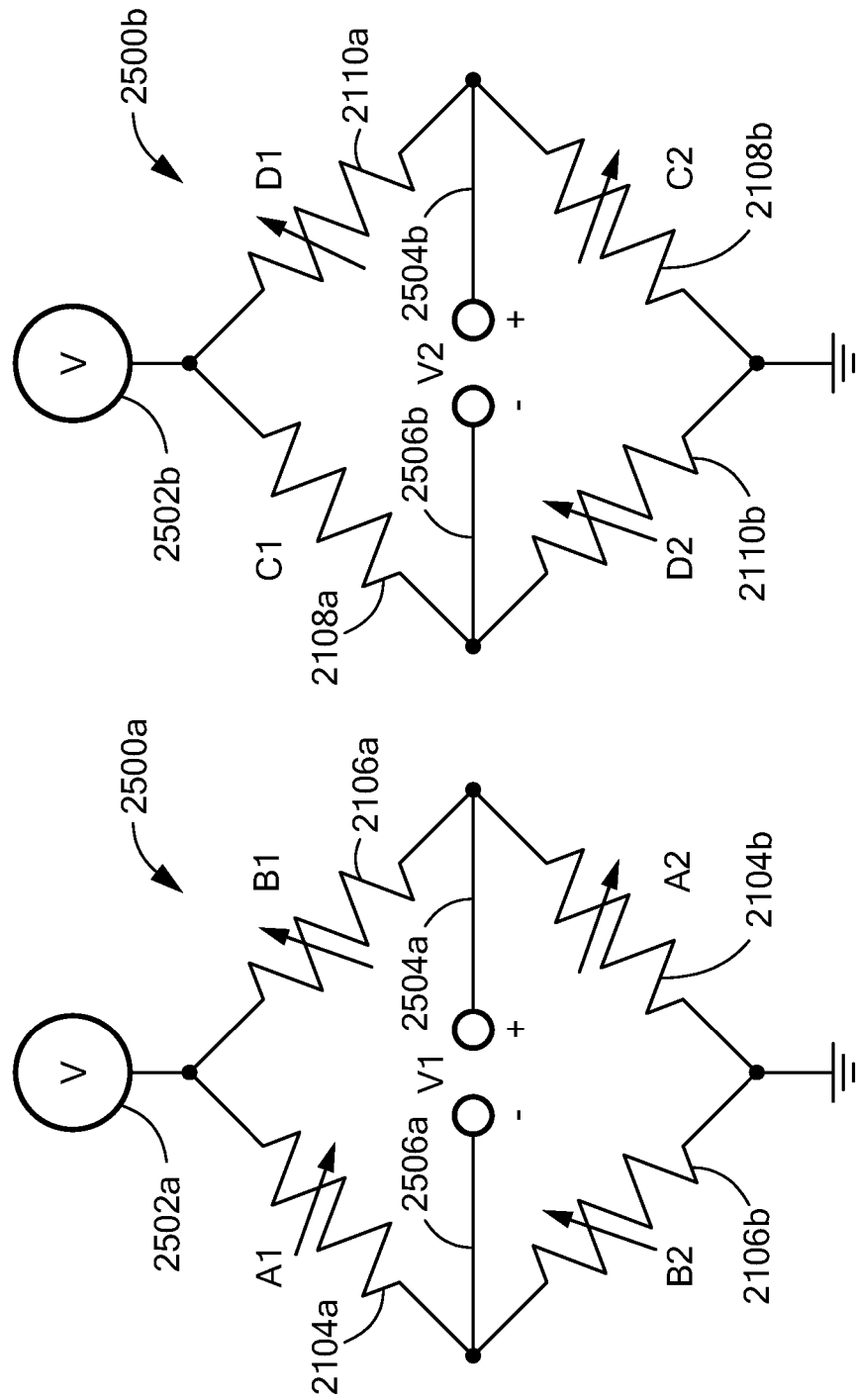
FIG. 25 is a schematic diagram showing an example of eight magnetoresistance elements arranged in two bridges, where the eight magnetoresistance elements can be used as any of the magnetic field sensing elements of FIGS. 3-9 and as the eight magnetoresistance elements of FIGS. 21 and 22.

Referring now to FIG. 25, in which like elements of FIGS. 21 and 22 are shown having like reference designations, the eight magnetoresistance elements 2104a, 2104b, 2106a, 2106b, 2108a, 2108b, 2110a, 2110b (A1, A2, B, B2, C1, C2, D1, D2) are coupled in two bridge arrangements 2500a, 2500b The bridge 2500a can be powered by a voltage source 2502a and the bridge 2500b can be powered by a voltage source 2502b. Two differential output signals 2504a, 2506a=V1, 2506a, 2506b=V2 result. Designations V1 and V2 are used below for clarity.

The two output signals V1, V2 are treated as two differential signals V1, V2.

Processing of the two differential signals V1, V2 is described more fully below in conjunction with FIG. 27. However, let it suffice here to say that, with these arrangements, a sum V1+V2 of the two signals V1, V2 has a maximum (positive or negative) instantaneous value when the object feature 2118a of FIGS. 21 and 22 is centered about the eight magnetoresistance elements 2104a, 2104b, 2106a, 2106b, 2108a, 2108b, 2110a, 2110b (A1, A2, B1, B2, C1, C2, D1, D2). The sum V1+V2, therefore, provides a feature signal.

In contrast, a difference V1−V2 of the two output signals V1, V2 has a maximum (positive or negative) instantaneous value when an edge of the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2).

A magnetic field sensor using the two bridges 2500a, 2500b and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using the two bridges 2500a, 2500b to operate with a true-power-on-state (TPOS) function.

A magnetic field sensor using the two bridges 2600a, 2600b is best suited for the arrangement of FIG. 21, but can also function with the arrangement of FIG. 22.

Figure 26:
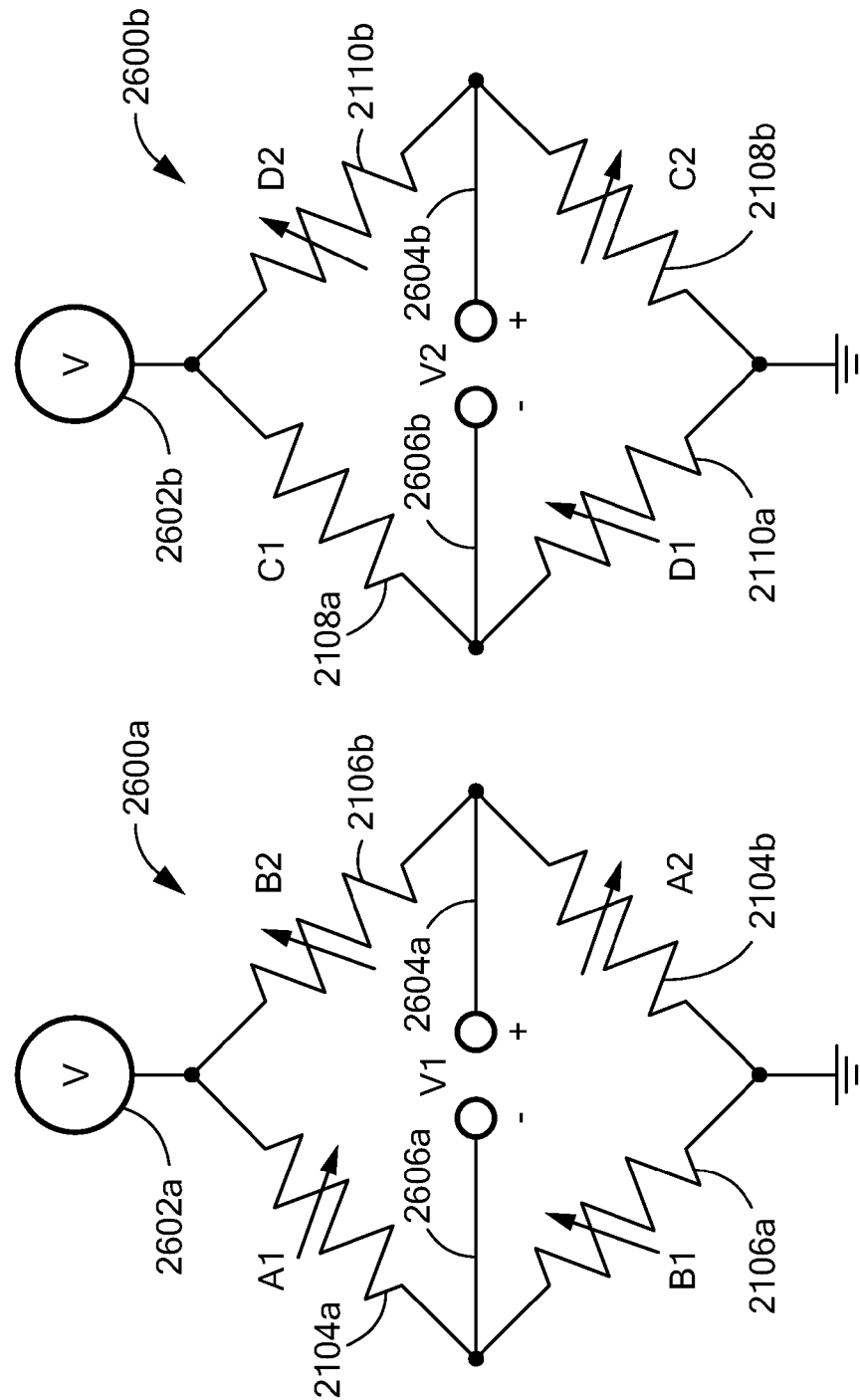
FIG. 26 is a schematic diagram showing an example of eight magnetoresistance elements arranged in two bridges, where the eight magnetoresistance elements can be used as any of the magnetic field sensing elements of FIGS. 3-9 and as the eight magnetoresistance elements of FIGS. 21 and 22.

Referring now to FIG. 26, in which like elements of FIGS. 21 and 22 are shown having like reference designations, the eight magnetoresistance elements 2104a, 2104b, 2106a, 2106b, 2108a, 2108b, 2110a, 2110b (A1, A2, B1, B2, C1, C2, D1, D2) are coupled in two bridge arrangements 2600a, 2600b The bridge 2600a can be powered by a voltage source 2602a and the bridge 2600b can be powered by a voltage source 2602b. Two differential output signals 2604a, 2606a=V1, 2306a, 2306b=V2 result. Designations V1 and V2 are used below for clarity.

The two output signals V1, V2 are treated as two differential signals V1, V2.

Processing of the two differential signals V1, V2 is described more fully below in conjunction with FIG. 27. However, let it suffice here to say that, with these arrangements, a sum V1+V2 of the two signals V1, V2 has a maximum (positive or negative) instantaneous value when the object feature 2118a of FIGS. 21 and 22 is centered about the eight magnetoresistance elements 2104a, 2104b, 2106a, 2106b, 2108a, 2108b, 2110a, 2110b (A1, A2, B1, B2, C1, C2, D1, D2). The sum V1+V2, therefore, provides a feature signal.

In contrast, a difference V1−V2 of the two output signals V1, V2 has a maximum (positive or negative) instantaneous value when an edge of the target feature 2118a is centered about (i.e., between) the eight magnetoresistance elements 2104a, 2104b, 2106a, 2106b, 2108a, 2108b, 2110a, 2110b (A1, A2, B1, B2, C1, C2, D1, D2).

A magnetic field sensor using the two bridges 2600a, 2600b and using both the sum V1+V2 of the two signals V1, V2 and also the difference V1−V2 of the two signals V1, V2 can operate both as a tooth detector and a an edge detector, respectively. In some embodiments, the tooth detector capability allows a magnetic field sensor using the two bridges 2600a, 2600b to operate with a true-power-on-state (TPOS) function.

A magnetic field sensor using the two bridges 2600a, 2600b is best suited for the arrangement of FIG. 21, but can also function with the arrangement of FIG. 22.

While various two bridge arrangements are shown in FIGS. 23-26, there are other similar bridge arrangements that can be used to generate a feature signal and an edge signal.

Figure 27:
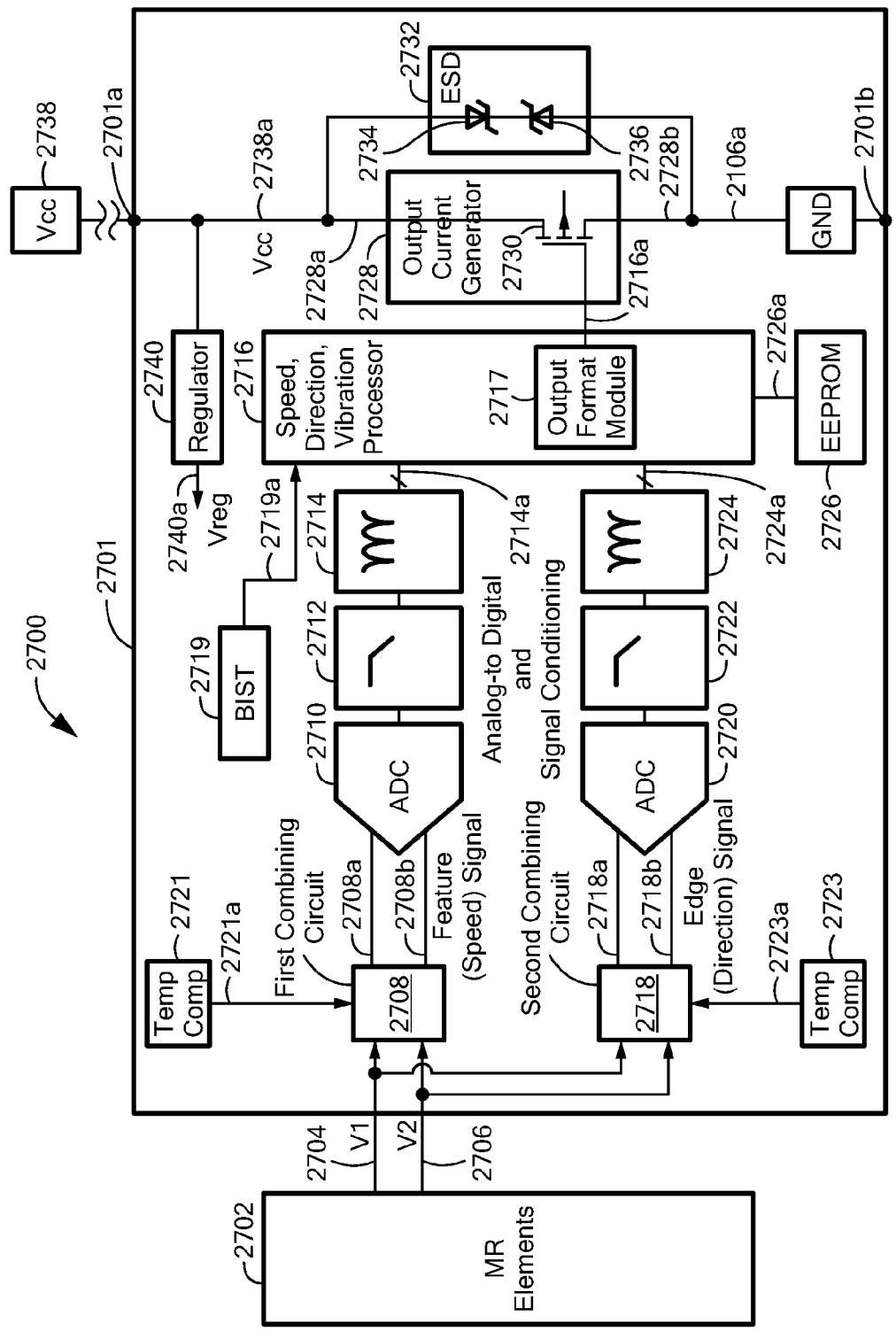
FIG. 27 is a schematic diagram showing an electronic circuit that can be used to process two signals generated by any of the above magnetic field sensors.

Referring now to FIG. 27, an example of a magnetic field sensor 2700 can include an electronic circuit 2701 that can be the same as or similar to the electronic circuit 314 of FIGS. 3-9, the same as or similar to the electronic circuit 1006 of FIG. 10, the same as or similar to the electronic circuit 1412 of FIGS. 14 and 15, and the same as or similar to the electronic circuit 2122 of FIGS. 21 and 22. The electronic circuit 2700 and can be coupled to magneto resistance elements 2702, which can be the same as or similar to magnetoresistance elements described above in conjunction with FIGS. 10-26. As described above, the magnetoresistance elements of FIGS. 10-26 generate two signals V1=2704, V2=2706, which may be single ended or differential signals.

In a first channel, a first combining circuit 2708 is coupled to receive the two signals 2704, 2706 (V1, V2), and configured to generate a differential feature signal 2708a, 2708b. The differential feature signal 2708, 2708 is a feature signal indicative of the proximity of a feature of a ferromagnetic target object. Feature signals are described above in conjunction with FIGS. 10-26. While a differential feature signal 2708a, 2708b is shown, a feature signal can also be single ended.

Depending on of the arrangement of the magnetoresistance elements 2702, the first combining circuit 2708 can be a summing circuit or a differencing circuit. The type of the first combining circuit 2708 will be apparent from nomenclature used on FIGS. 10-26.

An analog-to-digital converter (ADC) 2710 is coupled to receive the differential combined signal 2708a, 2708b and configured to generate a converted signal.

A digital low pass filter 2712 is coupled to receive the converted signal and configured to generate a low pass filtered signal. Another digital filter 2714, for example, a digital notch filter, can be coupled to receive the low pass filtered signal and configured to generate a notch filtered signal 2714a. However, in some other embodiments, the digital filter 2714 can be a digital low pass filter.

In a second channel, a second combining circuit 2718 is coupled to receive the two signals 2704, 2706 (V1, V2), and configured to generate a differential edge signal 2718a, 2718b. The differential edge signal 2718a, 2718b is an edge signal indicative of the proximity of and edge of a feature of a ferromagnetic target object. Feature signals are described above in conjunction with FIGS. 10-26. While a differential edge signal 2718a, 2718b is shown, an edge signal can also be single ended.

Depending on of the arrangement of the magnetoresistance elements 2702, the second combining circuit 2718 can be a summing circuit or a differencing circuit. The type of the second combining circuit 2718 will be apparent from nomenclature used on FIGS. 10-26.

An analog-to-digital converter (ADC) 2720 is coupled to receive the differential combined signal 2718a, 2718b and configured to generate a converted signal.

A digital low pass filter 2722 is coupled to receive the converted signal and configured to generate a low pass filtered signal. Another digital filter 2724, for example, a digital notch filter, can be coupled to receive the low pass filtered signal and configured to generate a notch filtered signal 2724a.

A speed, direction, vibration processor 2716 is coupled to receive the notch filtered signal 2714a and the notch filtered signal 2724a. The speed, direction, vibration processor is configured to generate a signal 2716a indicative of a speed of movement of a ferromagnetic target object to which the magnetoresistance elements 2702 are proximate, a direction of movement of the ferromagnetic target object, and, in some embodiments, a vibration of the ferromagnetic target object. Speed and direction detection are described below in conjunction with FIG. 28.

Speed and direction processing is further described below in conjunction with FIG. 28. Vibration processing can be of a type, for example, described in U.S. Pat. No. 7,772,838, issued Aug. 10, 2010 or in U.S. Pat. No. 8,450,996, issued May 28, 2013, or in U.S. Pat. No. 7,253,614, issued Aug. 7, 2007, all of which are assigned to the assignee of the present application, and all of which are incorporated by reference herein in their entirety.

The electronic circuit can also include a built-in-self-test (BIST) module 2179 configured to perform one or more self-tests of the magnetic field sensor 2700 and configured to generate a self-test signal 2719a representative of self-test results. The self-test results can be merged into the signal 2716a so that the signal 2716a is indicative of at least one of a speed of movement of a ferromagnetic target object, a direction of movement of the ferromagnetic target object, or the self-test results. To this end, the speed, direction, vibration processor 2716 can include or otherwise be coupled to an output format module 2717 configured to provide the signal 2716a as a formatted signal. The formatted signal can be of a type described in U.S. Pat. No. 7,026,808, issued Apr. 11, 2006, or in any of the above-described patents and patent applications, all of which are assigned to the assignee of the present application, and all of which are incorporated by reference herein in their entirety In some embodiments, the signal 2716a is provided as an output signal from the electronic circuit 2701. However, in the example shown, the electronic circuit 2701 has only two coupling nodes for a so-called "two wire arrangement," a signal/power node 2701a and a ground node 2701b.

In the two wire arrangement, an output current generator 2728 is coupled to receive the signal 2716a and configured to generate a current signal flowing between terminals 2728a and 2728b. At the same time, the output current generator 2728 is coupled to receive a voltage signal from a power supply (Vcc) 2738 disposed outside of the electronic circuit 2701. A resulting signal 2738a is both a voltage supply signal and a current signal, and is referred to herein as voltage/current signal 2738a. It will be apparent how to extract the current signal from the voltage/current signal 2738a.

A voltage regulator 2740 can be coupled to receive the voltage/current signal 2738a and configured to generate a regulated voltage 2740a distributed throughout the electronic circuit 2701.

The electronic circuit 2701 can include an electrically erasable programmable read-only memory (EEPROM) 2726 configured to hold configuration values provided to the speed, direction, vibration processor 2716 as a signal 2726a. The values stored in the EEPROM 2726 can include, but are not limited to, static or computed threshold values (see, e.g., 2810a, 2810b, 2812a, 2812b of FIG. 28), a number of peaks and valley value that can determine when an action is taken, and edge count value associate with transitions of POSCOMP signals (see, e.g., 2806, 2808 of FIG. 28), and/or signal values of the above-described edge and feature signals that can be used to identify the peak-to-peak values described below. In some embodiments, the EEPROM 2726 can also store a value indicative of whether the above-described edge signals or the above-described feature signals are used to provide timing markers for output pulses in the signal 2716*a*. Output pulses are described more fully below in conjunction with FIG. 28.

The output current generator 2728 can include a field effect transistor (FET) 2730.

Two zener diodes 2734, 2736 can be coupled in series across the output current generator 2728 and 10 provide electrostatic discharge (ESD) protection.

In some embodiments, the electronic circuit can include temperature compensation modules 2721, 2723 configures to provide temperature compensation control signals 2721*am* 2723*a* to control characteristics of the electronic circuit, for example, a gain of the combining circuits 2798, 2718

Figure 28:
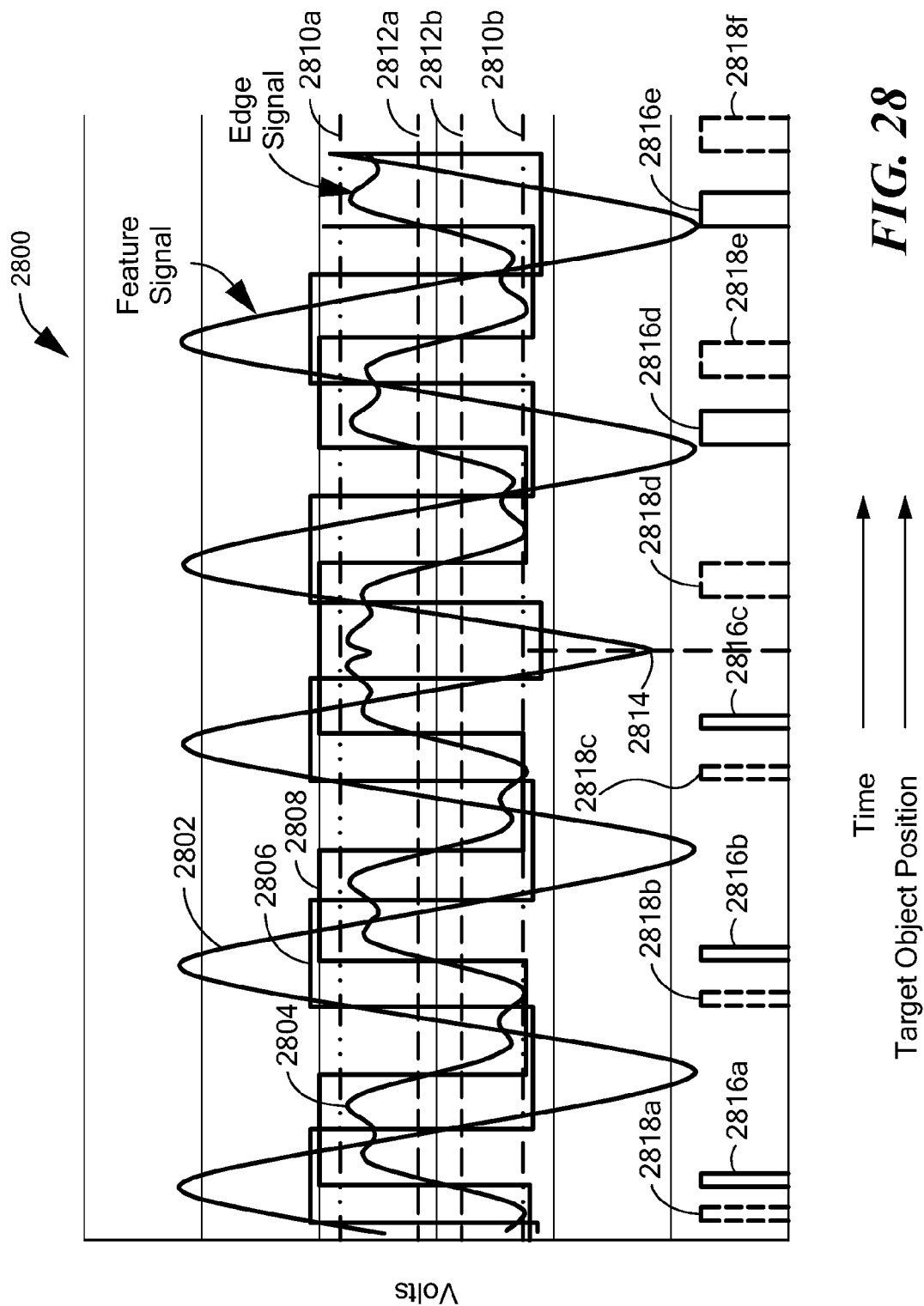
FIG. 28 is a graph showing an example of the two signals generated by any of the above magnetic field sensors.

Referring now to FIG. 28, a graph 2800 has a horizontal axis with a scale in units of time in arbitrary units or in units of position of a moving ferromagnetic target object in arbitrary units. The graph 2800 has a vertical axis with a scale in units of volts in arbitrary units.

A signal 2802 is representative of a feature signal as may be generated by any of the magnetic field sensors, bridges, or combinations of individual magnetoresistance elements described above in conjunction with FIGS. 3-26, when proximate to a rotating ferromagnetic target object. For example, the signal 2802 is representative of the differential feature signal 2708*a*, 2708*b* of FIG. 27. As described above, a feature signal has a maximum (positive or negative) value when a feature of a ferromagnetic target object is proximate to (i.e., centered about) magnetoresistance elements shown and described above.

A signal 2804 is representative of an edge signal as may be generated by any of the magnetic field sensors, bridges, or combinations of individual magnetoresistance elements described above in conjunction with FIGS. 3-26, when proximate to a rotating ferromagnetic target object. For example, the signal 2802 is representative of the differential edge signal 2718*a*, 2718*b* of FIG. 27. As described above, an edge signal has a maximum (positive or negative) value when an edge of a feature of a ferromagnetic target object is proximate to (i.e., centered about) magnetoresistance elements shown and described above.

The feature signal 2802 and the edge signal 2804 have a known phase difference, a sign of which is determined by the direction of rotation of the ferromagnetic target object. For a ferromagnetic target object that has features that are the same width as widths of absence of features (e.g., gear teeth the same width as gear valleys, or north poles the same width as south poles) the known phase relationship is ninety degrees.

A rotation direction change is shown to occur at a line 2814, at which time, the phase difference between the feature signal 2802 and the edge signal 2804 (also 2806, 2808) reverses.

It should be apparent that the speed, direction, vibration processor 2716 of FIG. 27 can calculate a frequency or rate of either one of the feature signal 2802 or the edge signal 2804 to determine the speed of rotation of the ferromagnetic target object. It should also be apparent that the speed, direction, vibration processor 2716 of FIG. 27 can calculate a sign of the phase difference between the feature signal 2802 and the edge signal 2804 to determine the direction of rotation of the ferromagnetic target object.

To this end, the speed, direction, vibration processor 2716 of FIG. 27 can internally generate so-called POSCOMP signals 2806, 2808, which can be digital signals. While represented here as signals, the magnetic field sensor 2700 of FIG. 27 can instead merely generate binary state transitions at each of edge of what are shown to be the POSCOMP signals 2806, 2808.

The signal 2806 can be generated by comparing the signals 2802 against upper and lower threshold values 2810*a*, 2810*b*. The signal 2808 can be generated by comparing the signal 2804 against upper and lower threshold values 2812*a*, 2812*b*.

To this end, the threshold values 2810*a*, 2810*b*, 2812*a*, 2812*b* can be computed by the speed, direction, vibration processor 2716 of FIG. 27 in a variety of ways. In some embodiments, the threshold values 2810*a*, 2810*b* can be computed according to detected peak-to-peak values of the signal 2802. Similarly, the threshold values 2812*a*, 2812*b* can be computed according to detected peak-to-peak values of the signal 2804. For example, in some embodiments, an upper threshold value can be about sixty percent of a peak-to-peak value of a corresponding signal 2802 or 2804 and a lower threshold value can be about forty percent of a peak-to-peak value of a corresponding signal 2802 or 2804. Other ways in which threshold values can be generated are described below.

It should be apparent that the signals 2806, 2808 maintain a phase difference close to ninety degree for each of the rotation directions of the ferromagnetic target object, which changes direction at the time 2814.

The signal 2716*a* generated by the speed, direction, vibration processor 2716 of FIG. 27 can encode speed, direction, and optionally, vibration and/or self-test results in a variety of different ways into one signal. Some ways are described, for example in U.S. Pat. No. 7,026,808, issued Apr. 11, 2006, in U.S. Pat. No. 7,772,838, issued Aug. 10, 2014, and in U.S. Pat. No. 8,624,588, issued Jan. 7, 2014, all of which are assigned to the assignee of the present application, and all of which are incorporated by reference in their entirety. Other formats are also possible.

One encoding (see, e.g., U.S. Pat. No. 7,026,808) is represented by pulses 2816*a*-2816*e*, wherein rising edges of the signal 2806 result in pulses 2816*a*-2816*c* having a first pulse width, for example forty-five microseconds, when the ferromagnetic target object rotates or moves in a first direction before the time 2814. After the time 2814, when the ferromagnetic target object rotates or moves in the other direction, rising edges of the signal 2806 result in pulses 2816*d*, 2816*e* having a second different pulse width, for example, ninety or one hundred eighty microseconds.

Another different timing of the same type of encoding (see, e.g., U.S. Pat. No. 7,026,808) is represented by pulses 2818*a*-2818*f*, wherein rising edges of the signal 2808 result in pulses 2818*a*-2818*c* having a first pulse width, for example forty-five microseconds, when the ferromagnetic target object rotates or moves in a first direction before the time 2814. After the time 2814, when the ferromagnetic target object rotates or moves in the other direction, rising edges of the signal 2808 result in pulses 2818*d*-2818*f* having a second different pulse width, for example, ninety or one hundred eighty microseconds.

A value representative of which one of the signals 2806, 2808 to use to align pulses can be stored in the EEPROM 2726 of FIG. 27. In some embodiments, a user can select the value. However, in other embodiments, the magnetic field sensor 2700 o FIG. 27 can be fabricated to use one or the other signal.

It should be understood that, depending upon the application in which the magnetic field sensor 2700 of FIG. 27 is used, it may be desirable to generate the signal 2716a with pulses, e.g., 2816a-2816e, 2818a-2818f, (or other encoding) aligned with peaks of the feature signal 2802, peaks of the edge signal 2804, zero crossings of the feature signal 2802, or zero crossings of the edge signal 2804. The above-described selection or option of whether to use transitions of the signal 2806 or transitions of the signal 2808 with which to align the pulses is one way to provide the selected alignment. Also, selection of the threshold values 2810a, 2810b, 2812a, 2812b can affect the alignment.

While the threshold values 2810a, 2810b, 2812a, 2812b described above correspond to thresholds determined by threshold (peak-to-peak percentage) detectors, other embodiments can use peak (peak referenced) detectors, for which thresholds tend to be much closer to peak values of the signals 2802, 2804. As described above, manipulation of the threshold values can also result it manipulation of alignment of the pulses (or other encoding) in the signal 2716a.

Some types of threshold detectors are described, for example in U.S. Pat. No. 6,525,531, issued Feb. 25, 2003 and some types of peak detectors are described, for example, in U.S. Pat. No. 7,368,904, issued May 6, 2008 and in U.S. Pat. No. 6,693,419, issued Feb. 17, 2004, all of which are assigned to the assignee of the present application, and all of which are incorporated by reference herein.

All references cited herein are hereby incorporated herein by reference in their entirety. Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A magnetic field sensor for sensing a movement of a ferromagnetic target object having ferromagnetic target object features with a target feature width, comprising:
   a substrate;
   a first full bridge circuit disposed upon the substrate and proximate to the ferromagnetic target object, comprising:
      a first magnetoresistance element;
      a second magnetoresistance element, the first and second magnetoresistance elements proximate to each other forming a first proximate pair;
      a third magnetoresistance;
      a fourth magnetoresistance element, the third and fourth magnetoresistance elements proximate to each other forming a second proximate pair;
      a first noninverting output node joining a selected two of the first, second, third and fourth magnetoresistance elements;
      a first inverting output node joining a different selected two of the first, second, third and fourth magnetoresistance elements, wherein a first differential signal is generated between the first noninverting node and the first inverting node, wherein the magnetic field sensor further comprises:
   a second full bridge circuit disposed upon the substrate and proximate to the ferromagnetic target object, comprising:
      a fifth magnetoresistance element;
      a sixth magnetoresistance element, the fifth and sixth magnetoresistance elements proximate to each other forming a third proximate pair;
      a seventh magnetoresistance element;
      an eighth magnetoresistance element, the seventh and eighth magnetoresistance elements proximate to each other forming a fourth proximate pair;
      a second noninverting output node joining a selected two of the fifth, sixth, seventh, and eighth magnetoresistance elements; and
      a second inverting output node joining a different selected two of the fifth, sixth, seventh, and eighth magnetoresistance elements, wherein a second differential signal is generated between the second noninverting node and the second inverting node, wherein the magnetic field sensor further comprises:
   a first combining circuit disposed upon the substrate and configured to combine the first differential signal and the second differential signal to generate a feature signal having a largest value when a ferromagnetic target object feature is centered with the first and second full bridge circuits; and
   a second combining circuit disposed upon the substrate and configured to combine the first differential signal and the second differential signal to generate an edge signal having a largest value when the first full bridge circuit is on one side of an edge of a ferromagnetic target object feature and the second full bridge circuit is on the other side of the same edge.

2. The magnetic field sensor of claim 1, wherein the first, second, third, and fourth proximate pairs are disposed in a line parallel to a tangent to a direction of movement of the ferromagnetic target object.

3. The magnetic field sensor of claim 1, wherein the first and fourth proximate pairs are disposed in a first line parallel to a tangent to a direction of movement of the ferromagnetic target object, and wherein the second and third proximate pairs are disposed in a second line parallel to the first line, wherein the second line is more distal from the ferromagnetic target object than the first line.

4. The magnetic field sensor of claim 1, wherein first, second, third, and fourth proximate pairs are disposed in an arc.

5. The magnetic field sensor of claim 1, further comprising a magnet for generating respective magnetic fields at the first and second magnetoresistance elements, wherein the ferromagnetic target object is disposed at a position such that movement of the ferromagnetic target object results in changes of the magnetic fields at the first and second magnetoresistance elements.

6. The magnetic field sensor of claim 1, wherein the ferromagnetic target object comprises a ring magnet having alternating north and south poles, the ring magnet for generating respective magnetic fields at the first and second magnetoresistance elements, wherein the ring magnet is disposed at a position such that movement of the ferromagnetic target object results in changes of the magnetic fields at the first and second magnetoresistance elements.

7. The magnetic field sensor of claim 1, further comprising:
   an electronic circuit disposed upon the substrate, coupled to receive the feature signal and the edge signal, and configured to compute a sign of a phase difference between the feature signal and the edge signal to generate an indication of a direction of movement of the ferromagnetic target object.

8. The magnetic field sensor of claim 1, wherein the substrate comprises first and second parallel largest surfaces, wherein the first, second, third, fourth, fifth, sixth, seventh, and eighth magnetoresistance elements are disposed in or over the first largest surface of the substrate, wherein the ferromagnetic target object has first and second parallel largest surfaces, wherein the first largest surface of the substrate is substantially parallel to the first largest surface of the ferromagnetic target object.

9. The magnetic field sensor of claim 1, wherein the feature signal and the edge signal are analog signals.

10. The magnetic field sensor of claim 1, wherein the second proximate pair is disposed between the first and third proximate pairs, and wherein the third proximate pair is disposed between the second and fourth proximate pairs.

11. The magnetic field sensor of claim 10, wherein a spacing between the first and third proximate pairs is selected to be between about one half and about two times the target feature width, and a spacing between the second and fourth proximate pairs is selected to be between about one half and about two times the target feature width.

12. The magnetic field sensor of claim 1, further comprising:
an electronic circuit disposed upon the substrate, coupled to receive the feature signal and the edge signal, wherein the electronic circuit is operable to compare the edge signal with one or more threshold values to generate a first two-state signal and operable to compare the feature signal with another one or more threshold values to generate a second two-state signal, wherein an output signal generated by the magnetic field sensor comprises a signal encoding that identifies an alignment of state transitions of a selected one of the first or the second two-state signal.

13. The magnetic field sensor of claim 12, wherein the output signal comprises pulses with a pulse rate indicative of a speed of the movement of the target object and with pulse edges aligned with the state transitions of the selected one of the first or the second two-state signal.

14. The magnetic field sensor of claim 12, wherein a relative phase between the first and second two-state signals is indicative of a direction of the movement of the ferromagnetic target object, and wherein the pulses comprise pulse widths indicative of a direction of the movement of the ferromagnetic target object.

15. The magnetic field sensor of claim 1, wherein the second proximate pair is disposed between the first and third proximate pairs, and wherein the third proximate pair is disposed between the second and fourth proximate pairs, and wherein a spacing between the first and second proximate pairs is selected to be between about one half and about two times the target feature width, and a spacing between the third and fourth proximate pairs is selected to be between about one half and about two times the target feature width.

16. The magnetic field sensor of claim 15, further comprising a magnet for generating respective magnetic fields at the first and second magnetoresistance elements, wherein the ferromagnetic target object is disposed at a position such that movement of the ferromagnetic target object results in changes of the magnetic fields at the first and second magnetoresistance elements.

17. The magnetic field sensor of claim 15, wherein the ferromagnetic target object comprises a ring magnet having alternating north and south poles, the ring magnet for generating respective magnetic fields at the first and second magnetoresistance elements, wherein the ring magnet is disposed at a position such that movement of the ferromagnetic target object results in changes of the magnetic fields at the first and second magnetoresistance elements.

18. The magnetic field sensor of claim 15, further comprising:
an electronic circuit disposed upon the substrate, coupled to receive the feature signal and the edge signal, and configured to compute a sign of a phase difference between the feature signal and the edge signal to generate an indication of a direction of movement of the ferromagnetic target object.

19. The magnetic field sensor of claim 15, wherein the substrate comprises first and second parallel largest surfaces, wherein the first, second, third, fourth, fifth, sixth, seventh, and eighth magnetoresistance elements are disposed in or over the first largest surface of the substrate, wherein the ferromagnetic target object has first and second parallel largest surfaces, wherein the first largest surface of the substrate is substantially parallel to the first largest surface of the ferromagnetic target object.

20. The magnetic field sensor of claim 15, further comprising:
an electronic circuit disposed upon the substrate, coupled to receive the feature signal and the edge signal, wherein the electronic circuit is operable to compare the edge signal with one or more threshold values to generate a first two-state signal and operable to compare the feature signal with another one or more threshold values to generate a second two-state signal, wherein an output signal generated by the magnetic field sensor comprises a signal encoding that identifies an alignment of state transitions of a selected one of the first or the second two-state signal.

21. The magnetic field sensor of claim 20, wherein the output signal comprises pulses with a pulse rate indicative of a speed of the movement of the target object and with pulse edges aligned with the state transitions of the selected one of the first or the second two-state signal.

22. The magnetic field sensor of claim 20, wherein a relative phase between the first and second two-state signals is indicative of a direction of the movement of the ferromagnetic target object, and wherein the pulses comprise pulse widths indicative of a direction of the movement of the ferromagnetic target object.

23. A magnetic field sensor for sensing a movement of a ferromagnetic target object having ferromagnetic target object features with a target feature width, comprising:
a substrate;
a first full bridge circuit disposed upon the substrate and proximate to the ferromagnetic target object, comprising:
a first magnetoresistance element;
a second magnetoresistance element, the first and second magnetoresistance elements proximate to each other forming a first proximate pair;
a third magnetoresistance;
a fourth magnetoresistance element, the third and fourth magnetoresistance elements proximate to each other forming a second proximate pair;
a first noninverting output node joining a selected two of the first, second, third and fourth magnetoresistance elements;
a first inverting output node joining a different selected two of the first, second, third and fourth magnetoresistance elements, wherein a first differential signal is generated between the first noninverting node and the first inverting node, wherein the magnetic field sensor further comprises:

a second full bridge circuit disposed upon the substrate and proximate to the ferromagnetic target object, comprising:
- a fifth magnetoresistance element;
- a sixth magnetoresistance element, the fifth and sixth magnetoresistance elements proximate to each other forming a third proximate pair;
- a seventh magnetoresistance element;
- an eighth magnetoresistance element, the seventh and eighth magnetoresistance elements proximate to each other forming a fourth proximate pair;
- a second noninverting output node joining a selected two of the fifth, sixth, seventh, and eighth magnetoresistance elements; and
- a second inverting output node joining a different selected two of the fifth, sixth, seventh, and eighth magnetoresistance elements, wherein a second differential signal is generated between the second noninverting node and the second inverting node, wherein the magnetic field sensor further comprises:

a first combining circuit disposed upon the substrate and configured to combine the first differential signal and the second differential signal to generate a feature signal having a largest value when a ferromagnetic target object feature is centered with the first and second full bridge circuits; and a second combining circuit disposed upon the substrate and configured to combine the first differential signal and the second differential signal to generate an edge signal having a largest value when the first full bridge circuit is on one side of an edge of a ferromagnetic target object feature and the second full bridge circuit is on the other side of the same edge, wherein the second proximate pair is disposed between the first and third proximate pairs, and wherein the third proximate pair is disposed between the second and fourth proximate pairs, wherein a spacing between the first and third proximate pairs is selected to be between about one half and about two times the target feature width, and a spacing between the second and fourth proximate pairs is selected to be between about one half and about two times the target feature width, the magnetic field sensor further comprising:

an electronic circuit disposed upon the substrate, coupled to receive the feature signal and the edge signal, wherein the electronic circuit is operable to compare the edge signal with one or more threshold values to generate a first two-state signal and operable to compare the feature signal with another one or more threshold values to generate a second two-state signal, wherein an output signal generated by the magnetic field sensor comprises a signal encoding that identifies an alignment of state transitions of a selected one of the first or the second two-state signal.

24. The magnetic field sensor of claim 23, wherein the output signal comprises pulses with a pulse rate indicative of a speed of the movement of the target object and with pulse edges aligned with the state transitions of the selected one of the first or the second two-state signal.

25. The magnetic field sensor of claim 23, wherein a relative phase between the first and second two-state signals is indicative of a direction of the movement of the ferromagnetic target object, and wherein the pulses comprise pulse widths indicative of a direction of the movement of the ferromagnetic target object.

* * * * *

UNITED STATES PATENT AND TRADEMARK OFFICE
CERTIFICATE OF CORRECTION

PATENT NO. : 9,719,806 B2
APPLICATION NO. : 14/529577
DATED : August 1, 2017
INVENTOR(S) : Andrea Foletto et al.

It is certified that error appears in the above-identified patent and that said Letters Patent is hereby corrected as shown below:

Column 3, Line 56, delete "result it" and replace with --result in--.

Column 5, Line 9, delete "sensor dispose" and replace with --sensor disposed--.

Column 5, Lines 21-22, delete "sensor dispose" and replace with --sensor disposed--.

Column 5, Line 26, delete "sensor dispose" and replace with --sensor disposed--.

Column 9, Line 48, delete "and electronic component" and replace with --an electronic component--.

Column 9, Lines 51-52, delete "as used to describe" and replace with --is used to describe--.

Column 14, Line 16, delete "A AGCs" and replace with --AGCs--.

Column 14, Line 17, delete "Precisions rotation" and replace with --Precision rotation--.

Column 14, Line 51, delete "let is" and replace with --let it--.

Column 15, Line 51, delete "of and arrow" and replace with --of an arrow--.

Column 16, Line 16, delete "such core described above" and replace with --such as the core described--.

Column 16, Line 20, delete "of ferromagnetic target" and replace with --of a ferromagnetic target--.

Column 16, Line 42, delete "fields sensor 700" and replace with --field sensor 700--.

Column 17, Line 18, delete "circuit 1008" and replace with --circuit 1006--.

Signed and Sealed this
Thirtieth Day of October, 2018

Andrei Iancu
*Director of the United States Patent and Trademark Office*

Column 37, Line 56, delete "projected magnetic field" and replace with --"projected magnetic field."--.

Column 19, Line 12, delete "edge 1012*a*" and replace with --edge--.

Column 19, Line 21, delete "a an" and replace with --as an--.

Column 20, Line 13, delete "a an" and replace with --as an--.

Column 20, Line 60, delete "a an" and replace with --as an--.

Column 21, Line 56, delete "between about between about" and replace with --between about--.

Column 25, Line 44, delete "14010" and replace with --1410--.

Column 26, Line 30, delete "a an" and replace with --as an--.

Column 26, Line 40, delete "1704=V," and replace with --1704=V1,--.

Column 26, Line 49, delete "V1.V2" and replace with --V1, V2--.

Column 26, Line 63, delete "a an" and replace with --as an--.

Column 27, Line 23, delete "V+V2" and replace with --V1+V2--.

Column 27, Line 31, delete "a an" and replace with --as an--.

Column 27, Line 56, delete "V+V2" and replace with --V1+V2--.

Column 27, Line 66, delete "a an" and replace with --as an--.

Column 28, Line 33, delete "a an" and replace with --as an--.

Column 30, Line 39, delete "2118*aa*" and replace with --2118*a*--.

Column 30, Line 45, delete "4104*b*" and replace with --2104*b*--.

Column 30, Line 50, delete "D1))" and replace with --D2))--.

Column 30, Lines 53-54, delete "about eight" and replace with --about the eight--.

Column 30, Line 65, delete "2110*a*,2110*b*" and replace with --2110*a*, 2110*b*--.

Column 31, Line 53, delete "2112" and replace with --2122--.

Column 32, Line 10, delete "of the" and replace with --or the--.

CERTIFICATE OF CORRECTION (continued)
U.S. Pat. No. 9,719,806 B2

Column 32, Line 28, delete "(C, C2)" and replace with --(C1, C2)--.

Column 33, Line 13, delete "2110 *b*" and replace with --2110*b*--.

Column 33, Line 34, delete "2118*aa*" and replace with --2118*a*--.

Column 33, Line 40, delete "4104*b*" and replace with --2104*b*--.

Column 33, Line 45, delete "D1))" and replace with --D2))--.

Column 33, Line 65, delete "2114. Thus, resistances the" and replace with --2214. Thus, resistances of the--.

Column 34, Line 37, delete "differential signal" and replace with --differential signals--.

Column 34, Line 52, delete "2304*a*" and replace with --2304*b*--.

Column 35, Line 8, delete "a an" and replace with --as an--.

Column 35, Line 26, delete "2406*a*, 2406*b*" and replace with --2404*b*, 2406*b*--.

Column 35, Line 51, delete "a an" and replace with --as an--.

Column 36, Line 1, delete "2506*a*" and replace with --2506*b*--.

Column 36, Line 25, delete "a an" and replace with --as an--.

Column 36, Line 43, delete "2306*a*, 2306*b*=V2" and replace with --2604*b*, 2606*b*=V2--.

Column 36, Line 66, delete "a an" and replace with --as an--.

Column 37, Line 18, delete "2700 and can" and replace with --2700 can--.

Column 37, Line 28, delete "2708, 2708" and replace with --2708*a*, 2708*b*--.

Column 37, Line 34, delete "on of the" and replace with --on the--.

Column 37, Line 58, delete "on of the" and replace with --on the--.

Column 38, Line 24, delete "module 2179" and replace with --module 2719--.

Column 38, Line 67, delete "valley value" and replace with --valleys value--.

Column 39, Line 17, delete "configures" and replace with --configured--.

Column 39, Line 19, delete "2721*am*" and replace with --2721*a*--.

CERTIFICATE OF CORRECTION (continued)
U.S. Pat. No. 9,719,806 B2

Column 39, Line 20, delete "2798," and replace with --2708,--.

Column 40, Line 31, delete "ninety degree" and replace with --ninety degrees--.

Column 42, Line 45, delete "wherein first," and replace with --wherein the first,--,